(12) United States Patent
Zhai

(10) Patent No.: US 11,699,401 B2
(45) Date of Patent: Jul. 11, 2023

(54) LIGHT EMISSION CONTROL CIRCUIT, DISPLAY PANEL AND DISPLAY DEVICE

(71) Applicant: Hubei Yangtze Industrial Innovation Center Of Advanced Display Co., Ltd., Wuhan (CN)

(72) Inventor: Yingteng Zhai, Wuhan (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 0 days.

(21) Appl. No.: 17/898,862

(22) Filed: Aug. 30, 2022

(65) Prior Publication Data

US 2022/0406261 A1 Dec. 22, 2022

(51) Int. Cl.
*G09G 3/3266* (2016.01)
*G09G 3/3233* (2016.01)

(52) U.S. Cl.
CPC ......... *G09G 3/3266* (2013.01); *G09G 3/3233* (2013.01); *G09G 2300/0861* (2013.01); *G09G 2310/0286* (2013.01); *G09G 2310/08* (2013.01); *G09G 2330/021* (2013.01)

(58) Field of Classification Search
None
See application file for complete search history.

(56) References Cited

U.S. PATENT DOCUMENTS

| | | | |
|---|---|---|---|
| 2017/0193956 A1* | 7/2017 | Xiao | G09G 3/3677 |
| 2018/0130407 A1* | 5/2018 | Zhai | G11C 19/28 |
| 2018/0374410 A1* | 12/2018 | Zhu | G11C 19/28 |
| 2019/0073932 A1* | 3/2019 | Huang | G09G 3/3666 |
| 2019/0073933 A1* | 3/2019 | Xuan | G11C 19/28 |
| 2019/0340975 A1* | 11/2019 | Zhai | G09G 3/2014 |

FOREIGN PATENT DOCUMENTS

| | | |
|---|---|---|
| CN | 108735151 A | 11/2018 |
| CN | 112542131 A | 3/2021 |
| CN | 113707097 A | 11/2021 |

\* cited by examiner

*Primary Examiner* — Dorothy Harris
(74) *Attorney, Agent, or Firm* — KDW Firm PLLC

(57) ABSTRACT

Provided are a light emission control circuit, a display panel and a display device. The light emission control circuit includes a first control module configured to control the potential of a first node and the potential of a second node according to an input signal of a signal input terminal, a first clock signal of a first clock terminal and a second clock signal of a second clock terminal; a second control module configured to control the potential of a third node under control of the first control module, the first clock signal, the second clock signal, a first level signal of a first level terminal and a second level signal of a second level terminal; an output module configured to control, according to the first level signal and the potential of the first node, a signal output terminal to output the enable level of a light emission control signal.

20 Claims, 29 Drawing Sheets

LIGHT EMISSION CONTROL CIRCUIT, DISPLAY PANEL AND DISPLAY DEVICE

CROSS-REFERENCE TO RELATED APPLICATION(S)

This application claims priority to Chinese Patent Application No. 202210457607.7 filed Apr. 27, 2022, the disclosure of which is incorporated herein by reference in its entirety.

TECHNICAL FIELD

The present disclosure relates to the field of display technologies and, in particular, to a light emission control circuit, a display panel and a display device.

BACKGROUND

Among the existing displays, organic electroluminescent displays (OELD), as a kind of active light-emitting display, have gradually become the mainstream in the display field due to the advantages: low power consumption, high color saturation and wide view angle. To implement the display function of an OELD display, a light emission control signal generally needs to be input to the display region of the OELD display to facilitate the implementation of the image display.

The light emission control signal is output through a light emission control circuit connected to a pixel circuit, thereby controlling pixels to emit light. A stable light emission control signal is conducive to the stable display and the accurate display of the OELD display.

Therefore, how to control a light emission control circuit to stably output a light emission control signal to satisfy the requirement for accurate and stable display is an urgent technical problem for those skilled in the art.

SUMMARY

The present disclosure provides a light emission control circuit, a display panel and a display device to satisfy the accurate and stable display requirement.

According to an aspect of the present disclosure, a light emission control circuit is provided. The light emission control circuit includes a filtering module, a first control module, a second control module and an output module.

The first control module is electrically connected to a signal input terminal, a first clock terminal and a second clock terminal; the first control module and the output module are electrically connected to a first node; the first control module and the filtering module are electrically connected to a second node; and the first control module is configured to control a potential of the first node and a potential of the second node separately according to an input signal of the signal input terminal, a first clock signal of the first clock terminal and a second clock signal of the second clock terminal.

The second control module is electrically connected to the first clock terminal, the second clock terminal, a first level terminal, a second level terminal and the first control terminal; the second control module and the output terminal are electrically connected to a third node; and the second control module is configured to control a potential of the third node under the control of the first control module, the first clock signal, the second clock signal, a first level signal of the first level terminal and a second level signal of the second level terminal.

The output module is further electrically connected to the first level terminal, the second level terminal and a signal output terminal and is configured to control, according to the first level signal and the potential of the first node, the signal output terminal to output an enable level of a light emission control signal and control, according to the second level signal of the second level terminal and the potential of the third node, the signal output terminal to output a disable level of the light emission control signal, where the enable level and the disable level of the light emission control signal are output time-divisionally.

The filtering module is further electrically connected to the first node and has a uni-directional conduction property.

According to another aspect of the present disclosure, a display panel is provided. The display panel includes a plurality of pixel circuits arranged in an array and a plurality of preceding light emission control circuits cascaded.

Among the plurality of light emission control circuits cascaded, a signal output terminal of each-stage light emission control circuit is electrically connected to at least part of a same row of the plurality of pixel circuits; other than a last-stage light emission control circuit, a signal output terminal of each-stage light emission control circuit is electrically connected to a signal input terminal of a next-stage light emission control circuit, and a signal input terminal of a first-stage light emission control circuit receives a start pulse signal.

According to another aspect of the present disclosure, a display device is provided and includes the preceding display panel.

It is to be understood that the contents described in this part are not intended to identify key or important features of the embodiments of the present disclosure, and are not intended to limit the scope of the present disclosure. Other features of the present disclosure will become readily understood through the description hereinafter.

BRIEF DESCRIPTION OF DRAWINGS

To illustrate technical solutions in embodiments of the present disclosure more clearly, drawings used in description of the embodiments will be briefly described below. Apparently, the drawings described below merely illustrate part of the embodiments of the present disclosure, and those of ordinary skill in the art may obtain other drawings based on the drawings on the premise that no creative work is done.

DETAILED DESCRIPTION

The technical solutions in the embodiments of the present disclosure will be described clearly and completely in conjunction with the drawings in the embodiments of the present disclosure from which the solutions of the present disclosure will be better understood by those skilled in the art. Apparently, the embodiments described below are part, not all, of the embodiments of the present disclosure. Based on the embodiments of the present disclosure, all other embodiments obtained by those of ordinary skill in the art are within the scope of the present disclosure on the premise that no creative work is done.

It is to be noted that the terms "first", "second" and the like in the description, claims and drawings of the present disclosure are used for distinguishing between similar objects and are not necessarily used for describing a particular order or sequence. It is to be understood that the data used in this way are interchangeable where appropriate so that embodiments of the present disclosure described herein may also be implemented in a sequence not illustrated or described herein. In addition, terms "comprising", "including" and any other variations thereof are intended to encompass a non-exclusive inclusion. For example, a process, method, system, product or device that includes a series of steps or units not only includes the expressly listed steps or units, but may also include other steps or units that are not expressly listed or are inherent to such process, method, product or device.

Figure 1:
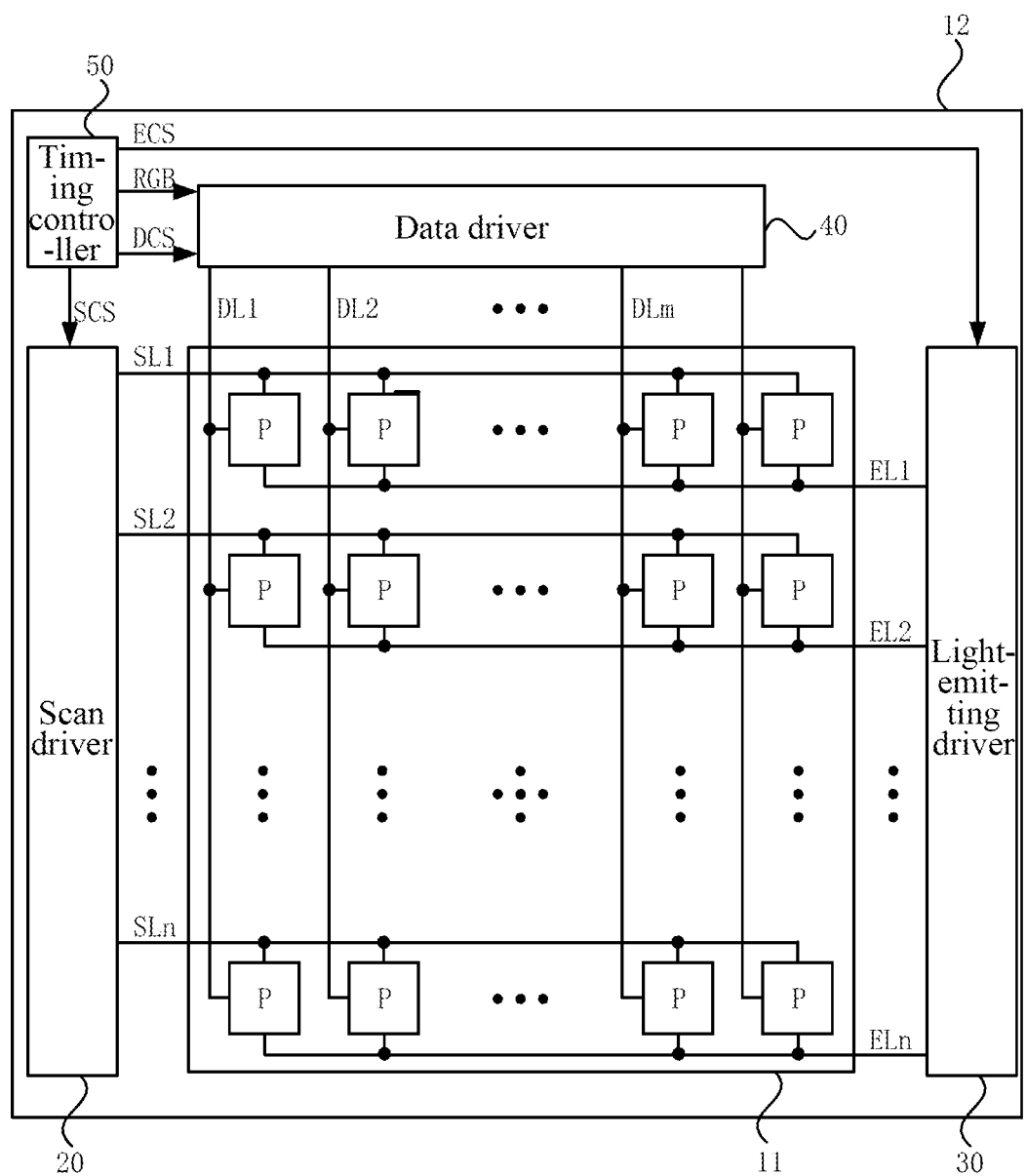
FIG. 1 is a diagram illustrating the structure of a display panel according to embodiments of the present disclosure.

FIG. 1 is a diagram illustrating the structure of a display panel according to embodiments of the present disclosure. As shown in FIG. 1, the display panel 10 may include a display region 11 and a non-display region 12 surrounding the display region 11. The display region 11 includes multiple pixels P, multiple scan lines SL1 to SLn, multiple data lines DL1 to DLm and multiple light emission control lines EL1 to ELn that are connected to the multiple pixels P. The non-display region 12 is provided with a scan driver 20, a light-emitting driver 30, a data driver 40 and a timing controller 50. The number of the multiple scan lines SL1 to SLn and the number of the multiple light emission control lines EL1 to ELn may be both n or may be disposed according to needs. For example, each row of the multiple pixels P is connected to multiple scan lines, and multiple rows of the multiple pixels P share the same one light emission control line. The number of the multiple data lines DL1 to DLm may be m. N and m are natural numbers greater than zero. In this case, the number of the multiple pixels P may be n×m.

The timing controller 50 may receive an input control signal and an input image signal from an image source of an external graphics device. The timing controller 50 generates image data RGB and a data drive control signal DCS corresponding to the operation conditions of the display panel 10 based on the input image signal and supplies the image data RGB and the data drive control signal to the data driver 40. The data drive control signal DCS may include a source start pulse signal and a clock signal. The source start pulse signal may control the sampling start time point of data, and the clock signal is used for controlling sampling operation so that the data driver 40 can respond to the data drive control signal DCS, and the image data RGB can be converted to data signals (data voltages) in an analog format and can be supplied to the multiple data lines DL1 to DLm.

Based on the input control signal, the timing controller 50 may also generate a scan drive control signal SCS for controlling the drive timing of the scan driver 20 and a light emission drive control signal ECS for controlling the drive timing of the light-emitting driver 30. The scan drive control signal SCS may include a scan start pulse signal and a clock signal. The scan start pulse signal may control the first timing of a scan signal, and the clock signal is used for making a scan start pulse shifted so that when the scan driver 20 responds to the scan drive control signal SCS, the scan signal can be supplied to the multiple scan lines SL1 to SLn. The light emission drive control signal ECS may include a light emission control start pulse signal and a clock signal. The light emission control start pulse signal may control the first timing of a light emission control signal, and the clock signal is used for making a light emission control start pulse shifted so that when the light-emitting driver 30 responds to the light emission drive control signal ECS, the light emission control signal can be supplied to the multiple light emission control lines EL1 to ELn.

In the display stage of one frame of image, the scan driver 20 sequentially supplies the enable level of the scan signal to the multiple scan lines SL1 to SLn so that data signals supplied by the data driver 40 can be supplied to the multiple pixels P through the multiple data lines DL1 to DLm in a one-to-one manner; the multiple pixels P of the display panel 10 may also receive the first drive power PVDD and the second drive power PVEE from the outside (for example, a power supply) so that when the light-emitting driver 30 starts to sequentially supply the enable level of the light emission control signal to the multiple light emission control lines EL1 to ELn, the multiple pixels that receive the enable level of the light emission control signal can be controlled to form a path from the first drive power PVDD to the second drive power PVEE, thus controlling light-emitting elements in the path to emit light according to a drive current generated by the data signals.

The light-emitting driver 30 may include multiple light emission control circuits cascaded. The signal output terminal of each light emission control circuit may correspond to one light emission control line. When the each light emission control circuit supplies the enable level of the light emission control signal to the one light emission control line, light-emitting elements in the multiple pixels electrically connected to the one light emission control line are controlled to emit light; and when the each light emission control circuit supplies the disable level of the light emission control signal to the one light emission control line, the light-emitting elements in the multiple pixels electrically connected to the one light emission control line are controlled not to emit light. To improve the display effect of the display panel 10, the light-emitting elements in the multiple pixels are required not to emit light in the non-light emission stage and to stably emit light in the light emission stage.

To improve the display effect of the display panel 10, embodiments of the present disclosure provide a light emission control circuit. The light emission control circuit includes a filtering module, a first control module, a second control module and an output module. The first control module is electrically connected to a signal input terminal, a first clock terminal and a second clock terminal; the first control module and the output module are electrically connected to a first node; the first control module and the filtering module are electrically connected to a second node; and the first control module is configured to control the potential of the first node and the potential of the second node separately according to an input signal of the signal input terminal, a first clock signal of the first clock terminal and a second clock signal of the second clock terminal. The second control module is electrically connected to the first clock terminal, the second clock terminal, a first level terminal, a second level terminal and the first control terminal; the second control module and the output terminal are electrically connected to a third node; and the second control module is configured to control the potential of the third node under the control of the first control module, the first clock signal, the second clock signal, a first level signal of the first level terminal and a second level signal of the second level terminal. The output module is further electrically connected to the first level terminal, the second level terminal and a signal output terminal and is configured to control, according to the first level signal and the potential of the first node, the signal output terminal to output an enable level of a light emission control signal and control, according to the second level signal of the second level terminal and the potential of the third node, the signal output terminal to output a disable level of the light emission control signal. The enable level and the disable level of the light emission control signal are output time-divisionally. The filtering module is further electrically connected to the first node and has a uni-directional conduction property.

With the technical solution adopted, the first control module controls the potential of the first node and the potential of the second node, and the filtering module is electrically connected between the first node and the second node to stabilize the potential of the first node so that the first node can be prevented from being affected by the potential of the second node at some time, thus improving the stability of the potential of the first node, and the stability of the light emission control signal output by the signal output terminal can be improved when the output module outputs the enable level of the light emission control signal to the signal output terminal according to the potential of the first node, thus improving the light emission stability of light-emitting elements when the light emission control signal is used for controlling the light-emitting elements of the display panel. In this manner, the display effect of the display panel can be improved. Moreover, the second control module controls the potential of the third node so that in the non-light emission stage of the light-emitting elements of the display panel, the output module can control, according to the potential of the third node, the signal output terminal to output the disable level of the light emission control signal to cause corresponding light-emitting elements not to emit light. That is, the second control module and the first control module operate cooperatively to control the light-emitting elements of the display panel to accurately and stably emit light, thus improving the display effect.

The preceding is the core idea of the present disclosure. Based on the embodiments of the present disclosure, all other embodiments obtained by those of ordinary skill in the art are within the scope of the present disclosure on the premise that no creative work is done. Technical solutions in the embodiments of the present disclosure are described clearly and completely hereinafter in conjunction with the drawings in the embodiments of the present disclosure.

Figure 2:
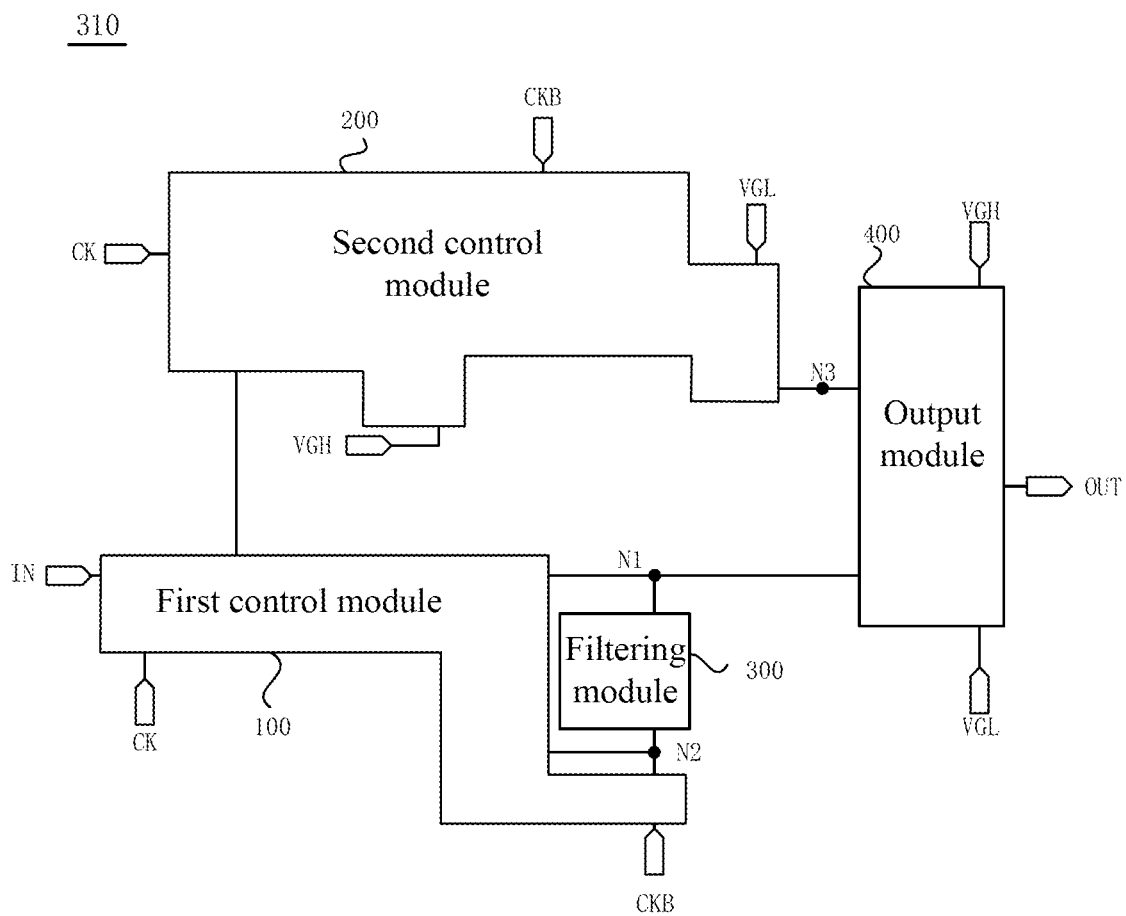
FIG. 2 is a diagram illustrating the structure of a light emission control circuit according to embodiments of the present disclosure.

FIG. 2 is a diagram illustrating the structure of a light emission control circuit according to embodiments of the present disclosure. As shown in FIG. 2, the light emission control circuit 310 includes a filtering module 300, a first control module 100, a second control module 200 and an output module 400.

The first control module 100 is electrically connected to a signal input terminal IN, a first clock terminal CK and a second clock terminal CK|B; the first control module 100 and the output module 400 are electrically connected to a first node N1; the first control module 100 and the filtering module 300 are electrically connected to a second node N2; and the first control module 100 is configured to control the potential of the first node N1 and the potential of the second node N2 according to an input signal Vin of the signal input terminal IN, a first clock signal ck1 of the first clock terminal CK and a second clock signal ck2 of the second clock terminal CKB.

The second control module 200 is electrically connected to the first clock terminal CK, the second clock terminal CKB, a first level terminal VGL, a second level terminal VGH and the first control terminal 100; the second control module 200 and the output terminal 400 are electrically connected to a third node N3; and the second control module 200 is configured to control the potential of the third node N3 under the control of the first control module 100, the first clock signal ck1, the second clock signal ck2, a first level signal Vgl of the first level terminal VGL and a second level signal Vgh of the second level terminal VGH.

The output module 400 is further electrically connected to the first level terminal VGL, the second level terminal VGH and a signal output terminal OUT and is configured to control, according to the first level signal Vgl and the potential of the first node N1, the signal output terminal OUT to output an enable level of a light emission control signal EM and control, according to the second level signal Vgh of the second level terminal VGH and the potential of the third node N3, the signal output terminal OUT to output a disable level of the light emission control signal EM. The enable level and the disable level of the light emission control signal EM are output time-divisionally.

The filtering module 300 is further electrically connected to the first node N1 and is configured to stabilize the potential of the first node N1 so that the output module 400 can control, according to the first level signal Vgl and the potential of the first node N1, the signal output terminal OUT to stably output the enable level of the light emission control signal EM, thus controlling the light-emitting elements in the multiple pixels to stably emit light when the multiple pixels of the display panel receive the stable enable level of the light emission control signal EM. In this manner, the display light emission stability of the display panel can be improved.

The first clock signal ck1 may be a pulse signal in which a high-level signal (for example, vgh) and a low-level signal (for example, vgl) alternate. Similarly, the second clock signal ck2 may also be a pulse signal in which the high-level signal vgh and the low-level signal vgl alternate. Generally, one high-level signal vgh and one continuous low-level signal vgl form one pulse cycle. The second clock signal ck2 and the first clock signal ck1 may differ by half a cycle. That is, when the first clock signal ck1 is the high-level signal vgh, the second clock signal ck2 may be the low-level signal vgl, or when the first clock signal ck1 is the low-level signal vgl, the second clock signal ck2 may be the high-level signal vgh. The low-level signal vgl may be at the enable level of the first clock signal ck1 and the enable level of the second clock signal ck2, and the high-level signal vgh is at the disable level of the first clock signal ck1 and the disable level of the second clock signal ck2. Alternatively, the high-level signal vgh may be at the enable level of the first clock signal ck1 and the enable level of the second clock signal ck2, and the low-level signal vgl is at the disable level of the first clock signal ck1 and the disable level of the second clock signal ck2. It is to be understood that the values of the enable level and the disable level of the first clock signal ck1 and the values of the enable level and the disable level of the second clock signal ck2 may be configured according to needs and are not limited in the present embodiment of the present disclosure.

The first level signal Vgl of the first level terminal VGL and the second level signal Vgh of the second level terminal VGH may be fixed signals. For example, when the first level signal Vgl of the first level terminal VGL is a low-level signal (for example, vgl), the second level signal Vgh of the second level terminal VGH may be a high-level signal (for example, vgh), or when the first level signal Vgl of the first level terminal VGL is the high-level signal vgh, the second level signal Vgh of the second level terminal VGH may be the low-level signal vgl. It is to be understood that the first level signal Vgl of the first level terminal VGL and the second level signal Vgh of the second level terminal VGH may be configured according to needs and are not limited in the present embodiment of the present disclosure. In an optional embodiment, the enable level of the light emission control signal EM is at a low level, and the disable level of the light emission control signal EM is at a high level, and, in this case, the first level signal Vgl of the first level terminal VGL is the low-level signal vgl, and the second level signal Vgh of the second level terminal VGH is the high-level signal vgh, where the value of the voltage of the low-level signal vgl is less than the value of the voltage of the high-level signal vgh, and, further, the value of the voltage of the low-level signal vgl is negative, and the value of the voltage of the high-level signal vgh is positive so as to match the enable level and the disable level of the light emission control signal EM.

In an embodiment, the first control module 100 may control, under the control of the enable level of the first clock signal ck1, the input signal Vin to be transmitted to the first node N1 so that the potential of the first node N1 can match the input signal Vin; the first control module 100 may also control the potential of the second node N2, and when the input signal Vin is transmitted to the first node N1 under the control of the first clock signal ck1, the potential of the second node N2 can also match the input signal Vin, and when the first clock signal ck1 is at a disable level, the input signal Vin cannot be transmitted to the first node N1, and the potential of the second node N2 can match the second clock signal ck2. Moreover, since the first clock signal ck1 is opposite to the second clock signal ck2, that is, when the first clock signal ck1 is at a disable level, the second clock signal ck2 is at an enable level, the potential of the second node N2 matches the enable level of the second clock signal ck2 when the input signal Vin cannot be transmitted to the first node N1.

The filtering module 300 is electrically connected between the first node N1 and the second node N2 and has a uni-directional conduction property. The filtering module 300 may selectively communicate the second node N2 and the first node N1 according to the voltage relationship between the potential of the first node N1 and the potential of the second node N2 to selectively feed back the required potential of the second node N2 to the first node N1, thus fulfilling the function of stabilizing the potential of the first node N1. In an embodiment, the filtering module 300 may control the potential of the first node N1 to also be matched to the enable level of the second clock signal ck2 when the input signal Vin cannot be transmitted to the first node N1, and the second node N2 has a potential that matches the enable level of the second clock signal ck2. In this manner, when the first clock signal ck1 is at an enable level to control the enable level of the input signal Vin to be transmitted to the first node N1, the first node N1 may be at the enable level of the input signal Vin, and when the first clock signal ck1 is at a disable level, and the enable level of the input signal Vin cannot be transmitted to the first node N1, the filtering module 300 controls the first node N1 to have a potential that matches the enable level of the second clock signal ck2 so that the potential of the first node N1 cannot change to be at a disable level over time, and the first node N1 can be at a continuously stable enable level, thus fulfilling the function of stabilizing the potential of the first node N1. Moreover, when the first node N1 is at the continuously stable enable level, the output module 400 can control, under the control of the enable level of the first node N1, the first level signal Vgl of the first level terminal VGL to be transmitted to the signal output terminal OUT so that the signal output terminal OUT can stably output the enable level of the light emission control signal EM, thus improving the light emission stability of the multiple pixels of the display panel when the enable level of the light emission control signal EM controls the multiple pixels of the display panel to emit light. In this manner, the display effect of the display panel can be improved.

Accordingly, the second control module 200 controls the potential of the third node N3 under the control of the first control module 100, the first clock signal ck1, the second clock signal ck2, the first level signal Vgl and the second level signal Vgh so that when the potential of the third node N3 is at an enable level, the output module 400 can be controlled to transmit the second level signal Vgh of the second level terminal VGH to the signal output terminal OUT, thus making the signal output terminal OUT output the disable level of the light emission control signal EM. In this manner, when the multiple pixels of the display panel do not need to emit light, the disable level of the light emission control signal EM can control the multiple pixels of the display panel not to emit light.

In the present embodiment of the present disclosure, the first control module 100 controls the potential of the first node N1 and the potential of the second node N2 to be matched to the input signal Vin and may cause the potential of the second node N2 to be matched to the enable level of the second clock signal ck2 when the input signal Vin cannot be transmitted to the first node N1 and the second node N2, and the filtering module 300 controls the potential of the first node N1 to be matched to the enable level of the second clock signal ck2 when the input signal Vin cannot be transmitted to the first node N1 so that the potential of the first node N1 cannot change to be at a disable level over time, and the first node N1 can be a continuously stable enable level. In this manner, the output module 400 can transmit the first level signal Vgl of the first level terminal VGL to the signal output terminal OUT according to the enable level of the first node N1 so that the signal output terminal OUT can stably output the enable level of the light emission control signal EM, thus improving the light emission stability of the light-emitting elements when the enable level of the light emission control signal EM is used for controlling the light-emitting elements of the display panel to emit light. In this manner, the display effect of the display panel can be improved. In the present embodiment of the present disclosure, the second control module 200 controls the potential of the third node N3, and when the potential of the third node N3 is at an enable level, the output module 400 may transmit the second level signal Vgh of the second level terminal VGH to the signal output terminal OUT according to the enable level of the second node N2 so that the signal output terminal OUT can output the disable level of the light emission control signal EM, thus making corresponding light-emitting elements of the display panel not emit light; and the second control module 200, the first control module 100 and the filtering module 300 operate cooperatively to control the light-emitting elements of the display panel to stably and accurately emit light, thus improving the display effect.

It is to be understood that the value of the enable level and the value of the disable level are related to the structures of the modules these two levels control. For example, when the module includes a p-channel transistor, the enable level is at a low level, and the disable level is at a high level; and when the module includes an n-channel transistor, the enable level is at a high level, and the disable level is at a low level. In the present embodiment of the present disclosure, the value of the enable level and the value of the disable level may be limited according to actual needs. For ease of description, unless otherwise specified, the embodiments of the present disclosure are illustrated using an example in which the enable level is at a low level, and the disable level is at a high level.

Figure 3:
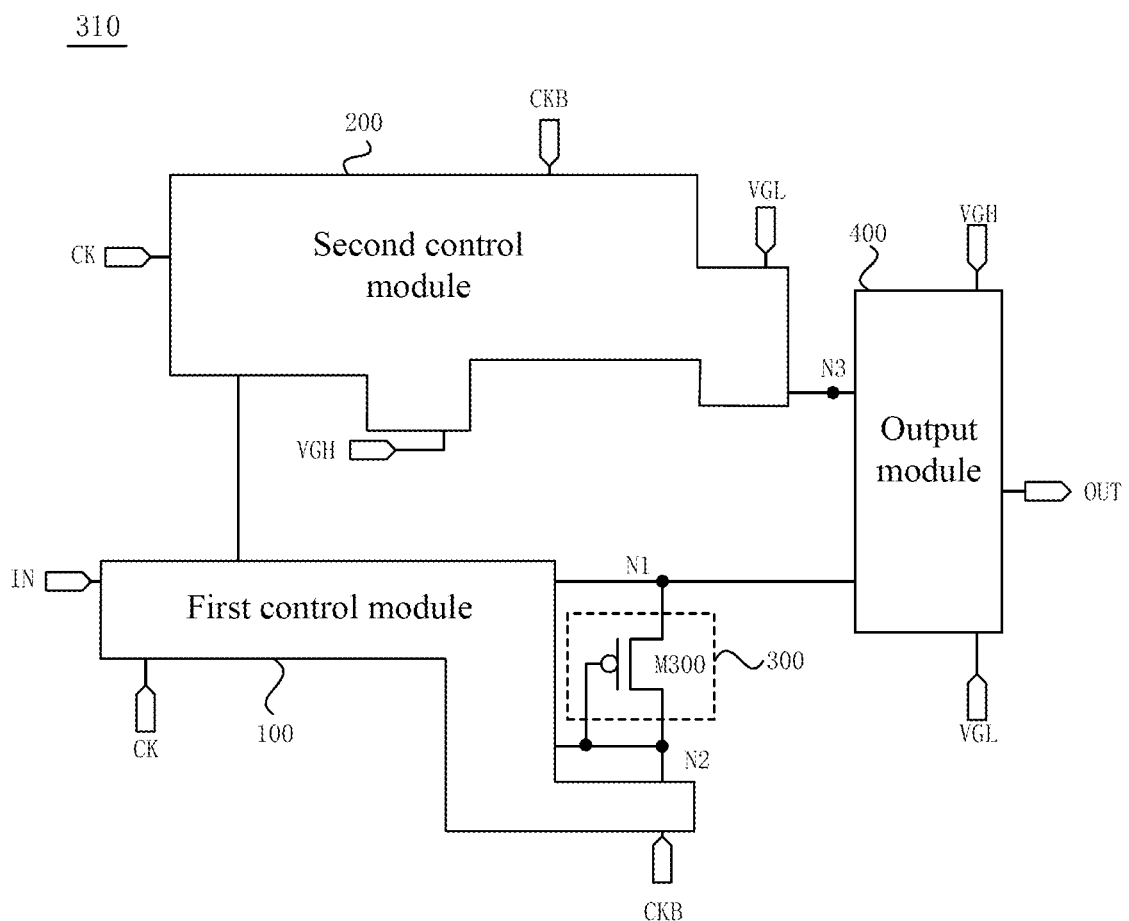
FIG. 3 is a diagram illustrating the structure of another light emission control circuit according to embodiments of the present disclosure.

In an embodiment, FIG. 3 is a diagram illustrating the structure of another light emission control circuit according to embodiments of the present disclosure. As shown in FIG. 3, the filtering module 300 includes a filtering transistor M300. The filtering transistor M300 is electrically connected between the first node N1 and the second node N2, and the gate of the filtering transistor M300 is electrically connected to the source of the filtering module 300.

Figure 4:
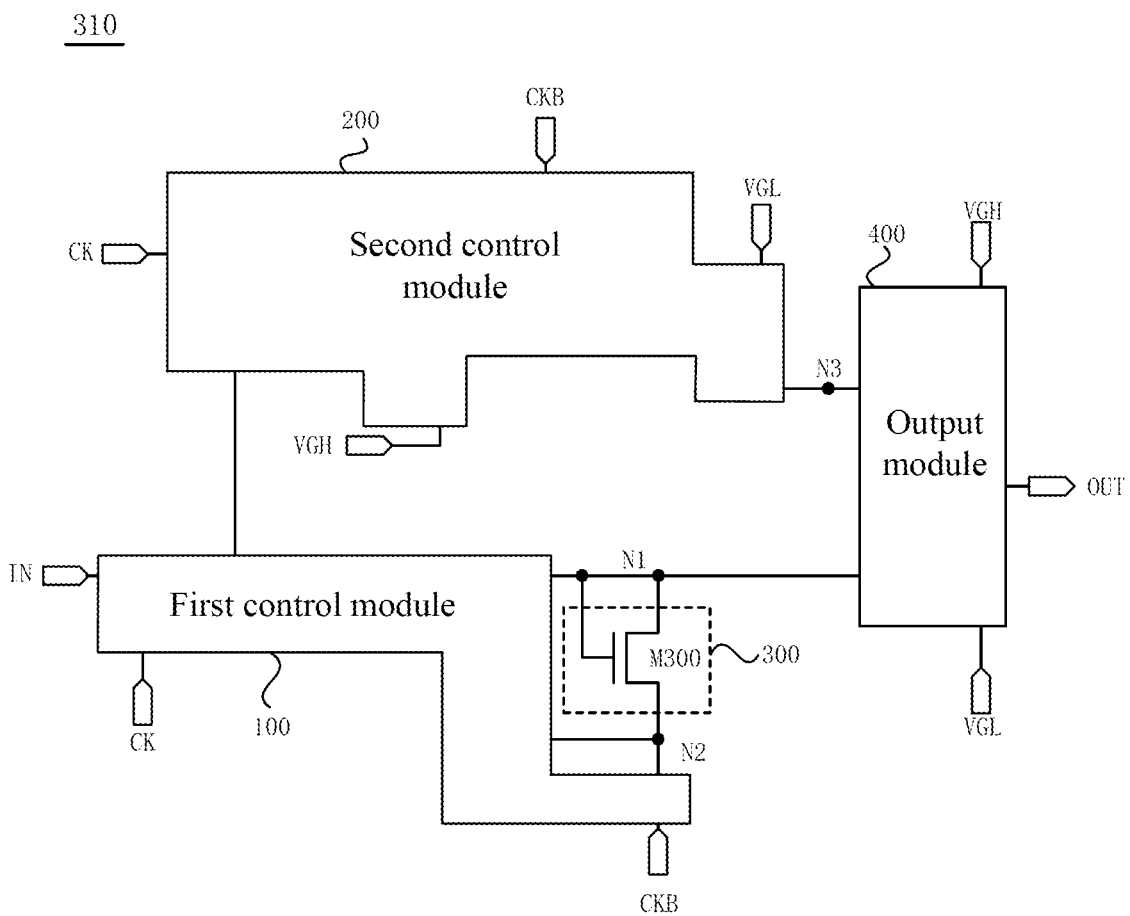
FIG. 4 is a diagram illustrating the structure of another light emission control circuit according to embodiments of the present disclosure.

In an embodiment, as shown in FIG. 3, the filtering transistor M300 may be a p-channel transistor, and the active layer of the filtering transistor M300 may include low-temperature polycrystalline silicon. In this case, the drain of the filtering transistor M300 is electrically connected to the first node N1, and the gate and the source of the filtering transistor M300 are both electrically connected to the second node N2, and when the potential of the second node N2 is lower than the potential of the first node N1, the filtering transistor M300 may be turned on, a path is formed from the first node N1 to the second node N2, and the potential of the second node N2 can pull down the potential of the first node N2. In this manner, when the input signal Vin and the first clock signal ck1 are each at an enable level, the potential of the first node N1 is at a low level that matches the enable level of the input signal Vin, and when the first clock signal ck1 is at a disable level, the second clock signal ck2 is at an enable level, and the potential of the second node N2 matches the enable level of the second clock signal ck2 so that the potential of the second node N2 can be lower than the potential of the first node N1, the filtering transistor M300 can be turned on, a path can be formed from the first node N1 to the second node N2, and the filtering transistor M300 can pull down the potential of the first node N1 to match the potential of the second node N2. In this manner, though the enable level of the input signal Vin cannot be transmitted to the first node N1, the potential of the first node N1 can also be kept at an enable level so that the signal output terminal OUT can stably output the light emission control signal EM. It is to be understood that as shown in FIG. 4, the filtering transistor M300 may also be an n-channel transistor, and the active layer of the filtering transistor M300 may include metal oxide, and in this case, the drain of the filtering transistor M300 is electrically connected to the second node N2, and the gate and the source of the filtering transistor M300 are both electrically connected to the first node N1. In this manner, when the potential of the second node N2 is lower than the potential of the first node N1, the filtering transistor M300 can also be turned on, and the same effect as when the filtering transistor M300 is a p-channel transistor can also be achieved. Similarities may be referred to the preceding description and are not described here. It is to be noted that the case where the filtering module 300 is specifically a p-channel filtering transistor M300 is illustrated using the example in which the enable level is at a low level, and the disable level is at a high level, and in this case, when the potential of the second node N2 is lower than the potential of the first node N1, the filtering transistor M300 is turned on. Accordingly, in the present embodiment of the present disclosure, the enable level may also be at a high level, and the disable level is at a low level, and in this case, the filtering transistor M300 of the filtering module 300 is turned on when the potential of the second node N2 is higher than the potential of the first node N1. In this manner, the function of stabilizing the potential of the first node N1 can also be fulfilled. The technical principle is similar to the case where the enable level is at a low level, and the disable level is at a high level, which may be referred to the preceding description and is not described here.

Figure 5:
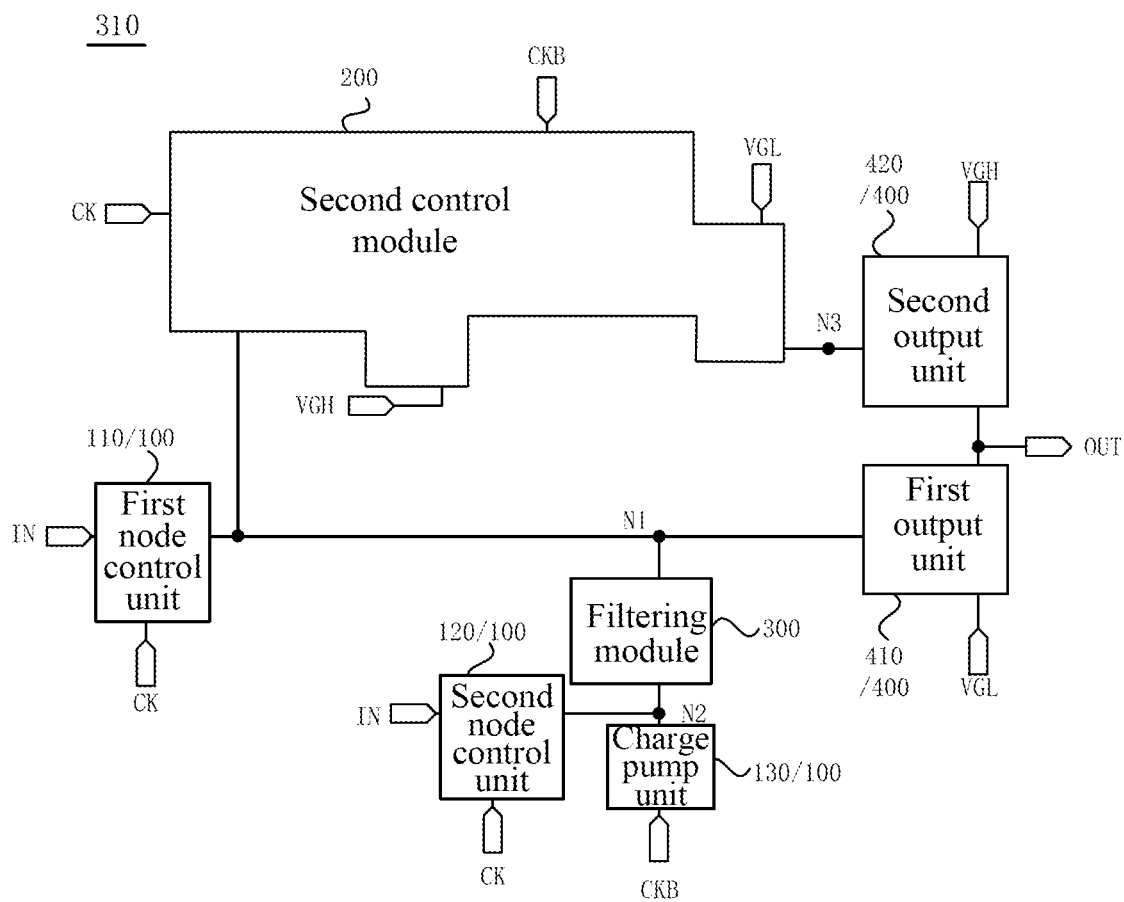
FIG. 5 is a diagram illustrating the structure of another light emission control circuit according to embodiments of the present disclosure.

In an embodiment, as shown in FIG. 5, the first control module 100 includes a first node control unit 110, a second node control unit 120 and a charge pump unit 130. The first node control unit 110 is electrically connected to the signal input terminal IN, the first clock terminal CK and the first node N1 and is configured to control the potential of the first node N1 according to the input signal Vin and the first clock signal ck1. The second node control unit 120 and the first clock terminal CK are electrically connected to the second node N, and the second node control unit 120 is configured to control the potential of the second node N2 according to the first clock signal ck1. The charge pump unit 130 is electrically connected to the second node N2 and the second clock terminal CKB and is configured to control the amount of signals coupled to the second node N2 by the second clock terminal CKB.

Specifically, under the control of the first clock terminal CK and the first clock signal ck1, the first node control unit 110 may control the transmission path through which the input signal Vin of the input signal terminal IN is transmitted to the first node N1, and when the first clock signal ck1 is at an enable level, the input signal Vin may be transmitted to the first node Ni through the first node control unit 110, and when the first clock signal ck1 is at a disable level, the input signal Vin cannot be transmitted to the first node N1 through the first node control unit 110. The second unit control unit 120 may also control the potential of the second node N2 under the control of the first clock signal ck1, and in an exemplary embodiment, the second node control unit 120 is further electrically connected to the signal input terminal IN so that the second node control unit 120 can control, according to the first clock signal ck1, the transmission path through which the input signal Vin is transmitted to the second node N2, that is, when the first clock signal ck1 is at an enable level, the input signal Vin can be transmitted to the second node N2 through the second node control unit 120 so that the potential of the second node N2 can be equivalent to the potential of the first node N1; and when the first clock signal ck1 is at the disable level vgh, the input signal Vin cannot be transmitted to the second node N2 through the second node control unit 120, and the potential of the second node N2 is no longer controlled by the second node control unit 120. In this case, the charge pump unit 130 may control the second clock signal ck2 of the second clock terminal CKB to be coupled to the second node N2 and control the amount of signals coupled to the second node N2 by the second clock terminal CKB so that the potential of the second node N2 can be lower than the potential of the first node N1. In this manner, when the potential of the second node N2 can be lower than the potential of the first node N1, the filtering module 300 pulls down the potential of the first node N1 so that the potential of the first node N1 can be maintained with an enable level range less than or equal to the low level vgl.

Figure 6:
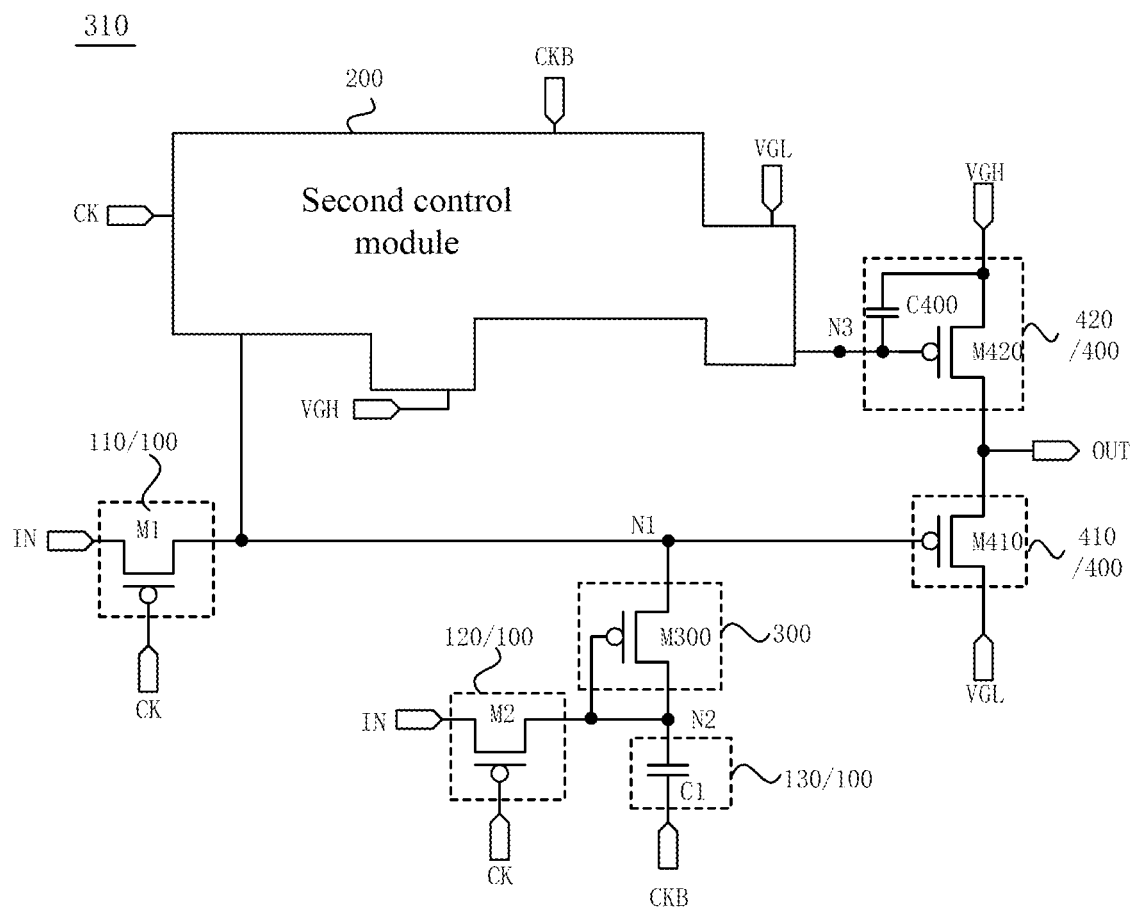
FIG. 6 is a diagram illustrating the structure of another light emission control circuit according to embodiments of the present disclosure.

In an embodiment, as shown in FIG. 6, the charge pump unit 130 may include a first capacitor C1. The first electrode of the first capacitor C1 is electrically connected to the second clock terminal CKB, and the second electrode of the first capacitor C1 is electrically connected to the second node N2.

When the potential of the second node N2 is controlled by the second node control unit 120, the first clock signal ck1 of the first clock terminal CK is at the enable level vgl, and the second clock signal ck2 of the second clock terminal CKB is at the disable level vgh. That is, the first electrode of the first capacitor C1 is kept at the disable level of the second clock signal ck2, and the second electrode of the first capacitor C1 and the potential of the second node N2 are both equivalent to the potential of the first node N1. For example, the potential of the second node N2 is Va. When the potential of the second node N2 is no longer controlled by the second node control unit 120, the first clock signal ck1 of the first clock terminal CK is at the disable level vgh, and the second clock signal ck2 of the second clock terminal CKB is at the enable level vgl, that is, the second clock terminal CKB hops from being at the disable level vgh to being at the enable level vgl, so that the change amount $\Delta V$ in the voltage of the first electrode of the first capacitor C1 can be—(vgh−vgl). Due to the coupling action of the first capacitor C1, the voltage of the second electrode of the first capacitor C1 changes by $\Delta V$, that is, the potential of the second node N2 changes by $\Delta V$. In this case, the potential of the second node N2 decreases to be Va—(vgh−vgl) so that the potential Va—(vgh−vgl) of the second node N2 can be lower than the potential Va of the first node N1, and the filtering transistor M300 of the filtering module 300 can be turned on. In this manner, the potential of the first node N1 can be close to the potential of the second node N2 so that the potential of the first node N1 cannot change to be at a disable level over time, thus maintaining the potential of the first node N1 within a range less than or equal to the disable level for a long time. In this manner, the stability of the potential of the first node N1 can be improved.

It is to be noted that FIG. 6 only illustrates that the charge pump unit 130 includes the first capacitor C1, and in the present embodiment of the present disclosure, the charge pump unit 130 may further include other active and/or passive devices, and the structure of the charge pump unit 130 is not limited in the present embodiment of the present disclosure on the premise that the function of the charge pump unit 130 can be fulfilled. Accordingly, in the first control module 100, the first node control unit 110 and the second node control unit 120 may also include active and/or passive devices, which is not limited in the present embodiment of the present disclosure. The active devices include, for example, a transistor. The passive devices include, but are not limited to, for example, a capacitor, a resistor and an inductor. The present embodiment of the present disclosure is illustrated below using typical examples of the first node control unit 110 and the second node control unit 120.

In an embodiment, with continued reference to FIG. 6, the first node control unit 110 includes a first transistor M1. The gate of the first transistor M1 is electrically connected to the first clock terminal CK, the first electrode of the first transistor M1 is electrically connected to the signal input terminal IN, and the second electrode of the first transistor M1 is electrically connected to the first node N1. In this manner, the first clock signal ck1 of the first clock terminal CK can control the first transistor M1 to be turned on or turned off so that when the first transistor M1 is turned on, the input signal Vin of the signal input terminal IN can be transmitted to the first node N1.

The first transistor M1 may be a p-channel transistor or an n-channel transistor. When the first transistor M1 is a p-channel transistor, the enable level of the first clock signal ck1 is the low level vgl capable of controlling the first transistor M1 to be turned on, and the disable level of the first clock signal ck1 is the high level vgh capable of controlling the first transistor M1 to be turned off; and when the first transistor M1 is an n-channel transistor, the enable level of the first clock signal ck1 is the high level vgh capable of controlling the first transistor M1 to be turned on, and the disable level of the first clock signal ck1 is the low level vgl capable of controlling the first transistor M1 to be turned off.

As shown in FIG. 6, that the first transistor M1 is a p-channel transistor is used as an example. When the first clock signal ck1 is at the low level vgl, the first transistor M1 is turned on, and the input signal Vin of the signal input terminal IN is controlled to be transmitted to the first node N1; and when the first clock signal ck1 is at the high level vgh, the first transistor M1 is turned off, and the input signal Vin of the signal input terminal IN cannot be transmitted to the first node N1.

In an embodiment, with continued reference to FIG. 6, when the second node control unit 120 is further electrically connected to the signal input terminal IN and is configured to supply the input signal Vin to the second node N2 according to the first clock signal ck1, the second node control unit 120 may include a second transistor M2. The gate of the second transistor M2 is electrically connected to the first clock terminal CK, the first electrode of the second transistor M2 is electrically connected to the signal input terminal IN, and the second electrode of the second transistor M2 is electrically connected to the second node N2. In this manner, the second transistor M2 may also be turned on or turned off under the control of the first clock signal ck1 of the first clock terminal CK, and when the second transistor M2 is turned on, the input signal Vin of the signal input terminal IN can be transmitted to the second node N2.

The channel type of the second transistor M2 is the same as the channel type of the first transistor M1. That is, when the first transistor M1 is an n-channel transistor, the second transistor M2 is also an n-channel transistor; and when the first transistor M1 is a p-channel transistor, the second transistor M2 is also a p-channel transistor so that when the first clock signal ck1 is at an enable level, the first transistor M1 and the second transistor M2 can be simultaneously controlled to be turned on, thus transmitting the input signal of the signal input terminal IN to the first node N1 and the second node N2 through the first transistor M1 and the second transistor M2 respectively; and when the first clock signal ck1 is at a disable level, the first transistor M1 and the second transistor M2 are simultaneously controlled to be turned off so that the input signal of the signal input terminal IN cannot be transmitted to the first node N1 and the second node N2. The first node N1 and the second node N2 keep stable under the joint control of the charge pump unit 130 and the filtering module 300.

In an embodiment, with continued reference to FIG. 5, the output module 400 may include a first output unit 410 and a second output unit 420. The first output unit 410 is electrically connected to the first node N1, the first level terminal VGL and the signal output terminal OUT and is configured to control, according to the potential of the first node N1, the signal output terminal OUT to output the enable level of the light emission control signal EM. The second output unit 420 is electrically connected to the third node N3, the second level terminal VGH and the signal output terminal OUT and is configured to control, according to the potential of the third node N3, the signal output terminal OUT to output the disable level of the light emission control signal EM.

Specifically, the first output unit 410 may control the transmission path of the first level signal Vgl of the first level terminal VGL to the signal output terminal OUT under the control of the potential of the first node N1, and when the potential of the first node N1 is at the enable level of the first output unit 410, the first output unit 410 can transmit the first level signal Vgl to the signal output terminal OUT so that the signal output terminal OUT can output the enable level of the light emission control signal EM. The second output unit 420 may control the transmission path of the second level signal Vgh of the second level terminal VGH to the signal output terminal OUT under the control of the potential of the third node N3, and when the potential of the third node N3 is at the enable level of the second output unit 420, the second output unit 420 can transmit the second level signal Vgh to the signal output terminal OUT so that the signal output terminal OUT can output the disable level of the light emission control signal EM.

In an embodiment, as shown in FIG. 6, the first output unit 410 may include a first output transistor M410, and the second output unit 420 may include a second output transistor M420. The gate of the first output transistor M410 is electrically connected to the first node N1, the first electrode of the first output transistor M410 is electrically connected to the first level terminal VGL, and the second electrode of the first output transistor M410 is electrically connected to the signal output terminal OUT. The gate of the second output transistor M420 is electrically connected to the third node N3, the first electrode of the second output transistor M420 is electrically connected to the second level terminal VGH, and the second electrode of the second output transistor M420 is electrically connected to the signal output terminal OUT. In this manner, the first output transistor M410 may be turned on or turned off under the control of the potential of the first node N1, and the second output transistor M420 may be turned on or turned off under the control of the third node N3. In this case, when the signal output terminal OUT needs to output the enable level of the light emission control signal EM, the potential of the first node N1 can control the first output transistor M410 to be turned on, and when the signal output terminal OUT needs to output the disable level of the light emission control signal EM, the potential of the third node N3 can control the second output transistor M420 to be turned on. The first output transistor M410 may be an n-channel transistor or a p-channel transistor; similarly, the second output transistor M420 may be an n-channel transistor or a p-channel transistor. This is not limited in the present embodiment of the present disclosure.

Figure 7:
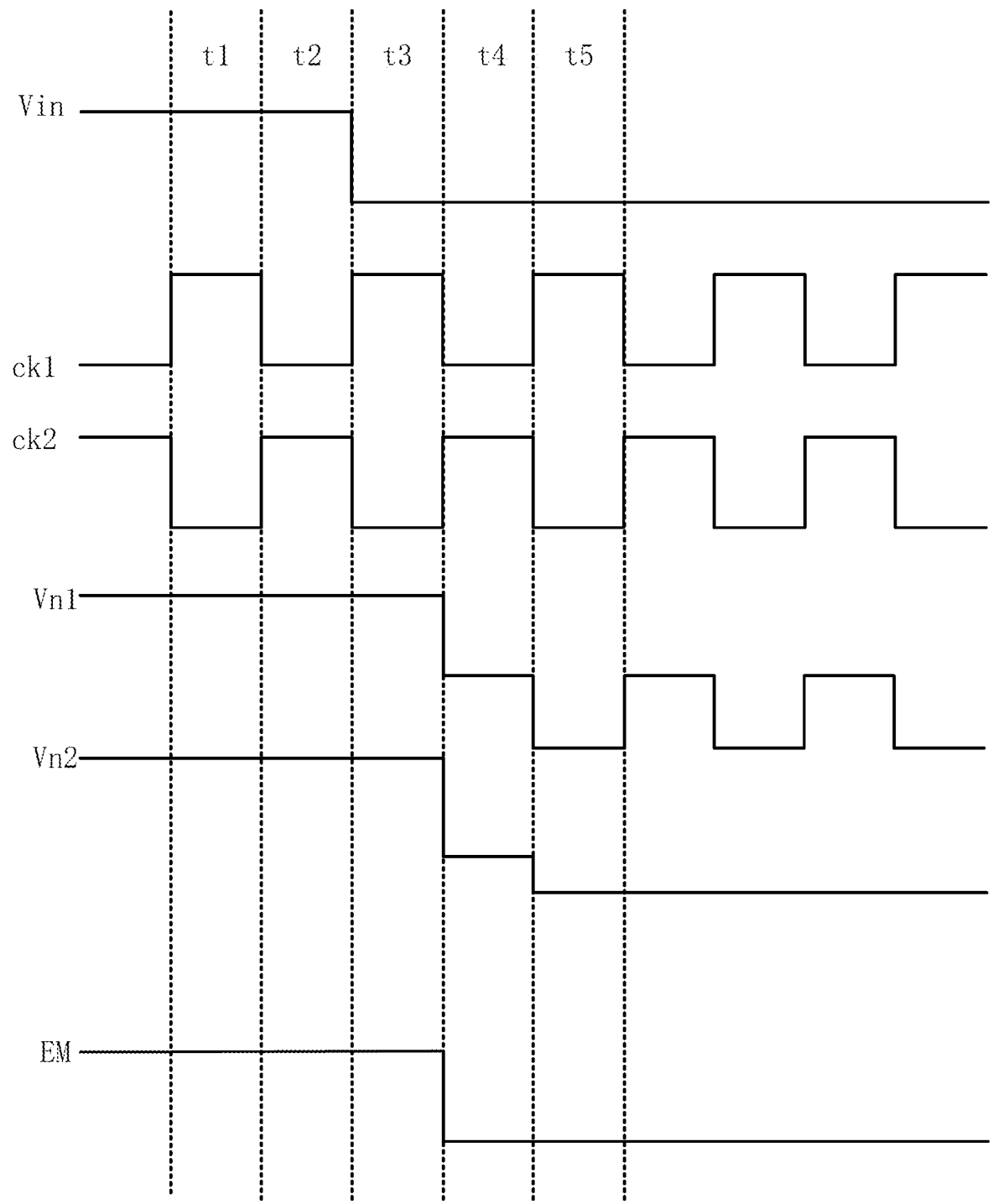
FIG. 7 is a drive timing diagram of the light emission control circuit corresponding to FIG. 6.

In an embodiment, that the first transistor M1, the second transistor M2, the first output transistor M410 and the second output transistor M420 are each a p-channel transistor is used as an example. FIG. 7 is a drive timing diagram of the light emission control circuit corresponding to FIG. 6. In conjunction with FIG. 6 and FIG. 7, in the stage t1, the input signal Vin is at a high level, and the first clock signal ck1 is at the high level vgh, so the first transistor M1 and the second transistor M2 are both turned off, and the high-level input signal Vin cannot be transmitted to the first node N1 and the second node N2. At this time, the potential of the first node N1 and the potential of the second node N2 may hop to be at a low level under the cooperative action of the first capacitor C1 and the filtering module 300, but the second control module 200 controls the potential of the third node N3, and the potential of the third node N3 controls the second output transistor M420 so that the second level signal Vgh can be transmitted to the signal output terminal OUT through the second output transistor M410 to control the signal output terminal OUT to output the disable level of the light emission control signal EM.

In the stage t2, the input signal Vin is at a high level, and the first clock signal ck1 is at the low level vgl, so the first transistor M1 and the second transistor M2 are both turned on, and the high-level input signal Vin can be transmitted to the first node N1 and the second node N2. At this time, the potential of the first node N1 and the potential of the second node N2 are each at a high level, so the first output transistor M410 cannot transmit the first level signal Vgl of the first level terminal VGL to the signal output terminal OUT under the control of the high level of the first node N1. At this time, the second control module 200 controls the potential of the third node N3, and the potential of the third node N3 controls the second output transistor M420 so that the signal output terminal OUT can also be controlled to output the disable level of the light emission control signal EM.

In the stage t3, the input signal Vin is at a low level, and the first clock signal ck1 is at the high level vgh, so the first transistor M1 and the second transistor M2 are both turned off. At this time, the second control module 200 also controls the potential of the third node N3, and the potential of the third node N3 controls the second output transistor M420 so that the signal output terminal OUT can output the disable level of the light emission control signal EM.

In the stage t4, the input signal Vin is still at a low level, and the first clock signal ck1 changes to be at the low level vgl again, so the first transistor M1 and the second transistor M2 are turned on, and the input signal Vin can be transmitted to the first node N1 and the second node N2 through the first transistor M1 and the second transistor M2 respectively. In this manner, the potential of the first node N1 and the potential of the second node N2 can be equivalent to the input signal Vin. That is, the first node N1 and the second node N2 change from being at a high level to being at a low level, and the first output transistor M410 can transmit the first level Vgl of the first level terminal VGL to the signal output terminal OUT under the control of the low level of the first node N1 so that the signal output terminal OUT can start to output the enable level of the light emission control signal EM. At this time, the potential of the first electrode of the first capacitor C1 and the high level vgh of the second clock signal ck2 are kept consistent, and the potential of the second electrode of the first capacitor C1 and the potential of the second node N2 are kept consistent. Moreover, since the potential of the first node N1 is equivalent to the potential of the second node N2, the filtering transistor M300 of the filtering module 300 is turned off.

In the stage t5, the input signal Vin is still at a low level, and the first clock signal ck1 changes to be at the high level vgh, so the first transistor M1 and the second transistor M2 are both turned off. At this time, the second clock signal ck2 hops from being at the high level vgh in the stage t4 to being at the low level vgl so that the potential of the first electrode of the first capacitor C1 can change by—(vgh−vgl), and due to the coupling action of the first capacitor C1, the potential of the second node N2 also changes by—(vgh−vgl) so that the potential of the second node N2 can change from being equivalent to the potential of the first node N1 to being lower than the potential of the first node N1 by (vgh−vgl), thus satisfying the requirement of turning on the filtering transistor M300 of the filtering module 300; and when the filtering transistor M300 is turned on, the filtering transistor M300 can pull down the potential of the first node N1 to be equivalent to the potential of the second node N2 so that the first output transistor M410 can keep transmitting the first level signal Vgl of the first level terminal VGL to the signal output terminal OUT under the control of the lower potential of the first node N1, thus making the signal output terminal OUT keep transmitting the enable level of the light emission control signal EM.

After the stage t5, as long as the input signal Vin is kept at a low level, the potential of the first node N1 alternately changes between being at a low level and being at a lower level as the first clock signal ck1 and the second clock ck2 alternately change so that the signal output terminal OUT can stably and continuously output the enable level of the light emission control signal EM, thus making the multiple pixels of the display panel stably and continuously emit light. In this manner, the display effect of the display panel can be improved.

To ensure that the potential of the third node N3 can control the second output transistor M420 to be turned on in the stages t1 to t3 or even in a longer stage, the second output unit 420 may further include a capacitor C400 electrically connected between the second level terminal VGH and the third node N3 to store the potential of the third node N3 and keep the potential of the third node N3 stable.

It is to be understood that in the stage t4, the stage t5 and other stages after the stage t5, the output module 300 can be ensured to accurately transmit the first level signal Vgl of the first level terminal VGL by controlling the first node N1 to keep at a low level so that the signal output terminal can stably output the enable level of the light emission control signal EM. However, due to the presence of free electrons in a transistor, a small current flows through the first electrode and the second electrode of the transistor though the transistor is turned off. That is, when the first transistor M1 is turned off, a small current flows through the first transistor M1, affecting the potential of the first node N1.

Figure 8:
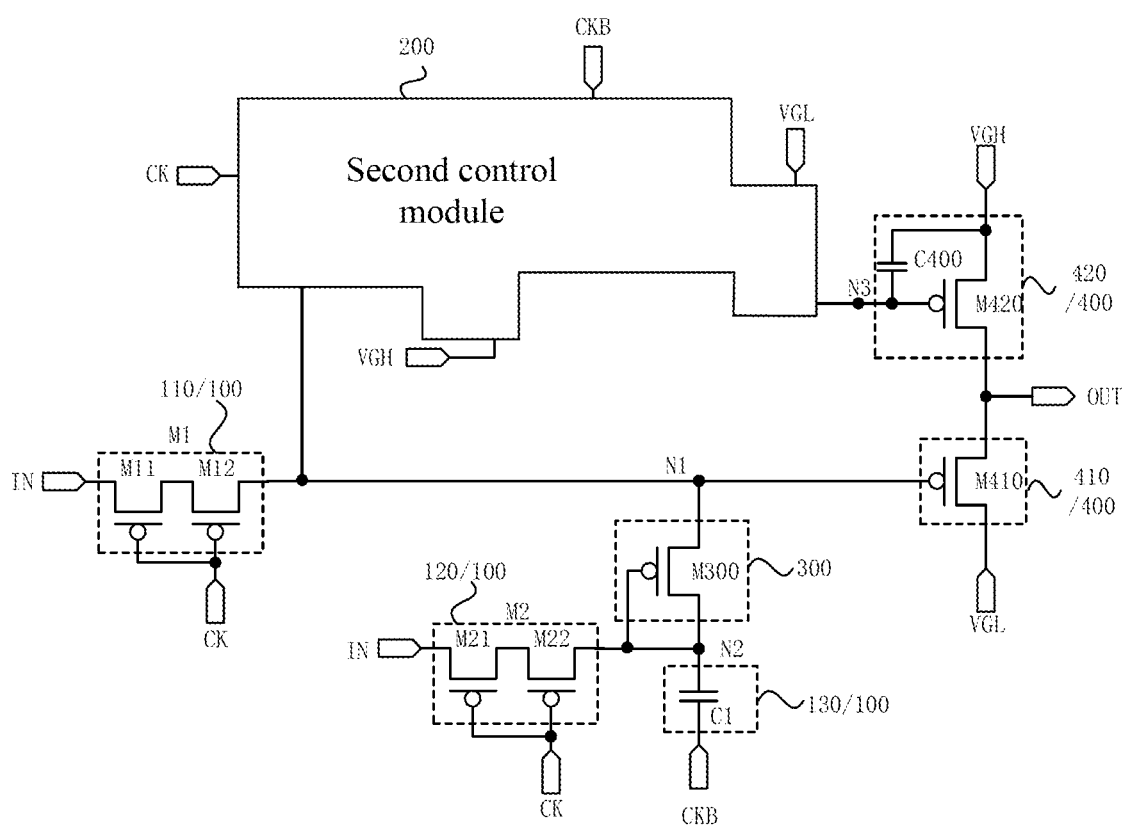
FIG. 8 is a diagram illustrating the structure of another light emission control circuit according to embodiments of the present disclosure.

In an optional embodiment, FIG. 8 is a diagram illustrating the structure of another light emission control circuit according to embodiments of the present disclosure. As shown in FIG. 8, the first transistor M1 may include a first sub-transistor M11 and a second sub-transistor M12. The first electrode of the first sub-transistor M11 is electrically connected to the signal input terminal IN, the second electrode of the first sub-transistor M11 is electrically connected to the first electrode of the second sub-transistor M12, the second electrode of the second sub-transistor M12 is electrically connected to the first node N1, and the gate of the first sub-transistor M11 and the gate of the second sub-transistor M12 are both electrically connected to the first clock terminal CK. In this case, the first transistor M1 is a double-gate transistor composed of the first sub-transistor M11 and the second sub-transistor M12, and the first sub-transistor M11 and the second sub-transistor M12 may be both turned on or turned off under the control of the first clock signal ck1 of the first clock terminal CK; and when the first clock signal ck1 of the first clock terminal CK controls the first sub-transistor M11 and the second sub-transistor M12 to be turned off, the first transistor M1 may have a small leakage current so that the effect of the leakage current on the potential of the first node N1 can be reduced when the first transistor M1 is turned off, thus stabilizing the potential of the first node N1. In this manner, the stability of the light emission control signal EM output by the signal output terminal OUT can be improved.

In an embodiment, with continued reference to FIG. 8, the second transistor M2 may also include a third sub-transistor M21 and a fourth sub-transistor M22. The first electrode of the third sub-transistor M21 is electrically connected to the signal input terminal IN, the second electrode of the third sub-transistor M21 is electrically connected to the first electrode of the fourth sub-transistor M22, the second electrode of the fourth sub-transistor M22 is electrically connected to the second node N2, and the gate of the third transistor M21 and the gate of the fourth transistor M22 are both electrically connected to the first clock terminal CK. In this case, the second transistor M2 is also a double-gate transistor composed of the third sub-transistor M21 and the fourth sub-transistor M22 so that the second transistor M2 can have a small leakage current when being turned off, thus improving the problem of the potential of the second node N2 affected by the leakage current and improving the stability of the potential of the second node N2. In this manner, the stability of the light emission control signal EM output by the signal output terminal OUT can also be improved.

For ease of description of the drawings and the technical solutions, unless otherwise specified, the technical solutions in the embodiments of the present disclosure are illustrated using an example in which the transistors in the first node control unit and the second node control unit are each a single-gate transistor.

It is to be understood that the operation of the first control module is illustrated using the example in which the second node control unit 120 is directly electrically connected to the signal input terminal IN, and the connection manners of the second node control unit are not limited in the present embodiment of the present disclosure.

Figure 9:
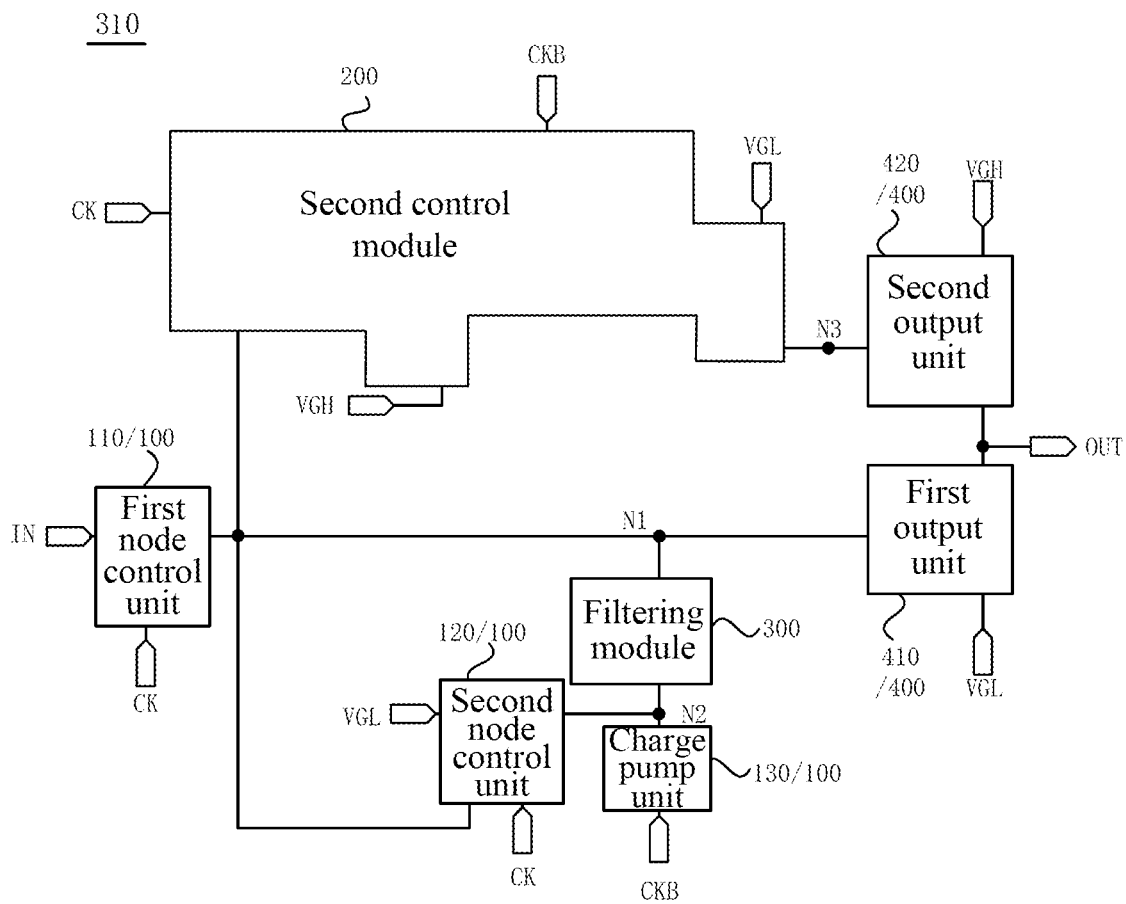
FIG. 9 is a diagram illustrating the structure of another light emission control circuit according to embodiments of the present disclosure.

In an embodiment, FIG. 9 is a diagram illustrating the structure of another light emission control circuit according to embodiments of the present disclosure. For the similarities between FIG. 9 and FIG. 5, reference may be made to the preceding description of FIG. 5. Only the differences between FIG. 9 and FIG. 5 are illustrated here. As shown in FIG. 9, the second node control unit 120 is further electrically connected to the first clock terminal CK, the first level terminal VGL and the first node N1 so that the second node control unit 120 can supply the first level signal Vgl to the second node N2 according to the first clock signal ck1 and the potential of the first node N1.

Specifically, when the light emission control circuit is the first-stage light emission control circuit of the light-emitting driver, the input signal Vin of the signal input terminal IN is the light emission control start pulse signal that is supplied by the timing controller; and when the light emission control circuit is any other stage of light emission control circuit of the light-emitting driver, the input signal Vin of the signal input terminal IN is the light emission control signal output by the signal output terminal of the previous-stage light emission control circuit of the current-stage light emission control circuit. Since the potential of the second node N2 that is electrically connected to one terminal of the second node control unit 120 is a signal that changes with the hops of the second clock signal ck2, and the changes in the second node N2 may cause the signal of the other terminal of the second node control unit 120 to oscillate accordingly, the second node control unit 120 is electrically connected to the first clock terminal CK, the first level terminal VGL and the first node N1 so that the second node control unit 120 cannot be directly electrically connected to the signal input terminal IN. In this manner, the effect of the changes in the potential of the second node N2 on the input signal Vin of the signal input terminal IN can be improved, and the loading amount of the signal input terminal IN can also be reduced so that when the input signal Vin is the light emission control signal output by the signal output terminal of the previous-stage light emission control circuit, the accuracy and the stability of the light emission control signal output by the previous-stage light emission control circuit can be improved. Moreover, the potential of the first node N1 controls the second node control unit 12, and the second node control unit 120 transmits the first level signal Vgl to the second node N2 under the control of the first clock signal ck1 and the potential of the first node N1 so that the potential of the second node N2 cannot be directly affected by the input signal Vin, thus ensuring the accuracy and the stability of the potential of the second node N2 of the current-stage light emission control circuit.

Figure 10:
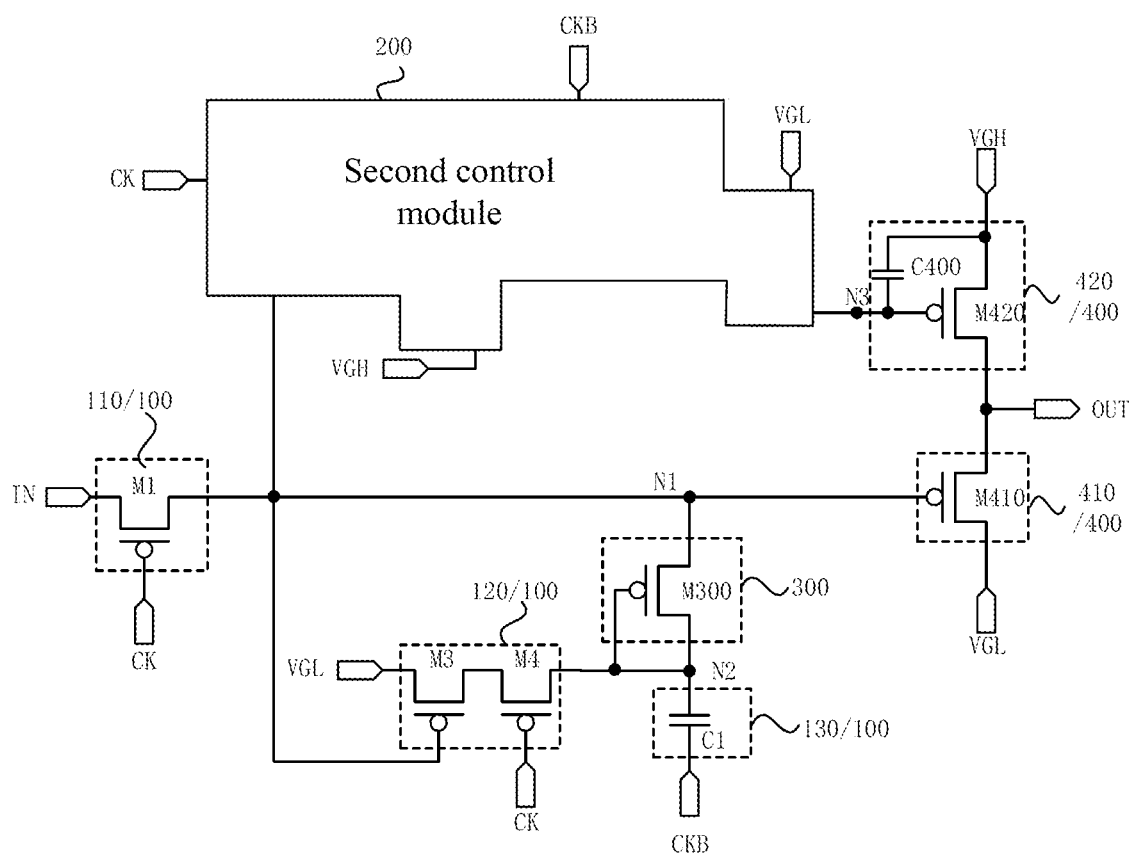
FIG. 10 is a diagram illustrating the structure of another light emission control circuit according to embodiments of the present disclosure.

In an embodiment, FIG. 10 is a diagram illustrating the structure of another light emission control circuit according to embodiments of the present disclosure. For the similarities between FIG. 10 and FIG. 6, reference may be made to the preceding description of FIG. 6. Only the differences between FIG. 10 and FIG. 6 are illustrated here. As shown in FIG. 10, the second node control unit 120 may include a third transistor M3 and a fourth transistor M4. The first electrode of the third transistor M3 is electrically connected to the first level terminal VGL, the second electrode of the third transistor M3 is electrically connected to the first electrode of the fourth transistor M4, the second electrode of the fourth transistor M4 is electrically connected to the second node N2, the gate of the third transistor M3 is electrically connected to the first node N1, and the gate of the fourth transistor M4 is electrically connected to the first clock terminal CK.

In this manner, the third transistor M3 may be turned on or turned off under the control of the potential of the first node N1, the fourth transistor M4 may be turned on or turned off under the control of the first clock signal ck1, and when the third transistor M3 and the fourth transistor M4 are turned on simultaneously, the first level signal Vgl can be transmitted to the second node N2 through the third transistor M3 and the fourth transistor M4 sequentially.

In an embodiment, that the first node control unit 110 includes the first transistor M1, and the first transistor M1, the third transistor M3 and the fourth transistor M4 are each a PMOS transistor is used as an example. When the first clock signal ck1 is at the low level vgl, the first transistor M1 and the fourth transistor M4 are turned on, and the input signal Vin is transmitted to the first node N1 through the turned-on first transistor M1, and if the input signal Vin is also at a low level, the third transistor M3 is turned on under the control of the low-level of the input signal Vin so that the first level signal Vgl can be transmitted to the second node N2 through the third transistor M3 and the fourth transistor M4 sequentially, and the potential of the second node N2 and the potential of the first node N1 can be each at a low level; and when the first clock signal ck1 is at a high level, the first transistor M1 and the fourth transistor M4 are turned off, and the input signal Vin cannot be transmitted to the first node N1, and though the potential of the first node N1 is kept at a low level, and the third transistor M3 is turned on, the first level signal Vgl is transmitted to the first electrode of the fourth transistor M4 only through the third transistor M3 and cannot be transmitted to the second node N2 so that the potential of the second node N2 can decrease under the control of the charge pump unit 130 and the second clock signal ck2, and when the potential of the second node N2 decreases, the potential of the first node N1 can be pulled down by the filtering module 300. In this manner, the potential of the first node N1 can be at a lower level so that the output module 400 can accurately and quickly transmit the first level signal Vgl to the signal output terminal OUT under the control of the lower level of the potential of the first node N1, thus making the signal output terminal OUT stably output the enable level of the light emission control signal EM.

In addition, when the first clock signal ck1 is at a low level, and the input signal Vin is at a high level, the high-level input signal Vin is transmitted to the first node N1 through the first transistor M1 so that the potential of the first node N1 can control the third transistor M3 to be turned off, and the first level signal Vgl cannot be transmitted to the second node N2. In this case, the second node N2 is equivalent to the second clock signal ck2. That is, the second node N2 is at the high level of the second clock signal ck2 so that the potential of the first node N1 and the potential of the second node N2 can be each at a high level. When the first clock signal ck1 is at a high level, and the input signal Vin is at a high level, the first transistor M1 and the third transistor M3 are both turned off, and the first level signal Vgl cannot also be transmitted to the second node N2. In this case, the second node N2 still changes with the changes of the second clock signal ck2.

In this manner, when the second node control unit 120 is electrically connected to the first node N1 instead of being directly electrically connected to the signal input terminal IN, the second node control unit 120 includes the third transistor M3 and the fourth transistor M4 so that the effect of the changes in the potential of the second node N2 on the input signal Vin of the signal input terminal IN can be improved, and on the premise that the loading amount of the signal input terminal IN can be reduced, the same function as when the second node control unit 120 is directly electrically connected to the signal input terminal IN can also be fulfilled. It is to be noted that whether the second node control unit 120 is directly electrically connected to the first node N1 or not, the second node control unit 120 still has similar functions, so for ease of description, unless otherwise specified, the technical solution in the embodiments of the present disclosure is illustrated below using an example in which the second node control unit 120 is directly electrically connected to the signal input terminal IN.

It is to be understood that when the first output unit 410 of the output module 400 includes the first output transistor M410, due to the properties of the transistor, the first level signal Vgl of the first level terminal VGL can become Vgl−Vth4 (Vth4 is the threshold voltage of the first output transistor M410) after being transmitted through the first output transistor M410 so that the enable level of the light emission control signal EM of the signal output terminal OUT of the previous-stage light emission control circuit received by the signal input terminal IN of the current-stage light emission control circuit can be Vgl−Vth4 instead of the first level signal Vgl, that is, the input signal Vin is Vgl−Vth4; and when the first node control unit 110 includes the first transistor M1, and the input signal Vin of the signal input terminal IN is transmitted to the first node N1 through the first transistor M1, the potential of the first node N1 is Vin−Vth1 (Vth1 is the threshold voltage of the first transistor M1). When the first transistor M1 and the first output transistor M410 are each an n-channel transistor, and Vth1=Vth4=Vth, Vth is a positive value, the enable level of the input signal Vin is a high level, and the potential of the first node N1 is lower than the first level signal Vgl by 2Vth so that the first output transistor M410 cannot be normally turned on, the first level signal Vgl of the first level terminal VGL cannot be accurately transmitted to the signal output terminal OUT, and the light emission control signal output by the signal output terminal OUT cannot directly hop to be at an enable level due to the occurrence of a hopping step when hopping from being at a disable level to being at an enable level, thus affecting the light emission stability of the multiple pixels of the display panel; and when the first transistor M1 and the first output transistor M410 are each a p-channel transistor, and Vth1=Vth4=Vth, Vth is a negative value, the enable level of the input signal Vin is a low level, the potential of the first node N1 is higher than the first level signal Vgl by 2|Vth|, and the first output transistor M410 cannot be normally turned on so that the potential of the first node N1 cannot control the first output transistor M410 to accurately transmit the first level signal Vgl of the first level terminal VGL to the signal output terminal OUT, and the light emission control signal output by the signal output terminal OUT cannot directly hop to be at an enable level due to the occurrence of a hopping step when hopping from being at a disable level to being at an enable level, thus affecting the light emission stability of the multiple pixels of the display panel.

Figure 11:
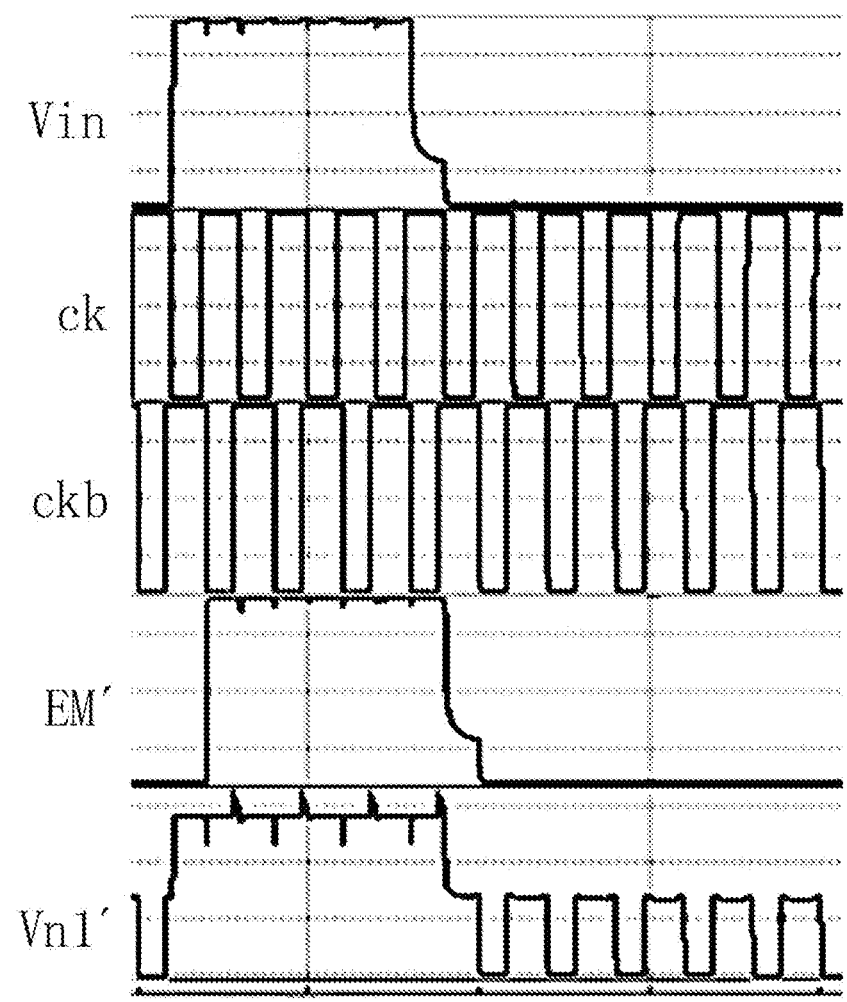
FIG. 11 is a signal simulation diagram of a light emission control circuit in the related art.

In an embodiment, FIG. 11 is a signal simulation diagram corresponding to a light emission control circuit in the related art. As described in FIG. 11, that transistors in the light emission control circuit in the related art are each a p-channel transistor is used as an example, and due to the presence of the threshold voltage Vth of the first output transistor, when the signal output terminal OUT of the previous-stage light emission control circuit starts to output the enable level of the light emission control signal, a falling edge step occurs due to the presence of the threshold voltage of the first output transistor in the previous-stage light emission control circuit, and the light emission control signal at the falling edge step is Vgl+|Vth|. That is, the input signal Vin received by the signal input terminal of the current-stage light emission control circuit has a falling edge step, and after passing through the first transistor, the input signal Vin, due to the presence of the first transistor, makes the height of the falling edge step further raised, and then the potential Vn1' of the first node becomes Vgl+2|Vth| so that the potential Vn1' of the first node cannot control the first output transistor to be normally turned on. In this manner, when the current-stage light emission control circuit starts to output the light emission control signal EM', the light emission control signal EM' can also have a falling edge step so that the accuracy of the light emission control signal output by the light emission control circuit can be affected.

Figure 12:
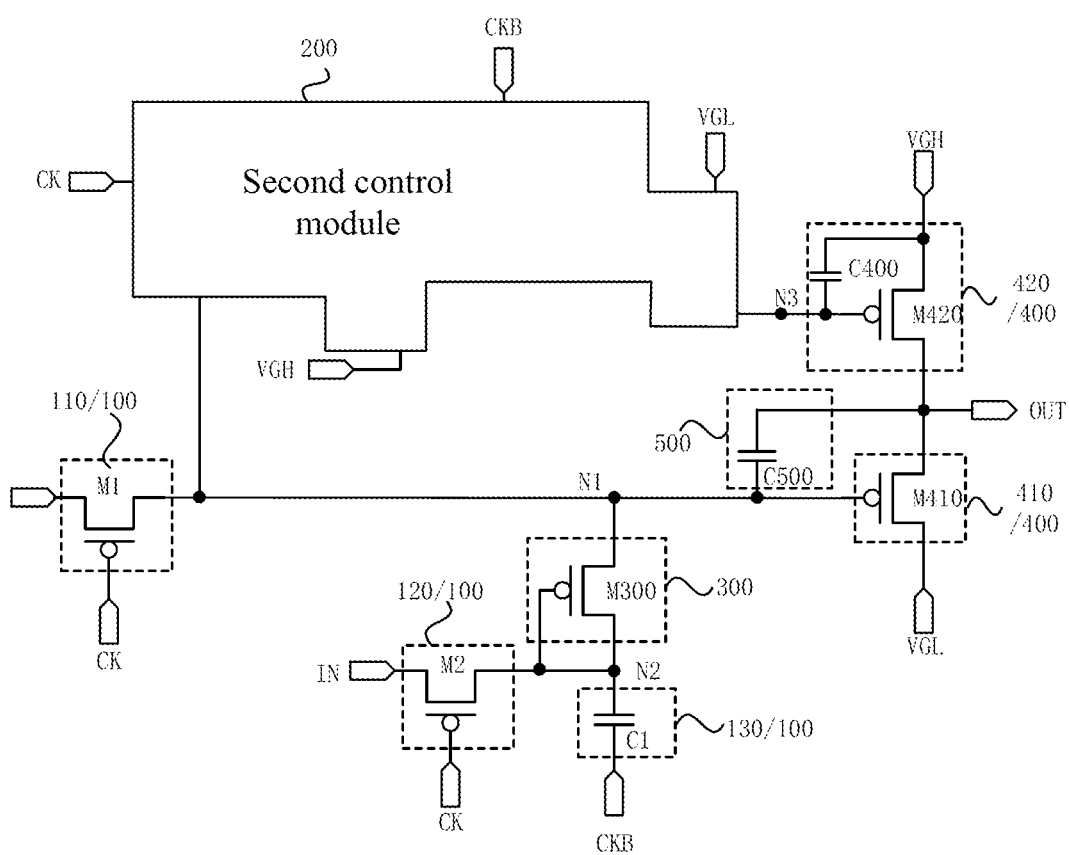
FIG. 12 is a diagram illustrating the structure of another light emission control circuit according to embodiments of the present disclosure.

To solve the preceding problem, in an embodiment, FIG. 12 is a diagram illustrating the structure of another light emission control circuit according to embodiments of the present disclosure. As shown in FIG. 12, the light emission control circuit 310 further includes a bootstrap module 500. The bootstrap module 500 is electrically connected between the signal output terminal OUT and the first node N1 and is configured to control the potential of the first node N1 according to the light emission control signal of the signal output terminal OUT so that when the light emission control signal EM output by the signal output terminal OUT changes, the bootstrap module 500 can drive the first node N1 to change accordingly. In this manner, the potential of the first node N1 can be ensured to make the output module 400 accurately transmit the first level signal Vgl to the signal output terminal OUT so that the signal output terminal OUT can stably and accurately output the light emission control signal EM, and the case where a hopping step occurs when the signal output terminal OUT hops from being at a disable level to being at an enable level because the potential of the first node N1 cannot accurately control the output module 400 can be improved, thus improving the light emission stability of the multiple pixels of the display panel.

In an embodiment, with continued reference to FIG. 12, the bootstrap module 500 may include a bootstrap capacitor C500. The first electrode of the bootstrap capacitor C500 is electrically connected to the signal output terminal OUT, and the second electrode of the bootstrap capacitor C500 is electrically connected to the first node N1.

In an embodiment, that the first node control unit 110 includes the first transistor M1, the output module 400 includes the first output transistor M410, and the first transistor M1 and the first output transistor M410 are each a p-channel transistor is used as an example. In conjunction with FIG. 11 and FIG. 7, in the stage t4, when the first clock signal ck1 and the input signal Vin are each at a low level, the first transistor M1 is turned on, and the input signal Vin is transmitted to the first node N1 so that the potential of the first node N1 can become Vgl+2|vth|. At this time, the first output transistor M410 is between the turned-on state and the turned-off state so that the first level signal Vgl of the first level terminal VGL can be started to transmit to the signal output terminal OUT, the light emission control signal EM output by the signal output terminal OUT can change from being at the high level in the stage t3 to being at a low level, and due to the coupling action of the bootstrap capacitor C500, the potential of the first node N1 can change with the changes of the potential of the signal output terminal OUT. That is, the potential of the first node N1 decreases accordingly so that the potential of the first node N1 can be sufficient enough to control the first output transistor M410 to be fully turned on, the first output transistor M410 can accurately transmit the first level signal Vgl to the signal output terminal OUT, and the signal output terminal OUT can accurately output the enable level of the light emission control signal EM. In this manner, the problem that the light emission control signal EM output by the signal output terminal OUT has a hopping step because the potential of the first node N1 is not sufficient enough to control the first output transistor M410 to be fully turned on can be improved so that when the light emission control signal EM is used for controlling the multiple pixels of the display panel to emit light, the display stability of the display panel can be improved.

Figure 13:
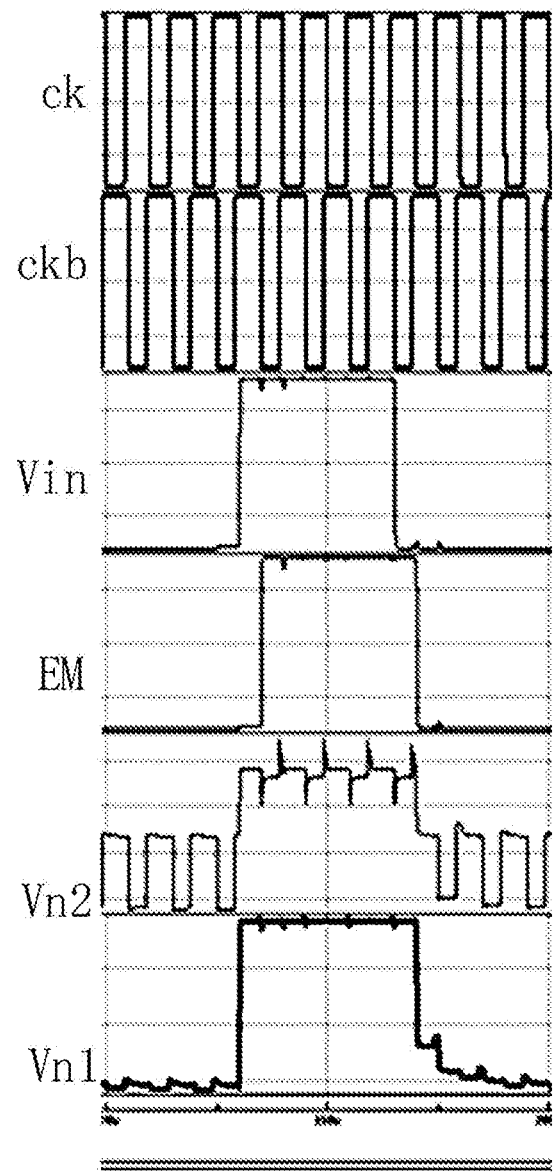
FIG. 13 is a signal simulation diagram corresponding to the light emission control circuit of FIG. 12.

In an embodiment, FIG. 13 is a signal simulation diagram corresponding to the light emission control circuit of FIG. 12. In conjunction with FIG. 12 and FIG. 13, when the input signal Vin received by the signal input terminal IN of the light emission control circuit 310 becomes at a low level, and the first clock signal ck is at an enable level, the input signal Vin is transmitted to the first node N1 through the first transistor M1 and to the second node N2 through the second transistor M2; and at this time, the potential Vn1 of the first node N1 and the potential Vn2 of the second node N2 decrease, and the first level signal Vgl is transmitted to the signal output terminal OUT so that the light emission control signal EM output by the signal output terminal OUT can hop to be at an enable level, and the bootstrap module 500 generates a bootstrap action so that the potential Vn1 of the first node N1 can further decrease to be less than the input signal Vin. For example, the potential Vn1 of the first node N1 is less than the first level signal Vgl so that the potential of the first node N1 can control the first output transistor M410 to be normally turned on, the light emission control signal EM can be output accurately, and the falling edge step of the light emission control signal EM can be eliminated; and the potential Vn2 of the second node N2 is kept as the input signal Vin+Vth, and the filtering module is not turned on so that the potential Vn2 of the second node N2 cannot affect the potential Vn1 of the first node N1. When the first clock signal ck1 hops to be at a disable level, and the second clock signal ckb hops to be at an enable level, due to the presence of the charge pump unit 130, the potential of the second node N2 changes with the changes of the second clock signal ckb so that the potential Vn2 of the second node N2 can decrease; and when the potential Vn2 of the second node N2 decreases to be less than the potential Vn1 of the first node N1, the filtering module 300 is turned on so that the potential Vn1 of the first node N1 can be close to the potential Vn2 of the second node N2, that is, the potential Vn1 of the first node N1 can further decrease. When the first clock signal ck becomes at an enable level again, the potential Vn1 of the first node N1 tends to increase under the joint action of the bootstrap module 500 and the input signal Vin transmitted by the first transistor M1, but the increased potential is so limited that the potential Vn1 of the first node N1 can be kept lower; and the potential of the second node N2 becomes Vin+Vth again under the action of the input signal Vin transmitted by the second transistor M2 until when the second clock signal ckb hops to be at an enable level next time, the potential Vn2 of the second node N2 decreases under the action of the charge pump unit 130. In this manner, the filtering module 300 is used for dividing the connection node between the charge pump unit 130 and the gate of the first output transistor M410 into the first node N1 and the second node N2 so that the potential of the first node N1 that is directly electrically connected to the first output transistor M410 can be kept lower, and the problem of the falling edge step of the potential Vn1 of the first node N1 and the problem of the falling edge step of the output light emission control signal EM can be eliminated or improved, thus keeping the first output transistor M410 normally turned on and making the signal output terminal OUT stably and accurately output the light emission control signal EM, and so that the potential Vn2 of the second node N2 that is directly electrically connected to the charge pump unit 130 can change with the changes of the second clock signal ckb and can be used for eliminating the bias state of a particular transistor.

Figure 14:
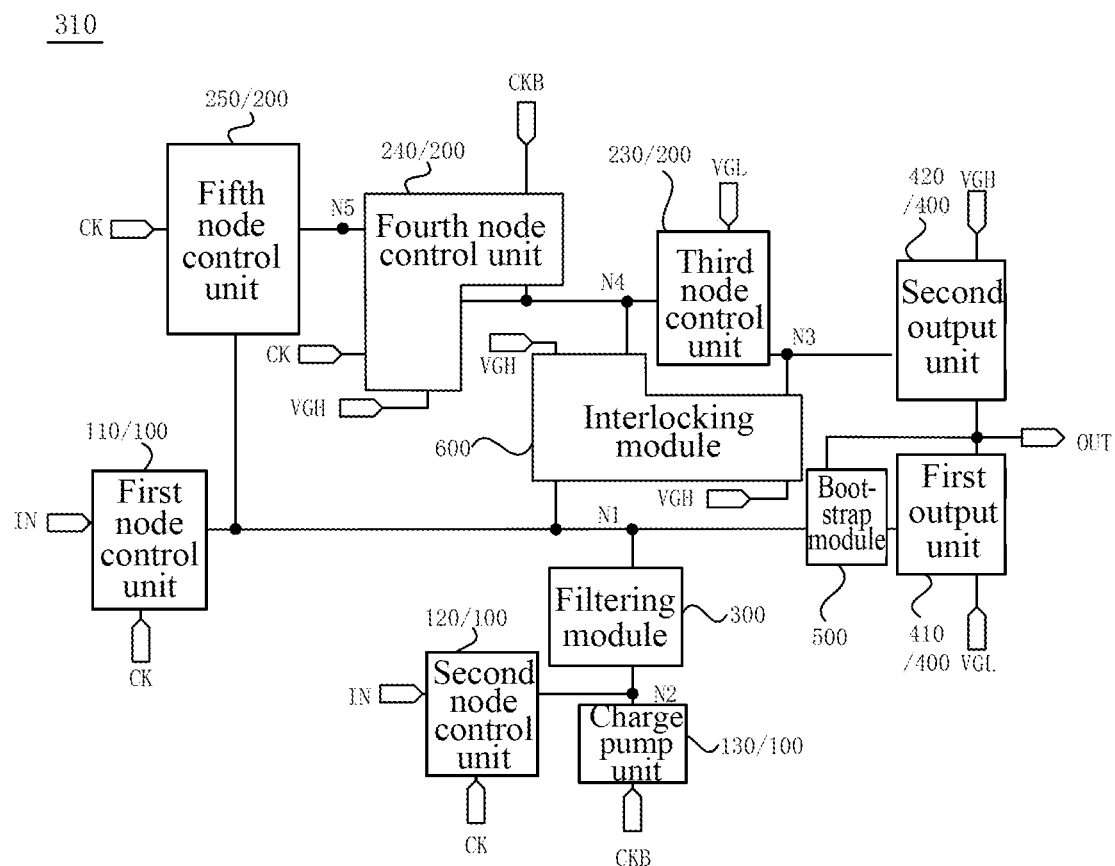
FIG. 14 is a diagram illustrating the structure of another light emission control circuit according to embodiments of the present disclosure.

In an embodiment, FIG. 14 is a diagram illustrating the structure of another light emission control circuit according to embodiments of the present disclosure. As shown in FIG. 14, based on the preceding embodiments, the light emission control circuit 310 further includes an interlocking module 600. The interlocking module 600 is electrically connected to the first node N1, the third node N3, the second level terminal VGH and the second control module 200 and is configured to control, under the control of the second control module 200, the second level signal Vgh to be transmitted to the first node N1 and control, under the control of the potential of the first node N1, the second level signal Vgh to be transmitted to the third node N3.

Specifically, when the signal output terminal OUT needs to output the enable level of the light emission control signal EM, the potential of the first node N1 should be at an enable level capable of controlling the output module 400 to transmit the first level signal Vgl to the signal output terminal OUT, and in this case, to ensure the accuracy of the enable level of the light emission control signal EM output by the signal output terminal OUT, the potential of the third node N3 should be at a disable level incapable of controlling the output module 400 to transmit the second level signal Vgh to the signal output terminal OUT; and when the signal output terminal OUT needs to output the disable level of the light emission control signal EM, the potential of the third node N3 should be at an enable level capable of controlling the output module 400 to transmit the second level signal Vgh to the signal output terminal OUT, and in this case, to ensure the accuracy of the disable level of the light emission control signal EM output by the signal output terminal OUT, the potential of the first node N1 should be at a disable level incapable of controlling the output module 400 to transmit the first level signal Vgl to the signal output terminal OUT. In this manner, when the signal output terminal OUT needs to output the enable level of the light emission control signal EM, the interlocking module 600 transmits the second level signal Vgh to the third node N3 under the control of the potential of the first node N1 so that the potential of the third node N3 can be kept at a disable level; and when the signal output terminal OUT needs to output the disable level of the light emission control signal EM, the interlocking module 600 transmits the second level signal Vgh to the first node N1 under the control of the second control module 200 so that the potential of the first node N1 can be kept at a disable level. In this manner, the potential of the first node N1 and the potential of the third node N3 can be mutually clamped so that the orderly operation of the light emission control circuit 310 can be ensured, and the accuracy and the stability of the light emission control signal output by the light emission control circuit 310 can be improved.

Figure 15:
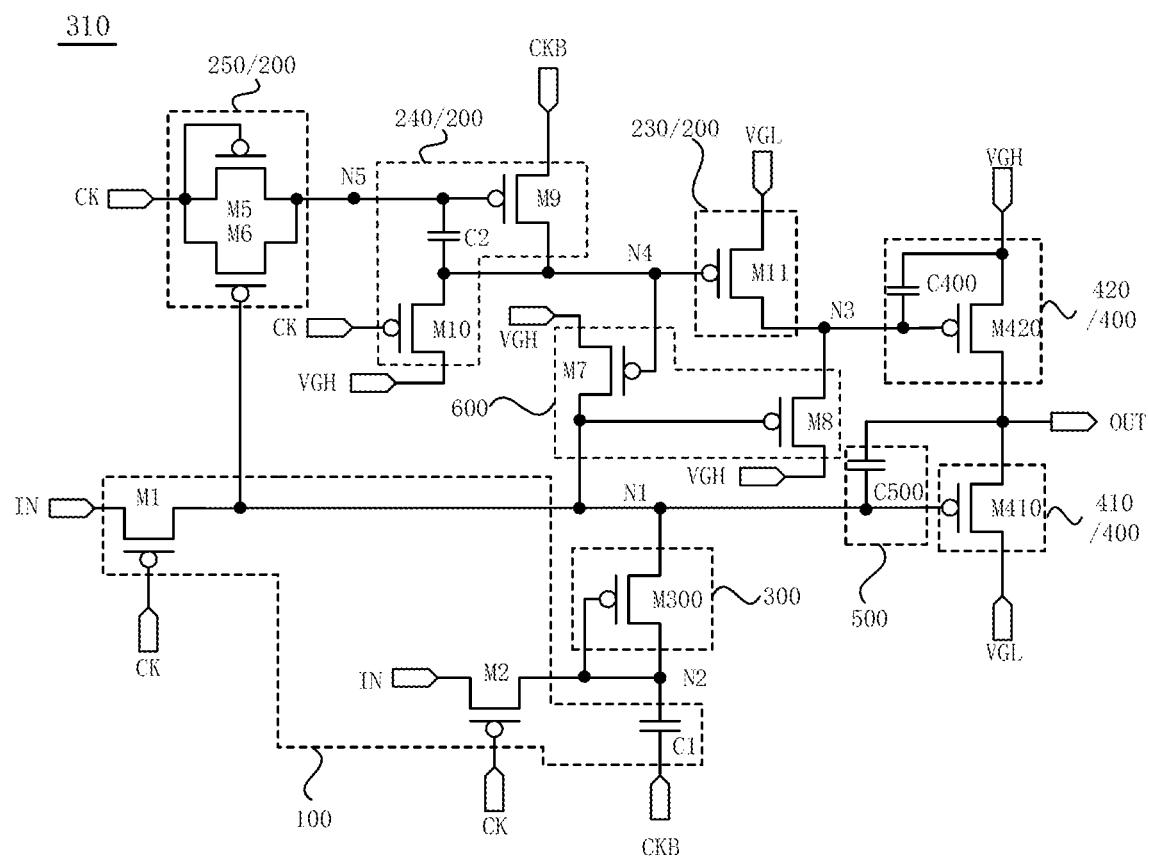
FIG. 15 is a diagram illustrating the structure of another light emission control circuit according to embodiments of the present disclosure.

In an embodiment, FIG. 15 is a diagram illustrating the structure of another light emission control circuit according to embodiments of the present disclosure. As shown in FIG. 15, the interlocking module 600 includes a seventh transistor M7 and an eighth transistor M8. The gate of the seventh transistor M7 is electrically connected to the second control module 200, the first electrode of the seventh transistor is electrically connected to the second level terminal VGH, and the second electrode of the seventh transistor M7 is electrically connected to the first node N1. The gate of the eighth transistor M8 is electrically connected to the first node N1, the first electrode of the eighth transistor M8 is electrically connected to the second level terminal VGH, and the second electrode of the eighth transistor M8 is electrically connected to the third node N3. In this manner, the seventh transistor M7 may be turned on or turned off under the control of the second control module 200, and when the seventh transistor M7 is turned on, the second level signal Vgh is transmitted to the first node N1; and the eighth transistor M8 may be turned on or turned off under the control of the potential of the first node N1, and when the eighth transistor M8 is turned on, the second level signal Vgh is transmitted to the third node N3 so that the mutual clamping between the first node N1 and the third node N3 can be implemented. In this manner, when the output module 400 includes the first output transistor M410 and the second output transistor M420, the first output transistor M410 controlled by the potential of the first node N1 and the second output transistor M420 controlled by the third node N3 cannot be turned on simultaneously so that a path cannot be formed from the second level terminal VGH to the first level terminal VGL, and a short circuit between the second level terminal VGH and the first level terminal VGL can be prevented, thus preventing the display panel from flickering when light emission is displayed. The seventh transistor M7 and the eighth transistor M8 may be each an n-channel transistor or a p-channel transistor, which may be disposed according to needs and is not limited in the present embodiment of the present disclosure.

In an embodiment, with continued reference to FIG. 14, the second control module 200 may include a third node control unit 230, a fourth node control unit 240 and a fifth node control unit 250. The third node control unit 230 is electrically connected to the third node N3 and the first level terminal VGL; the third node control unit 230 and the fourth node control unit 240 are electrically connected to a fourth node N4; and the third node control unit 230 is configured to control the potential of the third node N3 according to the potential of the fourth node N4 and the first level signal Vgl. The fourth node control unit 240 is electrically connected to the second clock terminal CKB, the second level terminal VGH and the first clock terminal CK; the fourth node control unit 240 and the fifth node control unit 250 are electrically connected to a fifth node N5; and the fourth node control unit 240 is configured to control the potential of the fourth node N4 according to the potential of the fifth node N5, the second clock signal ck2, the first clock signal ck1 and the second level signal Vgh. The fifth node control unit 250 is electrically connected to the first control module 100 and the first clock terminal CK and is configured to control the potential of the fifth node N5 under the control of the first control module 100 and the first clock signal ck1.

Specifically, the fifth node control unit 250 may control the transmission path of the first clock signal ck1 to the fifth node N5 under the control of the first control module 100 and the first clock signal ck1; the fourth node control unit 240 controls the transmission path of the second clock signal ck2 to the fourth node N4 or the second level signal Vgh to the fourth node N4 under the control of the potential of the fifth node N5 and the first clock signal ck1; and the third node control unit 230 controls the transmission path of the first level signal Vgl to the third node N3 under the control of the fourth node N4.

When the potential of the first node N1 is at an enable level, the potential of the third node N3 needs to be at a disable level, that is, when the first node N1 is at an enable level, the third node control unit 230 should be unable to transmit the first level signal Vgl to the third node N3. In this case, the potential of the fourth node N4 should be at a disable level incapable of controlling the third node control unit 230 to transmit the first level signal Vgl to the third node N3, that is, in this case, the fourth node control unit 240 is required to transmit the second level signal Vgh or the disable level of the second clock signal ck2 to the fourth node, and the first clock signal ck1 or the potential of the fifth node N5 should be at an enable level. Therefore, in this period, the fifth node control unit 250 controlled by the first control module 100 and the first clock signal ck1 should transmit the enable level of the first level signal ck1 to the fifth node N5 so that the potential of the fifth node N5 can be sufficient enough to control the fourth node control unit 240 to transmit the second level signal Vgh or the disable level of the second clock signal ck2.

In an optional embodiment, with continued reference to FIG. 14, the first control module 100 and the second control module 200 may be electrically connected to the first node N1. In this case, the fifth node control unit 250 of the second control module 200 can control, under the control of the potential of the first node N1, the first clock signal ck1 to be transmitted to the fifth node N5 so that when the potential of the first node N1 is at an enable level, the potential of the third node N3 can be kept at a disable level.

In an embodiment, with continued reference to FIG. 15, the fifth node control unit 250 may include a fifth transistor M5 and a sixth transistor M6. The gate of the fifth transistor M5 and the first electrode of the fifth transistor M5 are both electrically connected to the first clock terminal CK, and the second electrode of the fifth transistor M5 is electrically connected to the fifth node N5. The gate of the sixth transistor M6 is electrically connected to the first control module 100, the first electrode of the sixth transistor M6 is electrically connected to the first clock terminal CK, and the second electrode of the sixth transistor M6 is electrically connected to the fifth node N5.

Specifically, the fifth transistor M5 may be turned on or turned off under the joint control of the first clock signal ck1 and the potential of the fifth node N5, and when the fifth transistor M5 is turned on, the first clock signal ck1 of the first clock terminal CK can be transmitted to the fifth node N5; and the sixth transistor M6 may be turned on or turned off under the control of the potential of the first node N1 of the first control module 100, and when the sixth transistor M6 is turned on, the first clock signal ck1 of the first clock terminal CK can be transmitted to the fifth node N5. The fifth transistor M5 and the sixth transistor M6 may be each an n-channel transistor or a p-channel transistor, which may be disposed according to needs and is not limited in the present embodiment of the present disclosure.

In an embodiment, with continued reference to FIG. 15, the fourth node control unit 240 may include a ninth transistor M9, a tenth transistor M10 and a second capacitor C2. The gate of the ninth transistor M9 is electrically connected to the fifth node N5, the first electrode of the ninth transistor M9 is electrically connected to the second clock terminal CKB, and the second electrode of the ninth transistor M9 is electrically connected to the fourth node N4. The gate of the tenth transistor M10 is electrically connected to the first clock terminal CK, the first electrode of the tenth transistor M10 is electrically connected to the second level terminal VGH, and the second electrode of the tenth transistor M10 is electrically connected to the fourth node N4. The first electrode of the second capacitor C2 is electrically connected to the fifth node N5, and the second electrode of the second capacitor C2 is electrically connected to the fourth node N4.

Specifically, the ninth transistor M9 is turned on or turned off under the control of the potential of the fifth node N5, and when the ninth transistor M9 is turned on, the second clock signal ck2 can be transmitted to the fourth node N4; the tenth transistor M10 is turned on or turned off under the control of the first clock signal ck1, and when the tenth transistor M10 is turned on, the second level signal Vgh can be transmitted to the fourth node N4; and the second capacitor C2 can maintain the difference between the potential of the fifth node N5 and the potential of the fourth node N4. The ninth transistor M9 and the tenth transistor M10 may be each an n-channel transistor or a p-channel transistor, which may be disposed according to needs and is not limited in the present embodiment of the present disclosure.

In an embodiment, with continued reference to FIG. 15, the third node control unit 230 may include an eleventh transistor M11. The gate of the eleventh transistor M11 is electrically connected to the fourth node N4, the first electrode of the eleventh transistor M11 is electrically connected to the first level signal VGL, and the second electrode of the eleventh transistor M11 is electrically connected to the third node N3. In this manner, the eleventh transistor M11 can be turned on or turned off under the control of the potential of the fourth node N4, and when the eleventh transistor M11 is turned on, the first level signal Vgl can be transmitted to the third node N3. The eleventh transistor M11 may also be an n-channel transistor or a p-channel transistor, which may be disposed according to needs and is not limited in the present embodiment of the present disclosure.

Figure 16:
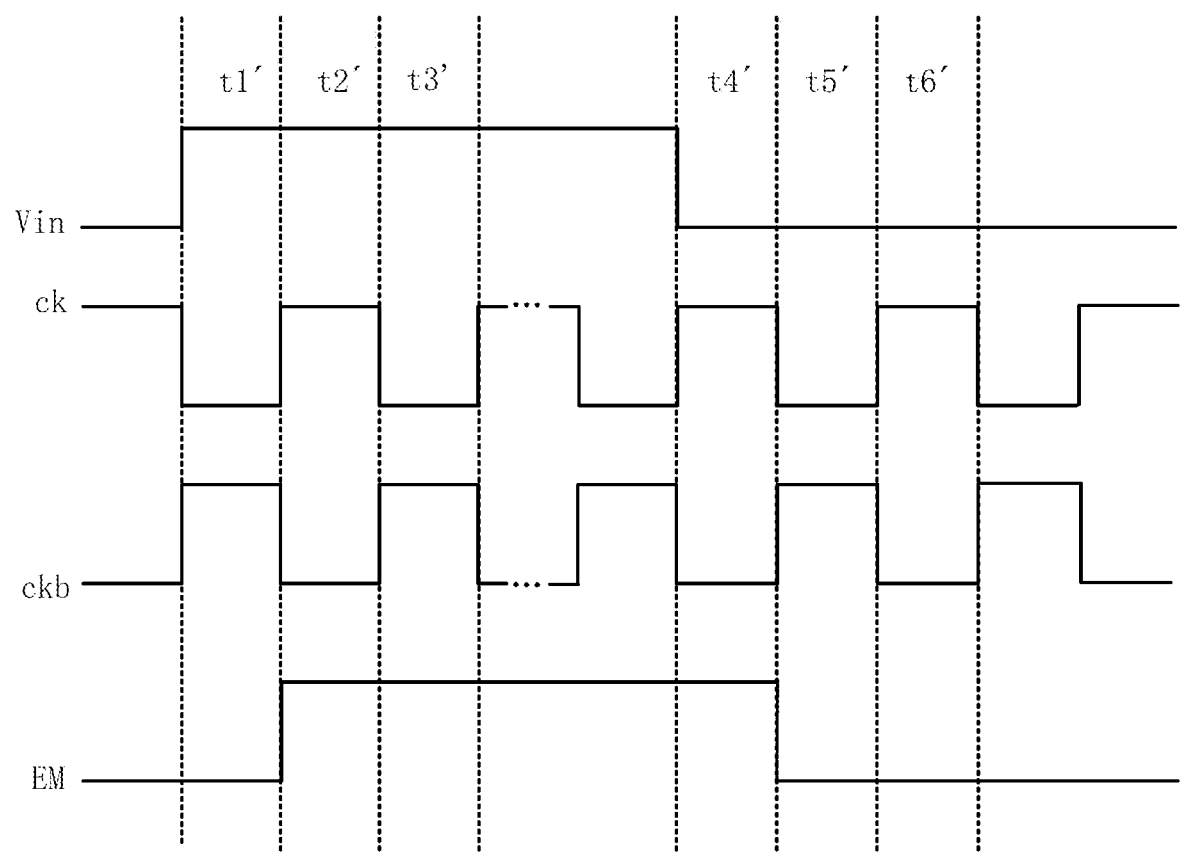
FIG. 16 is a drive timing diagram of the light emission control circuit corresponding to FIG. 15.

In an embodiment, that transistors in the light emission control circuit are each a p-channel transistor is used as an example. FIG. 16 is a drive timing diagram of the light emission control circuit corresponding to FIG. 15. In conjunction with FIG. 15 and FIG. 16, in the stage t1', the first clock signal ck is at a low level, and the second clock signal ckb and the input signal Vin are each at a high level, so the first transistor M1 and the second transistor M2 are both turned on, and the input signal Vin is transmitted to the first node N1 and the second node N2 through the first transistor M1 and the second transistor M2 respectively so that the potential of the first node N1 and the potential of the second node N2 can be equivalent to the high level of the input signal Vin, and the first output transistor M410, the sixth transistor M6 and the eighth transistor M8 can be all turned off. Moreover, the fifth transistor M5 is turned on under the control of the first clock signal ck and then transmits the low level of the first clock signal ck to the fifth node N5 so that the potential of the fifth node N5 can control the ninth transistor M9 to be turned on, and the high level of the second clock signal ckb can be transmitted to the fourth node N4 through the ninth transistor M9, and meanwhile, the tenth transistor M10 is also turned on under the control of the first clock signal ck to transmit the second level signal Vgh to the fourth node N4 so that the fourth node N4 can be kept at a high level, the eleventh transistor M11 and the seventh transistor M7 can be both turned off, the first level signal Vgl cannot be transmitted to the third node N3, the second output transistor M420 can be turned off, and the signal output terminal OUT can be kept at the same enable level of the light emission control signal EM as the previous stage.

In the stage t2', the first clock signal ck becomes at a high level, the second clock signal ckb becomes at a low level, and the input signal Vin is still at a high level, so the first transistor M1 and the second transistor M2 are both turned off; due to the presence of the second capacitor C2, though the fifth node N5 does not have an input signal, the ninth transistor M9 can also be maintained to be turned on, and the low level of the second clock signal ckb is transmitted to the fourth node N4 through the ninth transistor M9 so that the potential of the fourth node N4 can control the eleventh transistor M11 and the seventh transistor M7 to be turned on, and the first level signal Vgl can be transmitted to the third node N3 through the turned-on seventh transistor M7, so that the second output transistor M420 can be turned on, and the second level signal Vgh can be transmitted to the signal output terminal OUT through the second output transistor M420, and so that the light emission control signal EM output by the signal output terminal OUT can hop from being an enable level to being at a disable level. Moreover, the seventh transistor M7 is turned on so that the second level signal Vgh can be transmitted to the first node N1 through the seventh transistor M7, and the first node N1 can be kept at a high level; and the second node N2 hops to be at a low level with the hops of the second clock signal ckb, and at this time, though that the filtering transistor M300 is turned on can be satisfied, the seventh transistor M7 supplies the first level signal Vgl to the first node N1 so that the first node N1 cannot change to have a lower potential with the changes of the second node N2. That is, the first node N1 is kept at a high level, and the second node N2 hops to be at a low level.

In the stage t3', the first clock signal ck becomes at a low level again, the second clock signal ckb becomes at a high level again, and the input signal Vin is still at a high level, so the first transistor M1 and the second transistor M2 are both turned on again, and the input signal Vin is transmitted to the first node N1 and the second node N2 through the first transistor M1 and the second transistor M2 respectively so that the potential of the first node N1 and the potential of the second node N2 can be equivalent to the high level of the input signal Vin, and the first output transistor M410, the sixth transistor M6 and the eighth transistor M8 can be all turned off; and the fifth transistor M5 is turned on under the control of the first clock signal ck1, so the first clock signal ck at the low level is transmitted to the fifth node N5 through the turned-on fifth transistor M5 to supplement the signal for the fifth node N5, the ninth transistor M9 is kept to be turned on, so the high level of the second clock signal ckb is transmitted to the fourth node N4 through the ninth transistor M9, and the tenth transistor M10 is also turned on under the control of the first clock signal ck to transmit the second level signal Vgh to the fourth node N4 so that the fourth node N4 can change from being at a low level to being at a high level, the seventh transistor M7 and the eleventh transistor M11 can be turned off, the first node N1 can be only controlled by the input signal Vin transmitted by the first transistor M1, the third node N3 can be kept at the low level of the previous stage, the second output transistor M420 can be kept to be turned on, and the signal output terminal OUT can keep outputting the disable level of the light emission control signal EM.

In the period after the stage t3' and before the stage t4', the input signal Vin continues to be at a high level, and the first clock signal ck and the second clock signal ckb change between being at a high level and being at a low level so that the period can repeat the operation processes of the stage t2' and the stage t3'; until the stage t4' comes, the input signal Vin becomes at a low level, the first clock signal ck is at a high level, and the second clock signal ckb is at a low level, so the first transistor M1 and the second transistor M2 are kept to be turned off, the potential of the second node N2 changes to be at a low level with the hops of the second clock signal ckb, and the potential of the first node N1 is controlled by the second level signal Vgh transmitted by the seventh transistor M7 so that the potential of the first node N1 can be kept at a high level; and the operation states of each transistor in the second control module 200 and the operation states of the first output transistor M410 and the second output transistor M420 are the same as the operation states of these transistors in the stage t2', and the signal output terminal OUT keeps outputting the enable level of the light emission control signal EM.

In the stage t5', the input signal Vin is kept at a low level, the first clock signal ck becomes at a low level, and the second clock ck2 becomes at a high level, so the first transistor M1 and the second transistor M2 are turned on, and the input signal Vin at the low level is transmitted to the first node N1 through the turned-on first transistor M1 and to the second node N2 through the turned-on second transistor M2 so that the potential of the first node N1 and the potential of the second node N1 can both be Vin+Vth (Vth is the threshold voltage of the first transistor M1 and the second transistor M2), and the first output transistor M410 is turned on to transmit the first level signal Vgl to the signal output terminal OUT so that the light emission control signal EM output by the signal output terminal OUT can change from being at an enable level to being at a disable level, that is, the light emission control signal EM can change from being at a high level to being at a low level, and due to the presence of the bootstrap capacitor C500, the potential of the first node N1 also decreases accordingly and changes to be lower than Vin+Vth so that the potential of the gate of the first output transistor M410 can further decrease, the first output transistor M410 can be further turned on, and the light emission control signal EM output by the signal output terminal can quickly become at a disable level. Moreover, the eighth transistor M8 is turned on under the control of the potential of the first node N1 so that the second level signal Vgh can be transmitted to the third node N3 through the eighth transistor M8, and so that the potential of the third node N3 can become at a high level, the second output transistor M420 can be turned off, and the second level signal Vgh cannot be transmitted to the signal output terminal OUT through the second output transistor M420; the sixth transistor M6 is also turned on under the control of the potential of the first node N1 to transmit the first clock signal ck to the fifth node N5 so that the ninth transistor M9 can transmit the high level of the second clock signal ckb to the fourth node N4 under the control of the low level of the fifth node; and the tenth transistor M10 is also turned on under the control of the first clock signal ck to transmit the second level signal Vgh to the fourth node N4 so that the potential of the fourth node N4 can be at a high level, the eleventh transistor M11 can be turned off, and the potential of the third node N3 can be only controlled by the second level signal Vgh transmitted by the eighth transistor M8.

In the stage t6', the input signal Vin is kept at a low level, the first clock signal ck becomes at a high level, and the second clock signal ckb becomes at a low level, so the first transistor M1 and the second transistor M2 are turned off; since the second clock signal ckb of the second clock terminal CKB electrically connected to the first electrode of the first capacitor C1 hops from being at the high level vgh to being at the low level vgl, the potential of the first electrode of the first capacitor C1 decreases by ΔV (ΔV=vgh−vgl), and due to the coupling action of the first capacitor C1, the potential of the second node N2 also decreases by ΔV accordingly so that the potential of the second node N2 can be lower than the potential of the first node N1, the filtering transistor M300 can be turned on, and the potential of the first node N1 can be pulled down to be at a lower level equivalent to the potential of the second node N2 by the filtering transistor M300, further controlling the first output transistor M410, the sixth transistor M6 and the eighth transistor M8 to be turned on and further improving the speed of the first level signal Vgl transmitted by the first output transistor M410. Moreover, the eighth transistor M8 is kept to be turned on, so the eighth transistor M8 keeps supplying the second level signal Vgh to the third node N3, the potential of the third node N3 controls the second output transistor M420 to be kept to be turned off, and the signal output terminal OUT keeps outputting the enable level of the light emission control signal EM.

After the stage t6', if the input signal Vin continues to be kept at a low level, and the first clock signal ck and the second clock signal ckb change between being at a high level and being at a low level, this period repeats the operation processes of the stage t5' and the stage t6' until the input signal Vin becomes at a high level, and the next drive cycle comes, that is, repeat the operation processes of the stages from t1' to t6'.

The stability of the potential of the fifth node N5 affects the stability of the signal transmitted by the fourth node control unit 240 so that the stability of the signal transmitted by the third node control unit 230 can be affected, and the stability of the potential of the third node N3 can be affected, thus affecting the stability of the light emission control signal output by the signal output terminal OUT. Therefore, improving the stability of the potential of the fifth node N5 can also improve the stability of the light emission control signal output by the signal output terminal OUT.

Figure 17:
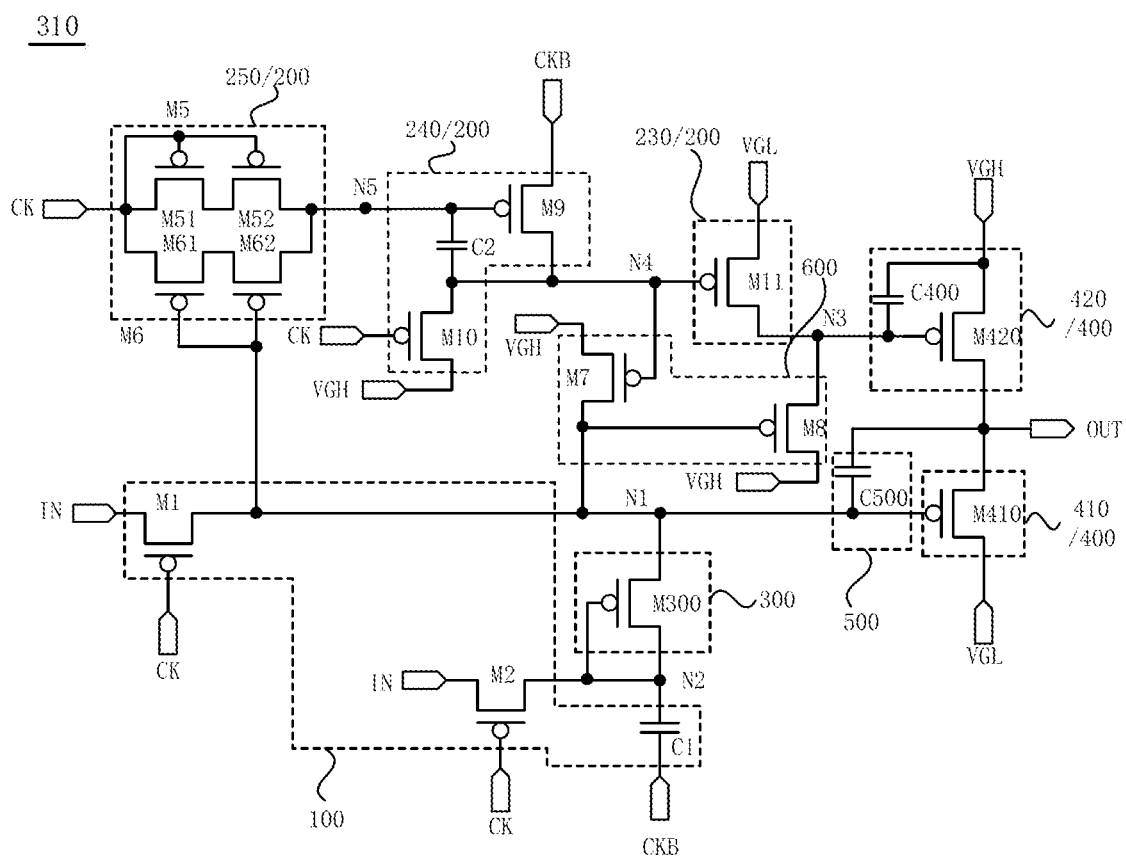
FIG. 17 is a diagram illustrating the structure of another light emission control circuit according to embodiments of the present disclosure.

In an embodiment, FIG. 17 is a diagram illustrating the structure of another light emission control circuit according to embodiments of the present disclosure. As shown in FIG. 17, the fifth transistor M5 includes a fifth sub-transistor M51 and a sixth sub-transistor M52. The first electrode of the fifth sub-transistor M51, the gate of the fifth sub-transistor M51 and the gate of the sixth sub-transistor M52 are all electrically connected to the first clock terminal CK, the second electrode of the fifth sub-transistor M51 is electrically connected to the first electrode of the sixth sub-transistor M52, and the second electrode of the sixth sub-transistor M52 is electrically connected to the fifth node N5. In this case, the fifth transistor M5 is a double-gate transistor composed of the fifth sub-transistor M51 and the sixth sub-transistor M52, and the fifth sub-transistor M51 and the sixth sub-transistor M52 may be each turned on or turned off under the control of the first clock signal ck1 of the first clock terminal CK. When the first clock signal ck1 of the first clock terminal CK controls the fifth sub-transistor M51 and the sixth sub-transistor M52 to be turned off, the fifth transistor M5 may have a smaller leakage current so that the effect of the leakage current on the potential of the fifth node N5 can be reduced when the fifth transistor M5 is turned off, thus stabilizing the potential of the third node N3. In this manner, the stability of the light emission control signal EM output by the signal output terminal OUT can be improved.

In an embodiment, with continued reference to FIG. 17, the sixth transistor M6 includes a seventh sub-transistor M61 and an eighth sub-transistor M62. The first electrode of the seventh sub-transistor M61 is electrically connected to the first clock terminal CK, the second electrode of the seventh sub-transistor M61 is electrically connected to the first electrode of the eighth sub-transistor M62, the second electrode of the eighth sub-transistor M62 is electrically connected to the fifth node N5, and the gate of the seventh sub-transistor M61 and the gate of the eighth sub-transistor M62 are both electrically connected to the first control module 100. In this case, the six transistor M6 is also a double-gate transistor composed of the seventh sub-transistor M61 and the eighth sub-transistor M62 to have a smaller leakage current when being turned off so that the effect of the leakage current on the potential of the fifth node N5 can be improved, thus improving the stability of the potential of the fifth node N5. In this manner, the stability of the light emission control signal EM output by the signal output terminal OUT can also be improved.

For ease of description of the drawings and the technical solutions, unless otherwise specified, the technical solutions in the present embodiments of the present disclosure are illustrated using an example in which the fifth transistor M5 and the sixth transistor M6 are each a single-gate transistor.

It is to be understood that the operation of the light emission control circuit of the present disclosure is illustrated in the preceding using the example in which the first control module 100 and the second control module 200 are electrically connected to the first node N1, and the connection manners between the first control module 100 and the second control module 200 are not limited in the present embodiment of the present disclosure.

Figure 18:
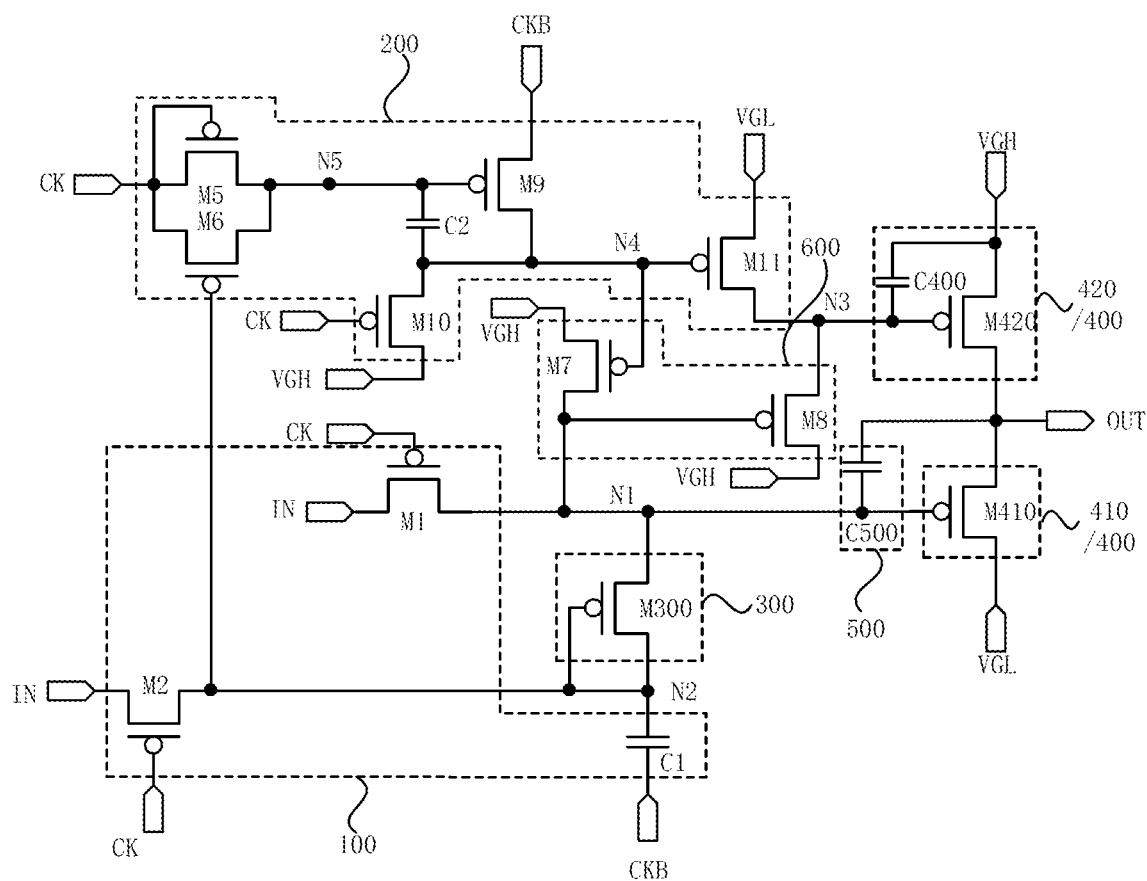
FIG. 18 is a diagram illustrating the structure of another light emission control circuit according to embodiments of the present disclosure.

In an embodiment, FIG. 18 is a diagram illustrating the structure of another light emission control circuit according to embodiments of the present disclosure. As shown in FIG. 16, the first control module 100 and the second control module 200 are electrically connected to the second node N2.

In an embodiment, when the fifth node control unit 250 of the second control module 200 includes the fifth transistor M5 and the sixth transistor M6, the gate of the sixth transistor M6 is electrically connected to the second node N2 so that the sixth transistor M6 can transmit the first clock signal ck1 to the fifth node N5 under the control of the potential of the second node N2, and so that the sixth transistor M6 can be no longer controlled by the potential of the first node N1, the loading amount of the first node N1 can be reduced, and the stability of the potential of the first node N1 can be improved, thus improving the stability of the light emission control signal EM output by the signal output terminal OUT. In this manner, the display quality can be improved. In addition, when the enable level of the light emission control signal needs to be output, the first node N1 needs to have a potential capable of controlling the first output transistor M410 to be turned on, and when the disable level of the light emission control signal needs to be output, the first node N1 needs to have a potential capable of the controlling the first output transistor M410 to be turned off so that the first node N1 needs to have a fixed potential for a long time. Therefore, when the gate of the sixth transistor M6 is electrically connected to the first node N1, there is a difference between the potential of the gate of the sixth transistor M6 and the potential of the second electrode of the sixth transistor M6 so that when the potential of the first node N1 keeps unchanged, the threshold voltage of the sixth transistor M6 can be drifted because the sixth transistor M6 is biased for a long time, thus affecting the properties of the sixth transistor M6; however, when the gate of the sixth transistor M6 is electrically connected to the second node N2, the potential of the second node N2, controlled by the first clock signal ck1 and the second clock signal ckb, alternates between being at a high level and being at a low level or between being at a low level and being at a lower level, that is, the potential of the gate of the sixth transistor M6 alternates between being at different levels, so that the sixth transistor M6 can be prevented from being biased for a long time by preventing a certain difference between the potential of the gate of the sixth transistor M6 and the potential of the second electrode of the sixth transistor M6 for a long time, and the stability of the sixth transistor M6 can be improved, thus improving the stability of the light emission control circuit 310.

Figure 19:
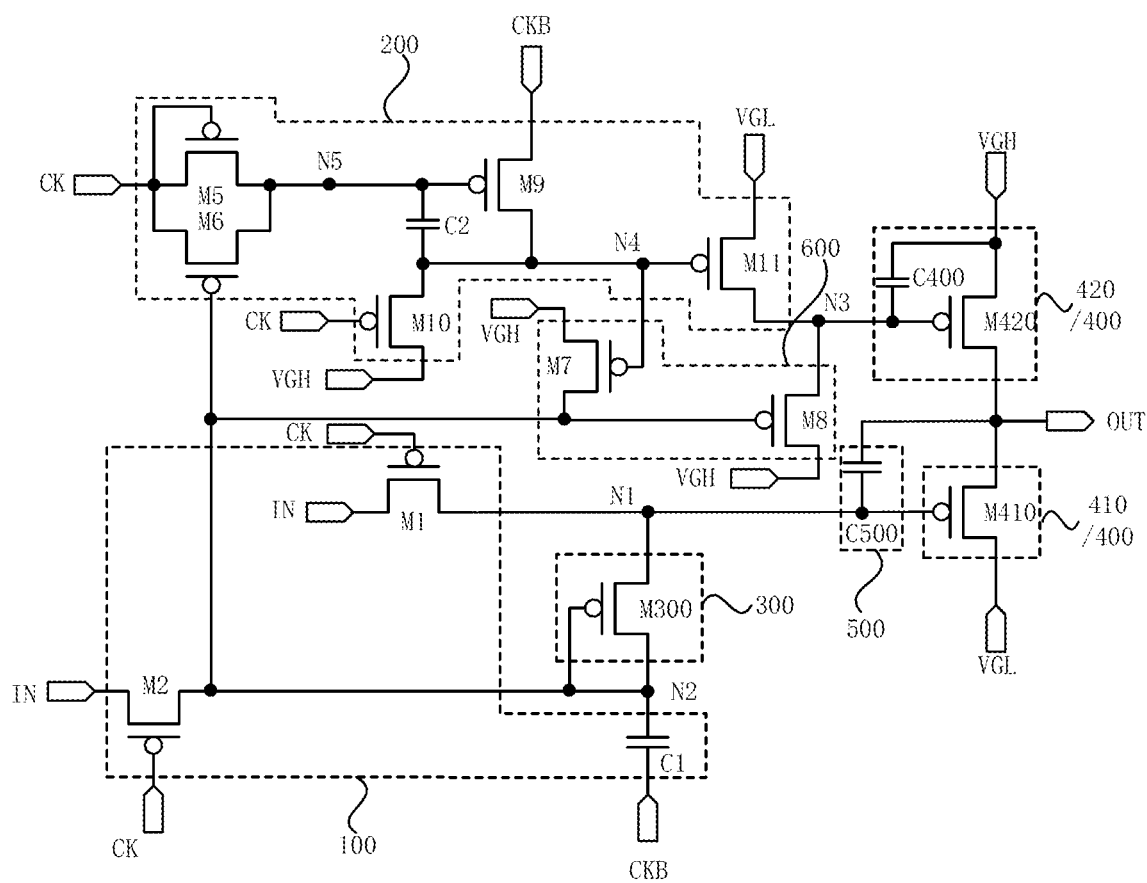
FIG. 19 is a diagram illustrating the structure of another light emission control circuit according to embodiments of the present disclosure.

In an embodiment, FIG. 19 is a diagram illustrating the structure of another light emission control circuit according to embodiments of the present disclosure. As shown in FIG. 17, when the light emission control circuit 310 includes the interlocking module 600, the interlocking module 600 may also be electrically connected to the second node N2, the third node N3, the second level terminal VGH and the second control module 200 instead of being directly electrically connected to the first node N1. In this case, the interlocking module 600 can also control, under the control of the second control module 200, the second level signal Vgh to be transmitted to the second node N2 and control, under the control of the potential of the second node N2, the second level signal Vgh to be transmitted to the third node N3.

In an embodiment, with continued reference to FIG. 19, when the interlocking module 600 includes the seventh transistor M7 and the eighth transistor M8, the gate of the seventh transistor M7 is electrically connected to the second control module 200, the first electrode of the seventh transistor M7 is electrically connected to the second level terminal VGH, the second electrode of the seventh transistor M7 is electrically connected to the second node N2, the gate of the eighth transistor M8 is electrically connected to the second node N2, the first electrode of the eighth transistor M8 is electrically connected to the second level terminal VGH, and the second electrode of the eighth transistor M8 is electrically connected to the third node N3. In this manner, the gate of the eighth transistor M8 is electrically connected to the second node N2, and the second electrode of the seventh transistor M7 is electrically connected to the second node N2 so that the loading amount of the first node N can also be reduced, and the stability of the potential of the first node N1 can be improved, thus improving the stability of the light emission control signal EM output by the signal output terminal OUT. In this manner, the display quality can be improved. Moreover, the threshold of the eighth transistor M8 and the threshold of the seventh transistor M7 can be prevented from being drifted, where the drifting is caused by a long-time bias state of the eighth transistor M8 and the seventh transistor M7 caused by a long-time fixed potential of the first node N1 so that the stability of the eighth transistor M8 and the seventh transistor M7 can be improved, thus improving the stability of the light emission control circuit.

Figure 20:
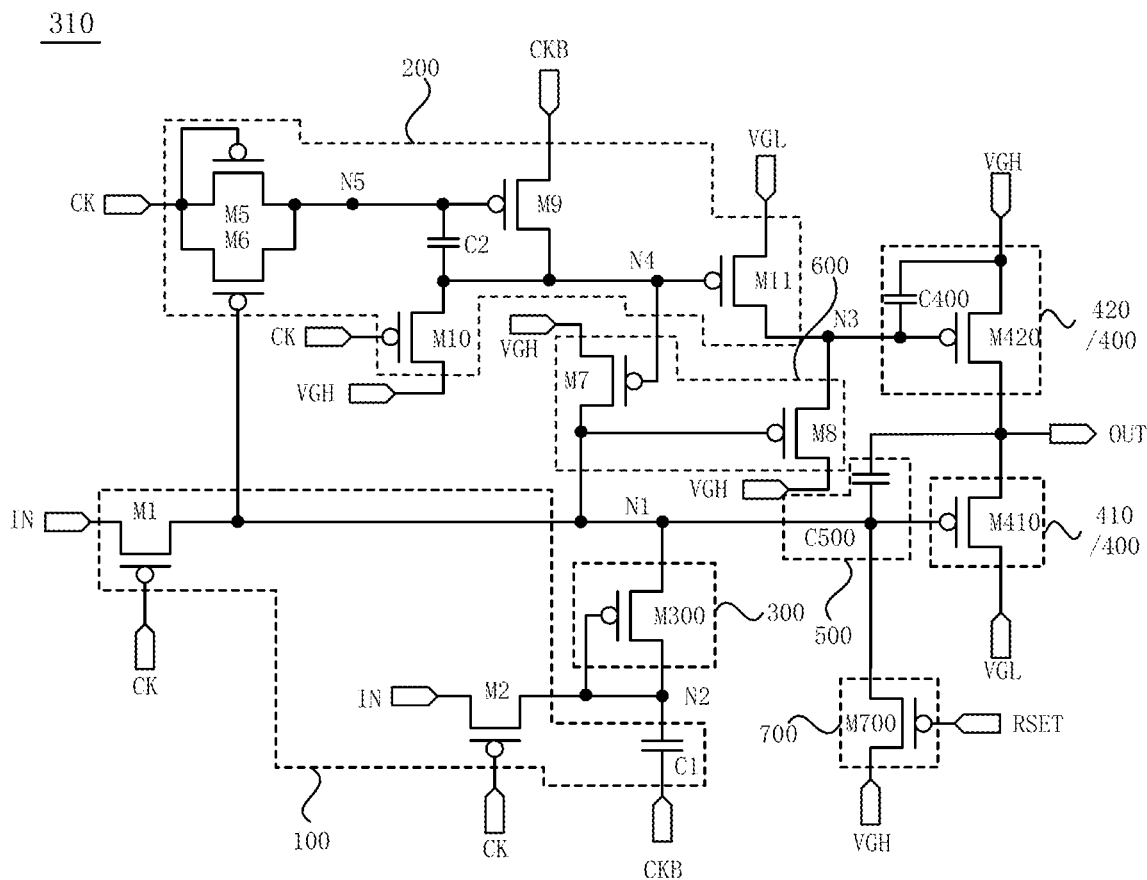
FIG. 20 is a diagram illustrating the structure of another light emission control circuit according to embodiments of the present disclosure.

In an embodiment, FIG. 20 is a diagram illustrating the structure of another light emission control circuit according to embodiments of the present disclosure. As shown in FIG. 20, the light emission control circuit 310 further includes a reset module 700. The reset module 700 is electrically connected to a reset signal terminal RSET, the second level terminal VGH and the first node N1 and is configured to control the on-off state of the charge release path from the first node N1 to the second level terminal VGH according to a reset signal rset of the reset signal terminal RSET.

In an embodiment, when the light emission control circuit 310 does not operate, or before the light emission control circuit 310 stops operating, the reset signal rset of the reset signal terminal RSET may control the charge release path from the first node N1 to the second level terminal VGH to be turned on, release the charge of the first node N1 and prevent the service life of a device from being reduced, where the reduction is caused by a long-time operation state of a load connected to the first node whose potential is at an enable level for a long time. In addition, releasing the low level of the first node N1 may also control the load connected to the first node N1 to stop power consumption when the light emission control circuit 310 does not operate so that the low consumption of the light emission control circuit 310 can be facilitated.

In an embodiment, with continued reference to FIG. 20, the reset module 700 may include a reset transistor M700. The gate of the reset transistor M700 is electrically connected to the reset signal terminal RSET, the first electrode of the reset transistor M700 is electrically connected to the second level terminal VGH, and the second electrode of the reset transistor M700 is electrically connected to the first node N1. In this manner, the reset transistor M700 may be turned on or turned off under the control of the reset signal rset of the reset signal terminal RSET, and when the reset signal rset controls the reset transistor M700 to be turned on, the reset transistor M700 can release the charge of the first node N1. The reset transistor M700 may be an n-channel transistor or a p-channel transistor, which may be disposed according to needs and is not limited in the present embodiment of the present disclosure.

Figure 21:
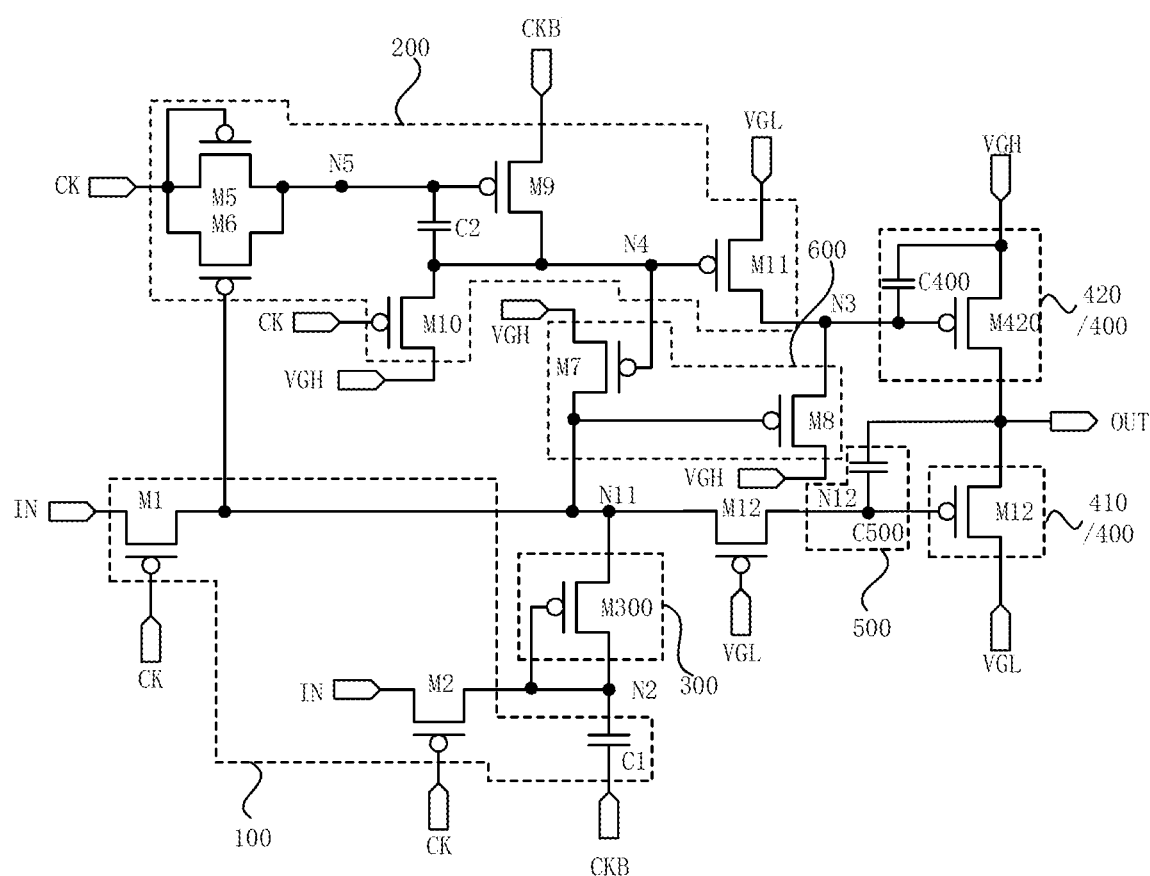
FIG. 21 is a diagram illustrating the structure of another light emission control circuit according to embodiments of the present disclosure.

In an embodiment, FIG. 21 is a diagram illustrating the structure of another light emission control circuit according to embodiments of the present disclosure. As shown in FIG. 21, the light emission control circuit 310 further includes a voltage regulation transistor M12. In this case, the first node N1 includes a first sub-node N11 and a second sub-node N12; the first electrode of the voltage regulation transistor M12 and the first control module 100 are electrically connected to the first sub-node N11, the second electrode of the voltage regulation transistor M12 and the output module 400 are electrically connected to the second sub-node N12, the gate of the voltage regulation transistor M12 is electrically connected to the first level terminal VGL, and the voltage regulation transistor M12 is turned on under the control of the first level signal Vgl. In this case, the voltage regulation transistor M12 may be turned on under the control of the first level signal Vgl to make the potential of the first sub-node N11 equivalent to the potential of the second sub-node N12.

In an embodiment, that the voltage regulation transistor M12 is a PMOS transistor is used as an example. The first level signal Vgl controls the voltage regulation transistor M12 to be turned on so that the original potential of the first node N1 can be distributed at the first sub-node N11 and at the second sub-node N12, and the operation of the light emission control circuit can be prevented from being affected due to a too low potential of the first node N1 caused by the joint action of the first control module 100, the filtering module 300 and the bootstrap module 500. In addition, due to the presence of the threshold voltage of the voltage regulation transistor M12, when the difference between the first level signal Vgl and the potential of the first sub-node N11 electrically connected to the voltage regulation transistor M12 or between the first level signal Vgl and the potential of the second sub-node N12 electrically connected to the voltage regulation M12 is less than the threshold voltage of the voltage regulation transistor M12, the voltage regulation transistor M12 is turned on, and when this condition is not satisfied, the voltage regulation transistor M12 is turned off and can protect a device electrically connected to the other node when the potential of one of the first sub-node N11 and the second sub-node N12 is abnormal.

Figure 22:
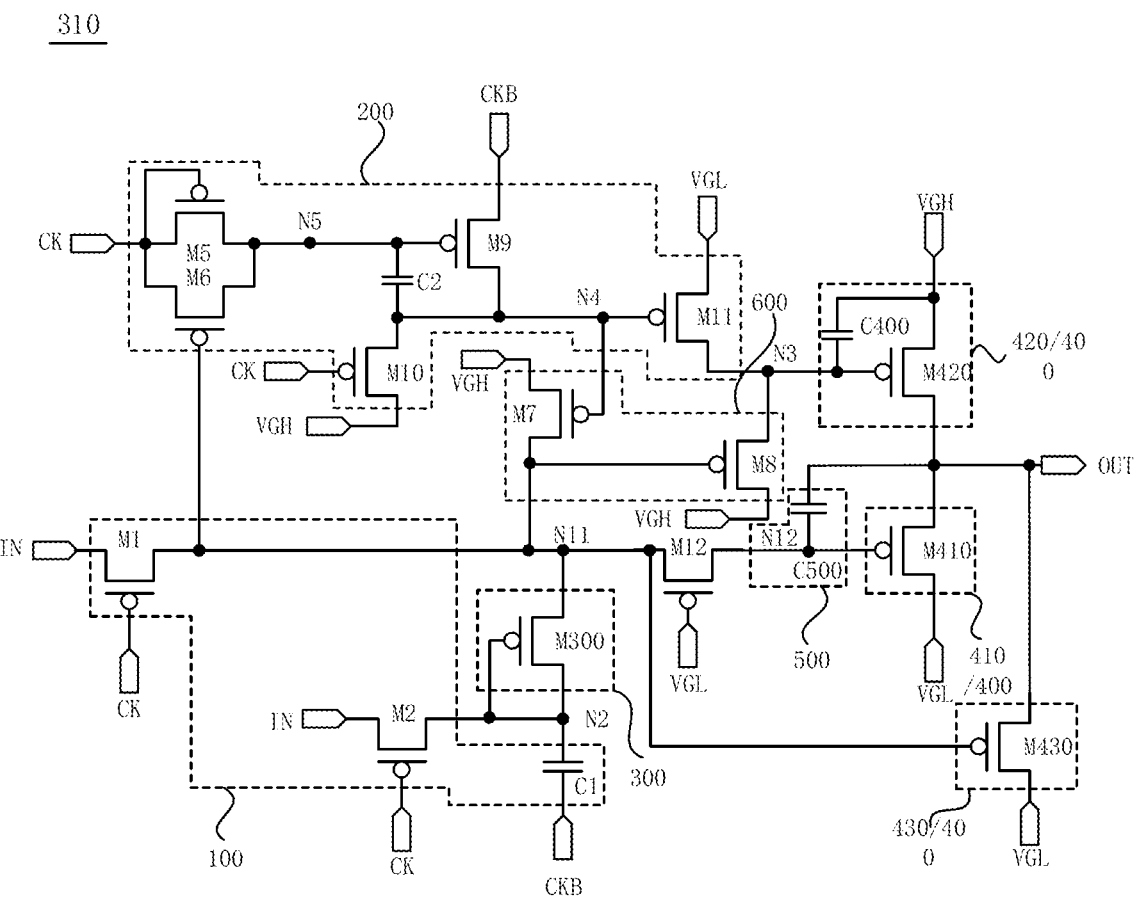
FIG. 22 is a diagram illustrating the structure of another light emission control circuit according to embodiments of the present disclosure.

In an embodiment, FIG. 22 is a diagram illustrating the structure of another light emission control circuit according to embodiments of the present disclosure. As shown in FIG. 22, when the first node N1 includes the first sub-node N11 and the second sub-node N12, the output module 400 may include the first output unit 410, the second output unit 420 and a third output unit 430. The first output unit 410 is electrically connected to the second sub-node N12, the first level terminal VGL and the signal output terminal OUT and is configured to control, according to the first level signal Vgl and the potential of the second sub-node N12, the signal output terminal OUT to output the enable level of the light emission control signal EM. The third output unit 430 is electrically connected to the first sub-node N11, the first level terminal VGL and the signal output terminal OUT and is configured to control, according to the first level signal Vgl and the potential of the first sub-node N11, the signal output terminal OUT to output the enable level of the light emission control signal EM. The second output unit 420 is electrically connected to the third node N3, the second level terminal VGH and the signal output terminal OUT and is configured to control, according to the potential of the third node N3, the signal output terminal OUT to output the disable level of the light emission control signal EM. In this case, the first output unit 410 may control, under the control of the second sub-node N12, the first level signal Vgl of the first level terminal VGL to be transmitted to the signal output terminal OUT, the third output unit 430 may control, under the control of the first sub-node N11, the first level signal Vgl of the first level terminal VGL to be transmitted to the signal output terminal OUT, and the second output unit 430 may control, under the control of the third node N3, the second level signal Vgh of the second level terminal VGH to be transmitted to the signal output terminal OUT. In this manner, after the original potential of the first node N1 is distributed at the first sub-node N11 and the second sub-node N12, the first output unit 410 and the third output unit 430 correspond to the second sub-node N12 and the first sub-node N11 respectively and jointly control the light emission control signal EM output by the signal output terminal OUT to improve the accuracy and the stability of the signal output by the signal output terminal OUT so that the stability of the light emission control circuit can be improved.

In an embodiment, the first output unit 410 may include the first output transistor M410, the second output unit 420 may include the second output transistor M420, and the third output unit 430 may include a third output transistor M430. The gate of the first output transistor M410 is electrically connected to the second sub-node N12, the first electrode of the first output transistor M410 is electrically connected to the first level terminal VGL, and the second electrode of the first output transistor M410 is electrically connected to the signal output terminal OUT. The gate of the second output transistor M420 is electrically connected to the third node N3, the first electrode of the second output transistor M420 is electrically connected to the second level terminal VGH, and the second electrode of the second output transistor M420 is electrically connected to the signal output terminal OUT. The gate of the third output transistor M430 is electrically connected to the first sub-node N11, the first electrode of the third output transistor M430 is electrically connected to the first level terminal VGL, and the second electrode of the third output transistor M430 is electrically connected to the signal output terminal OUT. In this case, the first output transistor M410 may be turned on or turned off under the control of the potential of the second sub-node N12, the third output transistor M430 may be turned on or turned off under the control of the potential of the first sub-node N11, and the second output transistor M420 may be turned on or turned off under the control of the third node N3. In this manner, when the signal output terminal OUT needs to output the enable level of the light emission control signal EM, the potential of the second sub-node N12 and the potential of the first sub-node N11 can control the first output transistor M410 and the third output transistor M430 to be turned on respectively, and when the signal output terminal OUT needs to output the disable level of the light emission control signal EM, the potential of the third node N3 can control the second output transistor M420 to be turned on. It is to be understood that the first output transistor M410, the second output transistor M420 and the third output transistor M430 may be each an n-channel or a p-channel transistor, which may be disposed according to needs and is not limited in the present embodiment of the present disclosure.

It is to be noted that when the first control module 100 and the second control module 200 are electrically connected to the first node, the first control module 100 and the second control module 200 may be electrically connected to the first sub-node N11 or the second sub-node N12; similarly, when the light emission control circuit 310 includes the interlocking module 600, and the first control module 100 and the interlocking module 600 are electrically connected to the first node, the first control module 100 and the interlocking module 600 may also be electrically connected to the first sub-node N11 or the second sub-node N12. In addition, when the light emission control circuit includes the reset module 700, the reset module 700 may be electrically connected to the reset signal terminal RSET, the second level terminal VGH and the first sub-node N11, or may be electrically connected to the reset signal terminal RSET, the second level terminal VGH and the second sub-node N12, or the reset module 700 may include a first reset transistor electrically connected to the first sub-node N11 and a second reset transistor electrically connected to the second sub-node N12 to be able to simultaneously release the potential of the first sub-node N11 and the potential of the second sub-node N12. The connection manners between the other modules and the first sub-node N11 and the second sub-node N12 in the first node N1 are not limited in the present embodiment of the present disclosure on the premise that the core inventive points of the embodiments of the present disclosure can be implemented.

Based on the same inventive concept, embodiments of the present disclosure further provide a display panel. The display panel includes a display region and a non-display region surrounding the display region. The non-display region includes the light emission control circuit provided by any one of the preceding embodiments, so the display panel provided by the embodiments of the present disclosure includes the technical features of the light emission control circuit provided by the embodiments of the present disclosure and can achieve the beneficial effects of the light emission control circuit provided by the embodiments of the present disclosure. Similarities may be referred to the preceding description of the light emission control circuit provided by the embodiments of the present disclosure and are not described here.

Figure 23:
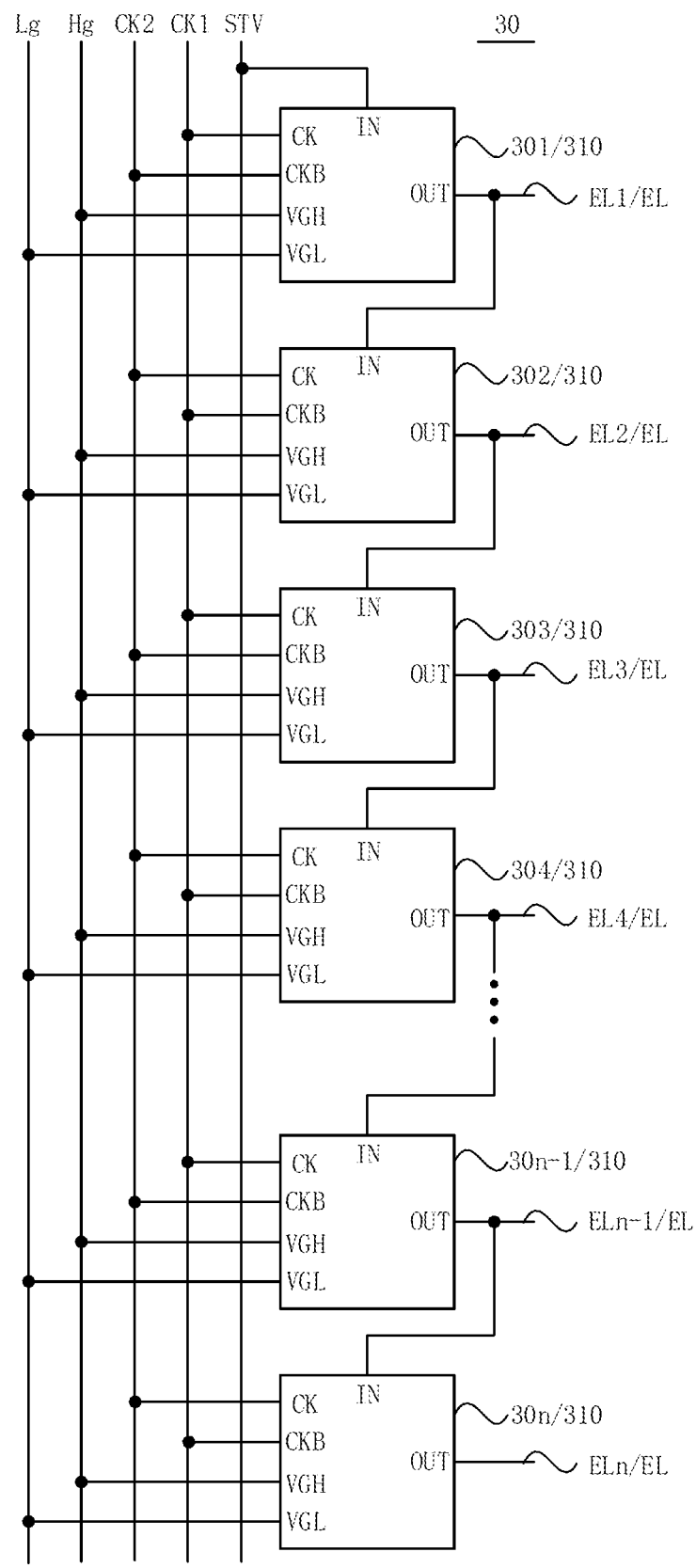
FIG. 23 is a diagram illustrating the structure of a light-emitting driver according to embodiments of the present disclosure.
Figure 24:
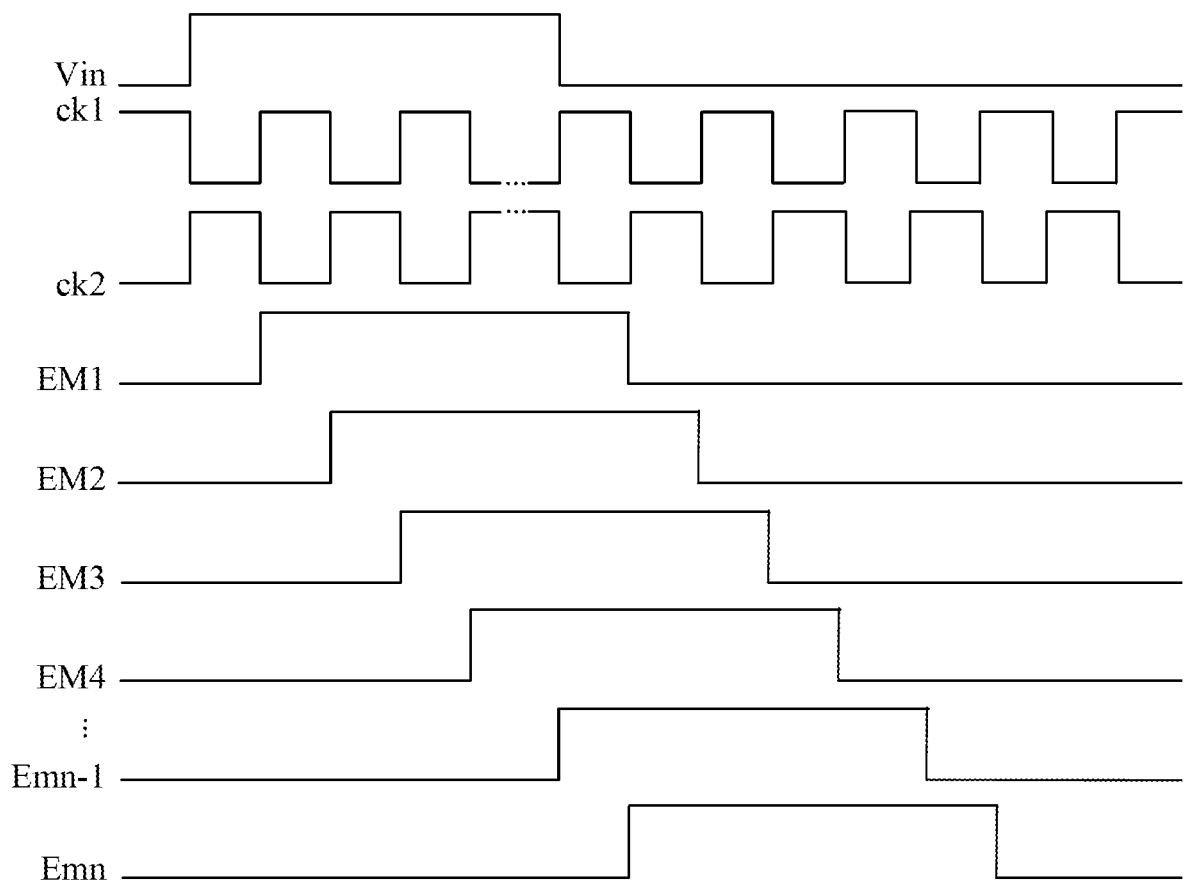
FIG. 24 is a drive timing diagram of a light-emitting driver according to embodiments of the present disclosure.

In an embodiment, FIG. 23 is a diagram illustrating the structure of a light-emitting driver according to embodiments of the present disclosure, and FIG. 24 is a drive timing diagram of a light-emitting driver according to embodiments of the present disclosure. In conjunction with FIG. 1, FIG. 21 and FIG. 22, the display panel 10 includes multiple light emission control circuits 310 cascaded according to any one of the preceding embodiments and multiple pixels P arranged in an array. The multiple light emission control circuits 310 cascaded form the light-emitting driver 30. Among the multiple light emission control circuits 310 cascaded, the signal output terminal OUT of each-stage light emission control circuit 310 is electrically connected to at least part of the same row of the multiple pixels P; other than the last-stage light emission control circuit 310, the signal output terminal OUT of each-stage light emission control circuit 310 is electrically connected to the signal input terminal IN of the next-stage light emission control circuit 310; and the signal input terminal IN of the first-stage light emission control circuit 310 receives a light emission control start pulse signal Vstv.

In an embodiment, that the light-emitting driver 30 includes N light emission control circuits 310 cascaded (301, 302, 303, 304, . . . , 30n−1 and 30n) is used as an example. The signal input terminal IN of the first-stage light emission control circuit 301 is electrically connected to a light emission control start signal line STV that transmits the start pulse signal STV, and the signal input terminal IN of each-stage light emission control circuit from the second-stage light emission control circuit 302 to the nth-stage light emission control circuit 30n is electrically connected to the signal output terminal OUT of the previous-stage light emission control circuit so that the start pulse signal Vstv transmitted by the light emission control start signal line STV can control the starting time and the ending time of the enable level of the light emission control signal EM1 output by the first-stage light emission control circuit 301; and among other stages of light emission control circuits (302, 303, 304, . . . , 30n−1 and 30n), the light emission control signal EM output by the signal output terminal OUT of the previous-stage light emission control circuit controls the starting time and the ending time of the light emission control signal EM (EM2, EM3, EM4, . . . , EMn−1 and EMn) output by each of the other stages of light emission control circuits (302, 303, 304, . . . , 30n−1 and 30n) so that the each-stage light emission control circuit can start to output the enable levels of the light emission control signals EM sequentially and can stop outputting the enable levels of the light emission control signals EM sequentially.

In addition, the each-stage light emission control circuit 310 is further electrically connected to a clock signal line CK1 that transmits the first clock signal ck1, a clock signal line CK2 that transmits the second clock signal ck2, a first level line Lg that transmits the first level signal Vgl and a second level line Hg that transmits the second level signal Vgh. Moreover, to ensure the normal operation of the old number-stage light emission control circuits 310 and the even number-stage light emission circuits 310 and to simplify the structure of the display panel 10, the first clock signals ck1 of the old number-stage light emission control circuits 310 also generally serve as the second clock signals ck2 of the even number-stage light emission control circuits 310, and the second clock signals ck2 of the old number-stage stage light emission control circuits 310 also serve as the first clock signals ck1 of the even number-stage light emission control circuits 310. In this case, among the old number-stage light emission control circuits, the first clock terminals CK are electrically connected to the clock signal line CK1, and the second clock terminals CKB are electrically connected to the clock signal line CK2; and among the even number-stage light emission control circuit 310, the first clock terminals CK are electrically connected to the clock signal line CK2, and the second clock terminals CKB are electrically connected to the clock signal line CK1.

In the present embodiment of the present disclosure, the light emission control circuits cascaded can control the starting time and the ending time of the enable level of the light emission control signal output by the each-stage light emission control circuit to control the each-stage pixel circuit one by one; and when the each-stage light emission control circuit can stably and accurately output the light emission control signal, the each-stage light emission control circuit can control the light-emitting elements electrically connected to the each pixel circuit to stably emit light so that the display quality can be improved.

Figure 25:
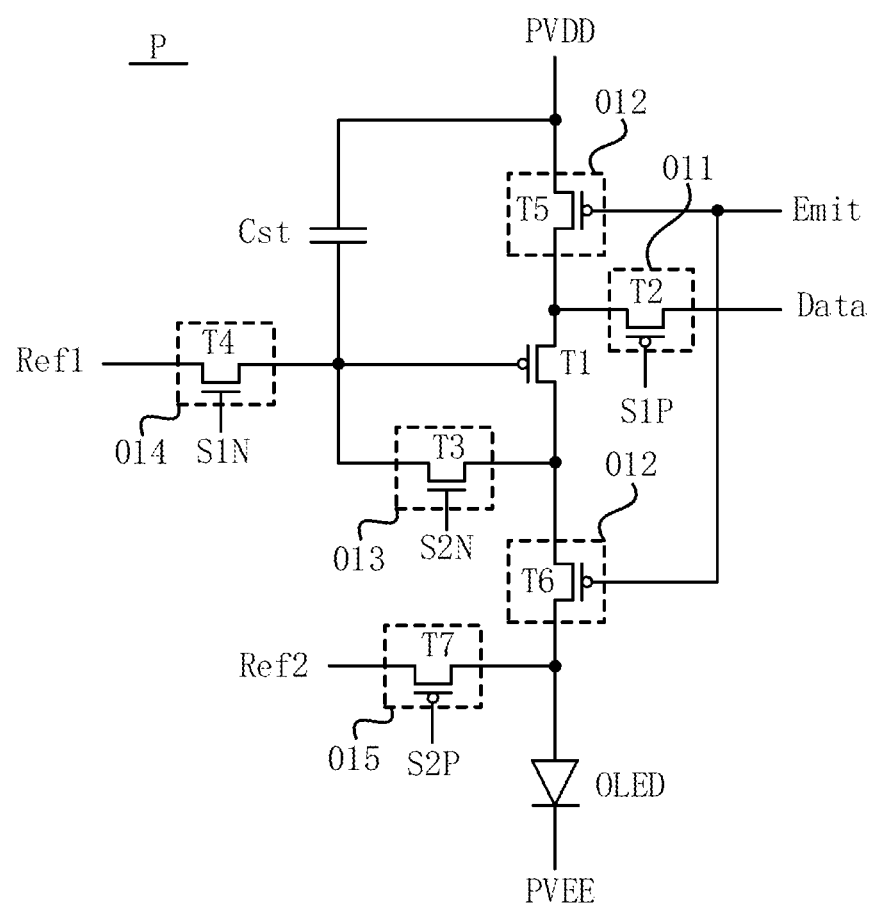
FIG. 25 is a diagram illustrating the structure of a pixel circuit according to embodiments of the present disclosure.

In an embodiment, FIG. 25 is a diagram illustrating the structure of a pixel circuit according to embodiments of the present disclosure. In conjunction with FIG. 1, FIG. 23 and FIG. 25, the display panel 10 further includes multiple light emission control signal lines EL. A light emission control signal line EL is used for transmitting the light emission control signal EM to a corresponding pixel P. The pixel P includes pixel circuits. At least part of the same row of the pixel circuits are electrically connected to the same one light emission control signal line EL, and the signal output terminals OUT of the multiple light emission control circuits 310 cascaded are electrically connected to the multiple light emission control signal lines EL in a one-to-one manner. That is, the signal output terminal OUT of the first-stage light emission control circuit 301 is electrically connected to the light emission control signal line ELL the signal output terminal OUT of the second-stage light emission control circuit 302 is electrically connected to the light emission control signal line EL2, the signal output terminal OUT of the third-stage light emission control circuit 303 is electrically connected to the light emission control signal line EL3, the signal output terminal OUT of the fourth-stage light emission control circuit 304 is electrically connected to the light emission control signal line EL4, . . . , the signal output terminal OUT of the n−1th-stage light emission control circuit 30n−1 is electrically connected to the light emission control signal line ELn−1, and the signal output terminal OUT of the nth-stage light emission control circuit 30n is electrically connected to the light emission control signal line ELn. In this manner, the multiple light emission control circuits 310 cascaded output the enable level of the light emission control signal EM sequentially to control the pixel circuits of rows of the multiple pixels P to sequentially control their light-emitting elements to start to emit light.

In an embodiment, as shown in FIG. 25, the pixel circuit may include a positive power terminal PVDD, a negative power terminal PVEE, a data signal terminal DATA, an initialization signal terminal Ref1, a reset signal terminal Ref2, a light emission control terminal Emit, a first scan terminal S1N, a second scan terminal S1P, a third scan terminal S2N, a fourth scan terminal S2P, a drive transistor T1, a light-emitting element OLED, an initialization module 014, a threshold compensation module 013, a data write module 011, a light emission control module 012 and an anode reset module 015. The initialization module 014 is electrically connected to the first scan terminal S1N, the initialization signal terminal Ref1 and the gate of the drive transistor T1, and a first scan signal S1n of the first scan terminal S1N controls the initialization module 014 to transmit an initialization signal Vref1 of the initialization signal terminal Ref1 to the gate of the drive transistor T1 in the initialization stage so that the gate of the drive transistor T1 can be reset, and the writing of the data signals of the current cycle can be prevented from being affected by the previous drive cycle. The data write module 011 is electrically connected to the second scan terminal S1P, the data signal terminal DATA and the first electrode of the drive transistor T1, and a second scan signal S1p of the second scan terminal S1P controls the data write module 011 to write a data signal Vdata of the data signal terminal DATA to the gate of the drive transistor T1 in the data write stage. The threshold compensation module 013 is electrically connected to the third scan terminal S2N, the second electrode of the drive transistor T1 and the gate of the drive transistor T1, and a third scan signal S2n of the third scan terminal S2N controls the threshold compensation module 013 to compensate the threshold voltage of the drive transistor T1 to the gate of the drive transistor T1 in the data write stage so that the drive current generated by the drive transistor T1 in the light emission stage can be independent of the threshold voltage of the drive transistor T1, and the light emission accuracy of the light-emitting element OLED can be prevented from being affected by the drift of the threshold voltage of the drive transistor T1. The anode reset module 015 is electrically connected to the fourth scan terminal S2P, the reset signal terminal Ref2 and the anode of the light-emitting element OLED, and a fourth scan signal S2p of the fourth scan terminal S2P controls the anode reset module 015 to transmit a reset signal Vref2 of the reset signal terminal Ref2 to the anode of the light-emitting element OLED in the reset stage so that the anode of the light-emitting element OLED can be reset. The light emission control module 012, the drive transistor T1 and the light-emitting element OLED are connected in series between the positive power terminal PVDD and the negative power terminal PVEE, the light emission control module 012 is further electrically connected to the light emission control terminal Emit, and the light emission control signal EM of the light emission control terminal Emit controls the light emission control module 012 to control the positive power terminal PVDD and the negative power terminal PVEE to form a current path in the light emission stage so that the drive transistor T1 can supply the drive current to the light-emitting element OLED according to the potential of the gate of the drive transistor T1 to drive the light-emitting element OLED to emit light.

It is to be understood that before the gate of the drive transistor T1 can be initialized, and on the premise that the anode of the light-emitting element OLED is reset, the initialization signal Vref1 of the initialization signal terminal Ref1 may be the same as or different from the reset signal Vref2 of the reset signal terminal Ref2, which is not limited in the present embodiment of the present disclosure. Moreover, in the present embodiment of the present disclosure, the light emission stage is preceded by the anode reset stage, and in this case, the time of the anode reset stage may overlap the time of the initialization stage, and/or the time of the anode reset stage may also overlap the time of the data write stage, which is not limited in the present embodiment of the present disclosure. For ease of description, the present embodiment of the present disclosure is illustrated by using an example in which the time of the anode reset stage overlaps the time of the data write stage.

In an embodiment, the initialization module 014 may include an initialization transistor T4. The gate of the initialization transistor T4 is electrically connected to the first scan terminal S1N, the first electrode of the initialization transistor T4 is electrically connected to the initialization signal terminal Ref1, and the second electrode of the initialization transistor T4 is electrically connected to the gate of the drive transistor T1. The first scan signal S1n of the first scan terminal S1N can control the initialization transistor T4 to be turned on or turned off and controls the initialization transistor T4 to be turned on in the initialization stage and to be turned off in other stages, and when the initialization transistor T4 is turned off, the leakage current of the initialization transistor T4 should be as small as possible to ensure the stability of the potential of the gate of the drive transistor T1. In this case, the active layer of the initialization transistor T4 may be a metal-oxide semiconductor having a smaller mobility, and the active layer including a metal-oxide semiconductor generally has an n-type channel so that the initialization transistor T4 can be an n-channel transistor.

In an embodiment, the data write module 011 may include a data write transistor T2. The gate of the data write transistor T2 is electrically connected to the second scan terminal S1P, the first electrode of the data write transistor T2 is electrically connected to the data signal terminal DATA, and the second electrode of the data write transistor T2 is electrically connected to the first electrode of the drive transistor T1. The second scan signal S1p of the second scan terminal SP can control the data write transistor T2 to be turned on or turned off and controls the data write transistor T2 to be turned on in the data write stage and to be turned off in other stages. To reduce power consumption, the active layer of the data write transistor T2 and the active layer of the drive transistor T1 may both include low-temperature polycrystalline silicon, and the active layer including low-temperature polycrystalline silicon generally has a p-type channel so that the data write transistor T2 and the drive transistor T1 can be each a p-channel transistor.

In an embodiment, the threshold compensation module 013 may include a threshold compensation transistor T3. The gate of the threshold compensation transistor T3 is electrically connected to the third scan terminal S2N, the first electrode of the threshold compensation transistor T3 is electrically connected to the second electrode of the drive transistor, and the second electrode of the threshold compensation transistor T3 is electrically connected to the gate of the drive transistor T1. The third scan signal S2n of the third scan terminal S2N can control the threshold compensation transistor T3 to be turned on or turned off and controls the threshold compensation transistor T3 to be turned on in the data write stage and to be turned off in other stages, and to make the threshold compensation transistor T3 have a smaller leakage current when the threshold compensation transistor T3 is turned off, the threshold compensation transistor T3 can also be an n-channel transistor.

In an embodiment, the anode reset module 015 may include an anode reset transistor T7. The gate of the anode reset transistor T7 is electrically connected to the fourth scan terminal S2P, the first electrode of the anode reset transistor T7 is electrically connected to the reset signal terminal Ref2, and the second electrode of the anode reset transistor T7 is electrically connected to the anode of the light-emitting element OLED. The fourth scan signal S2p of the fourth scan terminal S2P can control the anode reset transistor T7 to be turned on or turned off and controls the anode reset transistor T7 to be turned on in the anode reset stage and to be turned off in other stages. Similarly, to reduce power consumption, the anode reset transistor T7 may be a p-channel transistor. In this case, when the channel type of the anode reset transistor T7 is the same as the channel type of the data write transistor T2, the second scan terminal SP may also serve as the fourth scan terminal S1N.

In an embodiment, the light emission control module 012 may include a first light emission control transistor T5 and a second light emission control transistor T6. The gate of the first light emission control transistor T5 and the gate of the second light emission control transistor T6 are both electrically connected to the light emission control terminal Emit, the first electrode of the first light emission control transistor T5 is electrically connected to the positive power terminal PVDD, the second electrode of the first light emission control transistor T5 is electrically connected to the first electrode of the drive transistor T1, the first electrode of the second light emission control transistor T6 is electrically connected to the second electrode of the drive transistor T1, and the second electrode of the second light emission control transistor T6 is electrically connected to the anode of the light-emitting element OLED. The light emission control signal EM of the light emission control terminal Emit can control the first light emission control transistor T5 and the second light emission control transistor T6 to be turned on or turned off and controls the first light emission control transistor T5 and the second light emission control transistor T6 to be turned on in the light emission stage and to be turned off in other stages. Similarly, to reduce power consumption, the first light emission control transistor T5 and the second light emission control transistor T6 may be each a p-channel transistor.

In an embodiment, the pixel circuit further includes a storage capacitor Cst. The storage capacitor Cst is connected between the positive power terminal PVDD and the gate of the drive transistor T1 and is configured to store the potential of the gate of the drive transistor T1 so that the drive transistor T1 can continuously supply the drive current to the light-emitting element OLED to drive the light-emitting element to emit light in the light emission stage.

Figure 26:
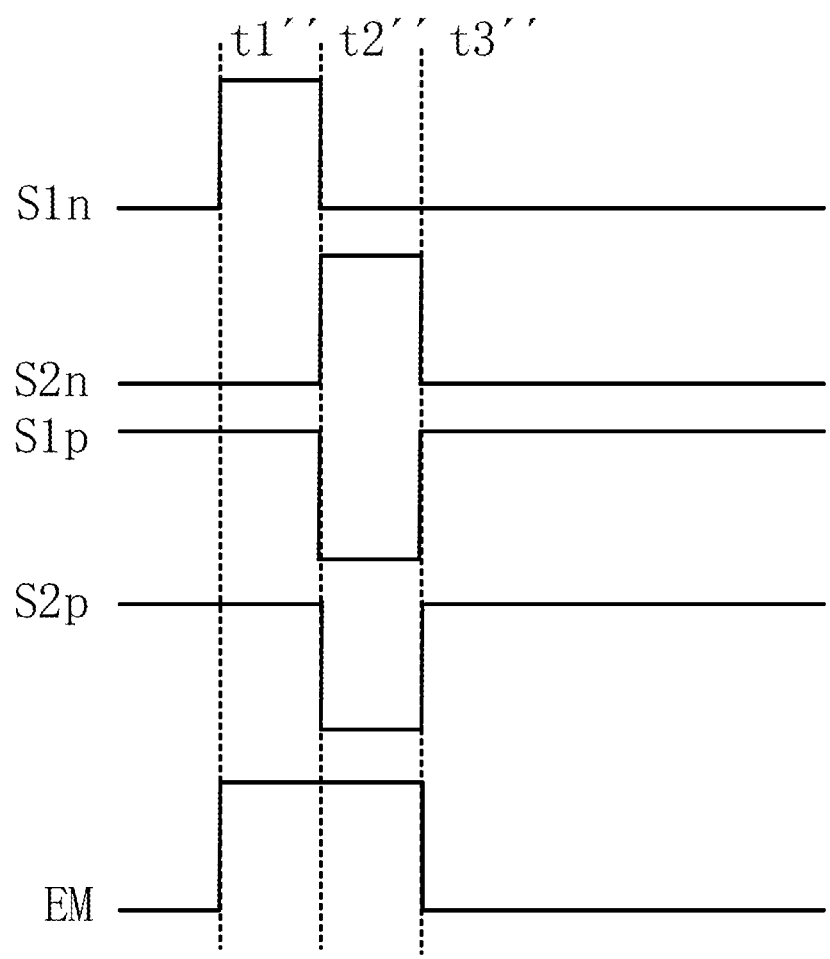
FIG. 26 is a drive timing diagram of the pixel circuit corresponding to FIG. 25.

In an embodiment, FIG. 26 is a drive timing diagram of the pixel circuit corresponding to FIG. 25. In conjunction with FIG. 25 and FIG. 26, in the initialization stage t1", the first scan signal S1n controls the initialization transistor T4 to be turned on to transmit the initialization signal Vref1 to the gate of the drive transistor T1, and then the gate of the drive transistor T1 and the storage capacitor Cst are initialized; in the data write stage t2", the second scan signal S1p controls the data write transistor T2 to be turned on, and the third scan signal S2n controls the threshold compensation transistor T3 to be turned on, so the data signal Vdata is transmitted to the gate of the drive transistor T1 through the data write transistor T2, the drive transistor T1 and the threshold compensation transistor T3 sequentially, and the threshold voltage VTH of the drive transistor T1 is compensated to the gate of the drive transistor T1 simultaneously so that the potential of the gate of the drive transistor T1 can be Vdata+Vth; moreover, the data write stage t2" is also the anode reset stage, and the fourth scan signal S2p controls the anode reset transistor T7 to be turned on to transmit the reset signal Vref2 to the anode of the light-emitting element OLED, and then the anode of the light-emitting element OLED is reset; and in the light emission stage t3", the light emission control signal EM controls the first light emission control transistor T5 and the second light emission control transistor T6 to be turned on, and the drive current Id supplied by the drive transistor T1 according to the potential Vdata+VTH of the gate of the drive transistor T1 is k (Vgs−|VTH|), and since the difference Vgs between the voltage of the gate of the drive transistor T1 and the voltage of the first electrode of the drive transistor T1 is (Vdata+VTH)−PVDD, the drive transistor T1 is a p-channel transistor, and the threshold voltage VTH of the drive transistor T1 is a negative value, the drive current Id supplied by the drive transistor T1 is k*(PVDD−Vdata)$^2$, where k is a coefficient related to the material and the size of the drive transistor T1. In this manner, the drive current supplied by the drive transistor T1 to the light-emitting element OLED is independent of the threshold voltage VTH of the drive transistor T1 so that the light-emitting element OLED can accurately emit light.

It is to be noted that FIG. 25 is only an exemplary diagram illustrating the structure of the pixel circuit according to embodiments of the present disclosure. On the premise that the core inventive points of the embodiments of the present disclosure can be implemented, the specific structure of the pixel circuit is not limited in the present embodiment of the present disclosure. For ease of description, the technical solutions in the embodiments of the present disclosure are illustrated by using the example of the structure of the pixel circuit of FIG. 25.

Figure 27:
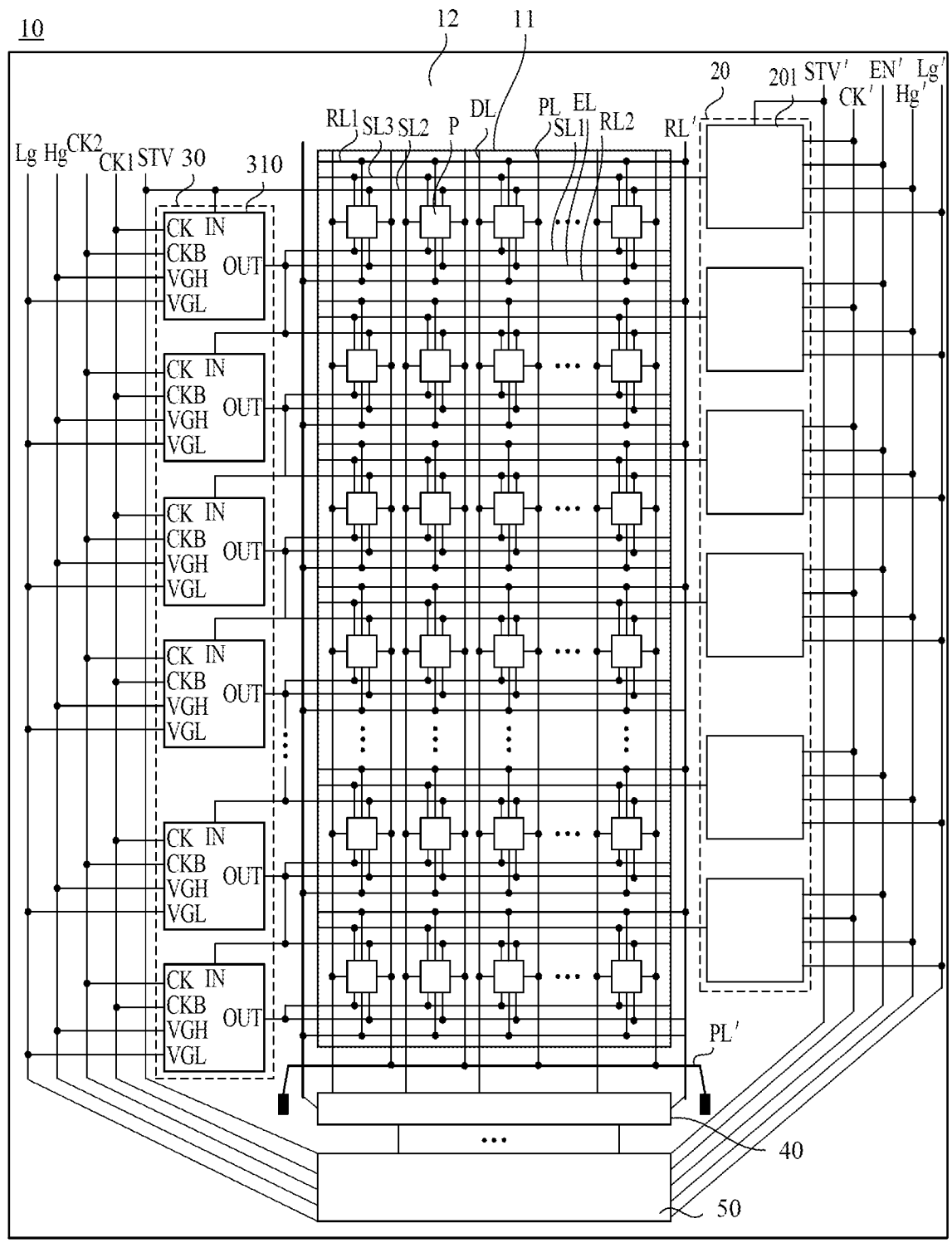
FIG. 27 is a diagram illustrating the structure of another display panel according to embodiments of the present disclosure.

In an optional embodiment, FIG. 27 is a diagram illustrating the structure of another display panel according to embodiments of the present disclosure. In conjunction with FIG. 27 and FIG. 25, the display panel 10 may include the multiple light emission control signal lines EL; when the pixel circuit includes the data signal terminal DATA, the drive transistor T1, the light-emitting element OLED, the light emission control module 012 and the data write module 011, the data write module 011 is configured to write the data signal Vdata of the data signal terminal DATA to the gate of the drive transistor T1, the drive transistor T1 is configured to generate the drive current according to the potential of the gate of the drive transistor T1, and the light emission control module 012 is configured to control the drive transistor T1 to supply the drive current to the light-emitting element OLED, the light emission control module 012 may include at least one light emission control transistor, for example, including two light emission control transistors (the first light emission control transistor T5 and the second light emission control transistor T6); and in this case, the gates of light emission control transistors (T5 and T6) of the at least part of the same row of the pixel circuits are electrically connected to the same one light emission control signal line EL; and the signal output terminals OUT of the multiple light emission control circuits 310 cascaded are electrically connected to the multiple light emission control signal lines EL in a one-to-one manner. In this manner, the multiple light emission control circuits 310 cascaded can supply the light emission control signal EMs to the light emission control terminals Emit of the rows of the pixel circuits through the multiple light emission control signal lines EL to control the light emission control transistors (T5 and T6) of the rows of the pixel circuits to be turned on or turned off.

In an embodiment, in continued conjunction with FIG. 27 and FIG. 25, the display panel 10 may further include multiple first scan signal lines SL1; when the pixel circuit includes the threshold compensation module 013, and the threshold compensation module 013 is configured to compensate the threshold voltage of the drive transistor T1 to the gate of the drive transistor T1, the threshold compensation module 013 may include the threshold compensation transistor T3, and the channel type of the threshold compensation transistor T3 may be different from the channel type of the light emission control transistors (T5 and T6); and in this case, the gates of threshold compensation transistors T3 of the at least part of the same row of the pixel circuits are electrically connected to the same one first scan signal line SL1, and the signal output terminals OUT of the multiple light emission control circuits 310 cascaded are electrically connected to the multiple first scan signal lines SL1 in a one-to-one manner. In this manner, the light emission control signals EM output by the signal output terminals OUT of the light emission control circuits 310 cascaded can also supply the third scan signals S2n to the third scan terminals S2N of the rows of the pixel circuits through the multiple first scan signal lines SL1 to control the threshold compensation transistors T3 of the rows of the pixel circuits to be turned on or turned off so that the light emission control signals EM supplied to the pixel circuits can also serve as the third scan signals S2n of the pixel circuits. In this manner, no additional scan circuit needs to be disposed to supply the third scan signal S2n so that the structure of the display panel 10 can be simplified, and the narrow bezel of the display panel 10 can be facilitated.

In an embodiment, in continued conjunction with FIG. 27 and FIG. 25, the display panel 10 may further include multiple second scan signal lines SL2; when the pixel circuit includes the initialization module 014 and the initialization signal terminal Ref1, and the initialization module 014 is configured to control the initialization signal Vref1 of the initialization signal terminal Ref1 to initialize the gate of the drive transistor T1, the initialization module 014 may include the initialization transistor T4, and the channel type of the initialization transistor T4 is different from the channel type of the light emission control transistors (T5 and T6); and in this case, the gates of initialization transistors T4 of the at least part of the same row of the pixel circuits are electrically connected to the same one second scan signal line SL2, and the signal output terminals OUT of the multiple light emission control circuits 310 cascaded are electrically connected to the multiple second scan signal lines SL2 in a one-to-one manner. In this manner, the light emission control signals EM output by the signal output terminals OUT of the multiple light emission control circuits 310 cascaded can further supply the first scan signals S1$n$ to the first scan terminals S1N of the rows of the pixel circuits through the multiple scan signal lines SL2 to control the initialization transistors T4 of the rows of the pixel circuits to be turned on or turned off so that the light emission control signals EM supplied to the pixel circuits can also serve as the first scan signals S1$n$. In this manner, no additional scan circuit needs to be disposed to supply the first scan signal S1$n$ so that the structure of the display panel 10 can be simplified, and the narrow bezel of the display panel 10 can be facilitated.

Between a first scan signal line SL1 and a second scan signal line SL2 that are electrically connected to the same one pixel circuit, the first scan signal line SL1 is electrically connected to the current-stage light emission control circuit 310, and the second scan signal line SL2 is electrically connected to the previous-stage light emission control circuit 310.

Figure 28:
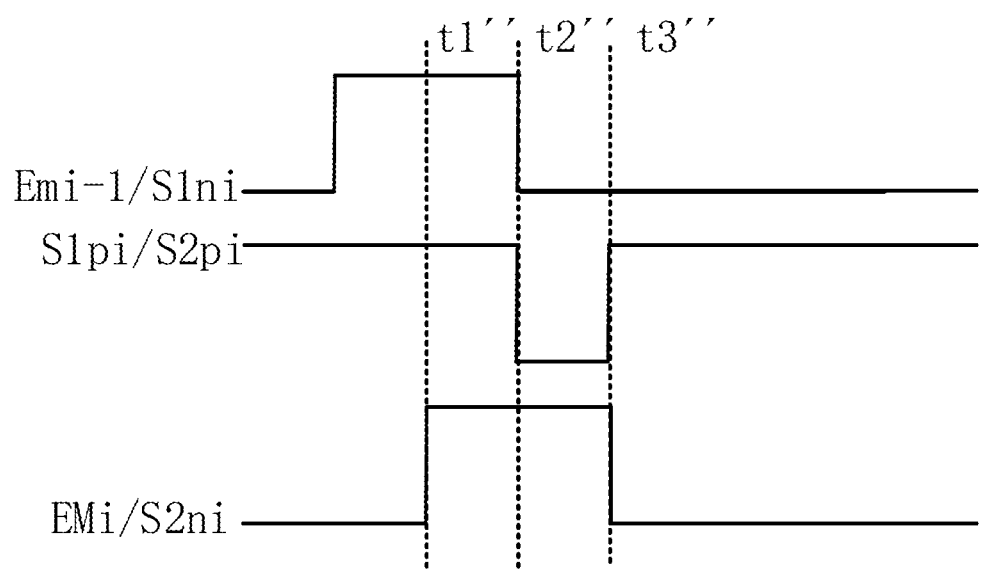
FIG. 28 is another drive timing diagram of the pixel circuit corresponding to FIG. 25.

In an embodiment, FIG. 28 is another drive timing diagram of the pixel circuit corresponding to FIG. 25. In conjunction with FIG. 28 and FIG. 25, the operation process of the ith row of the pixel circuits is described below using an example in which the threshold compensation transistor T3 and the initialization transistor T4 are each an n-channel transistor, and other transistors are each a p-channel transistor.

When the ith row of the pixel circuits is in the initialization stage t1", the i−1th row of the pixel circuits is in the data write stage, and at this time, the gates of the light emission control transistors (T5 and T6) of the i−1th row of the pixel circuits should receive the disable level of the light emission control signal EMi−1, that is, the light emission control signal EMi−1 is at a high level, and when the light emission control signal EMi−1 is transmitted to the gates of the initialization transistors T4 of the ith row of the pixel circuits through the corresponding second scan signal line SL2, the initialization transistors T4 of the ith row of the pixel circuits are turned on so that the initialization signal Vref1 of the initialization signal terminal Ref1 can be transmitted to the gates of the drive transistors T1 of the ith row of the pixel circuits, and then the gates of the drive transistors T1 of the ith row of the pixel circuits can be initialized; moreover, the light emission control signal EMi received by the gates of the light emission control transistors (T5 and T6) of the ith row of the pixel circuits is also at a high level, and the light emission control transistors (T5 and T6) of the ith row of the pixel circuits are also turned off, so when the light emission control signal EMi is transmitted to the threshold compensation transistors T3 of the ith-row of the pixel circuits through the corresponding first scan signal line SL1, the threshold compensation transistors T3 of the ith row of the pixel circuits are turned on; however, since the second scan signal S1$pi$ received by the gates of the data write transistors T2 of the ith row of the pixel circuits controls the data write transistors T2 to be turned off, the data signal Vdata of the data signal terminals DATA of the ith row of the pixel circuits cannot be transmitted to the gates of the drive transistors T1 of the ith row of the pixel circuits.

When the ith row of the pixel circuits is in the data write stage t2", the i−1th row of the pixel circuits may enter the light emission stage, and the light emission control signal EMi−1 received by the gates of the light emission control transistors (T5 and T6) of the i−1th row of the pixel circuits becomes at a low level, so the light emission control transistors (T5 and T6) of the i−1th row of the pixel circuits are turned on, and the initialization transistors T4 of the ith row of the pixel circuits are turned off; and the light emission control signal EMi received by the gates of the light emission control transistors (T5 and T6) of the ith row of the pixel circuits is still kept at a high level, so the threshold compensation transistors T3 of the ith row of the pixel circuits are kept to be turned on while the second scan signal S1$pi$ received by the gates of the data write transistors T2 of the ith row of the pixel circuits becomes at a low level so that the data write transistors T2 of the ith row of the pixel circuits can also be turned on, the data signal Vdata of the data signal terminals DATA of the ith row of the pixel circuits can be transmitted to the gates of the drive transistors T1 of the ith row of the pixel circuits through the data write transistors T2, the drive transistors T1 and the threshold compensation transistors T3 of the ith row of the pixel circuits sequentially, and the threshold voltages of the drive transistors T1 can be compensated to the gates of the drive transistors T1.

When the ith row of the pixel circuits is in the stage t3", the light emission control signal EMi received by the gates of the light emission control transistors (T5 and T6) of the ith row of the pixel circuits becomes at a low level, so the light emission control transistors (T5 and T6) of the ith row of the pixel circuits are turned on, the threshold compensation transistors T3 of the ith row of the pixel circuits are turned off, and the drive transistors T1 of the ith row of the pixel circuits supply the drive currents to the light-emitting elements OLED of the ith row of the pixel circuits according to the potentials of the gates of the drive transistors T1 to drive the light-emitting elements OLED to emit light.

In this manner, the light emission control signal EMi supplied to the ith row of the pixel circuits also serves as the third scan signal S2$ni$ of the ith row of the pixel circuits, and the light emission control signal EMi−1 supplied to the i−1th row of the pixel circuits also serves as the first scan signal S1$ni$ of the ith row of the pixel circuits so that the structure of the display panel 10 can be simplified, and the narrow bezel of the display panel 10 can be facilitated on the premise that the pixel circuits can be controlled to operate normally.

In addition, the scan driver 20 of the display panel 10 may include multiple scan drive circuits 201 cascaded. Among the multiple scan drive circuits 201 cascaded, each-stage scan drive circuit 201 receives a scan timing control signal transmitted by a corresponding timing control signal line (STV', CK', EN', Hg' and Lg') and sequentially outputs the enable level of the second scan signal S1$p$ under the control of a corresponding scan timing control signal. In this case, the display panel 10 should further include multiple third scan signal lines SL3. The second scan terminals S1$p$ of the at least part of the same row of the pixel circuits are electrically connected to the same one third scan signal line SL3; the scan output terminals of the multiple scan drive circuits 201 cascaded are electrically connected to the multiple third scan signal lines SL3 in a one-to-one manner so that the second scan signal S1$p$ can be supplied to the multiple third scan signal lines SL3 to control the data write transistors T2 of the rows of the pixel circuits to be turned on or turned off.

The display panel 10 may further include an initialization signal bus RL for transmission of the initialization signal Vref1 and multiple initialization signal lines RL1, and the at least part of the same row of the pixel circuits are electrically connected to the same one initialization signal line RL1 so that the initialization signal Vref1 supplied by the data driver 40 can be transmitted to the initialization signal terminals Ref1 of the rows of the pixel circuits through the initialization signal bus RL and the multiple initialization signal lines RL1 sequentially. The display panel 10 further includes a reset signal bus RL' for transmission of the reset signal Vref2 and multiple reset signal lines RL2, and the at least part of the same row of the pixel circuits are electrically connected to the same one reset signal line RL2 so that the reset signal Vref2 supplied by the data driver 40 can be transmitted to the reset signal terminals Ref2 of the rows of the pixel circuits through the reset signal bus RL' and the multiple reset signal lines RL2 sequentially. The display panel 10 further includes multiple data signal lines DL, a positive power terminal, a power bus PL' and multiple positive power signal lines PL, and at least part of the same column of the pixel circuits share the same one data signal line DL and the same one positive power signal line PL so that the data signal Vdata supplied by the data driver 40 can be transmitted to the data signal terminals DATA of the pixel circuits through the multiple data signal lines DL in a one-to-one manner, and the positive power signal PVDD of the positive power terminal can be supplied to the pixel circuits through the power bus PL' and the multiple positive power signal lines PL sequentially. The display panel 10 may further include a negative power terminal and a negative power bus (not shown in the figure), and the negative power signal PVEE of the negative power terminal is transmitted to the cathodes of the light-emitting elements of the pixel circuits through the negative power bus so that among the pixel circuits, a current path can be formed from the positive power terminal PVDD to the negative power terminal PVEE.

It is to be understood that other structures may further be included in the display panel, for example, touch control or fingerprint identification, to diversify the functions of the display panel and are not limited in the present embodiment of the present disclosure on the premise that the core inventive points of the present disclosure can be implemented.

Figure 29:
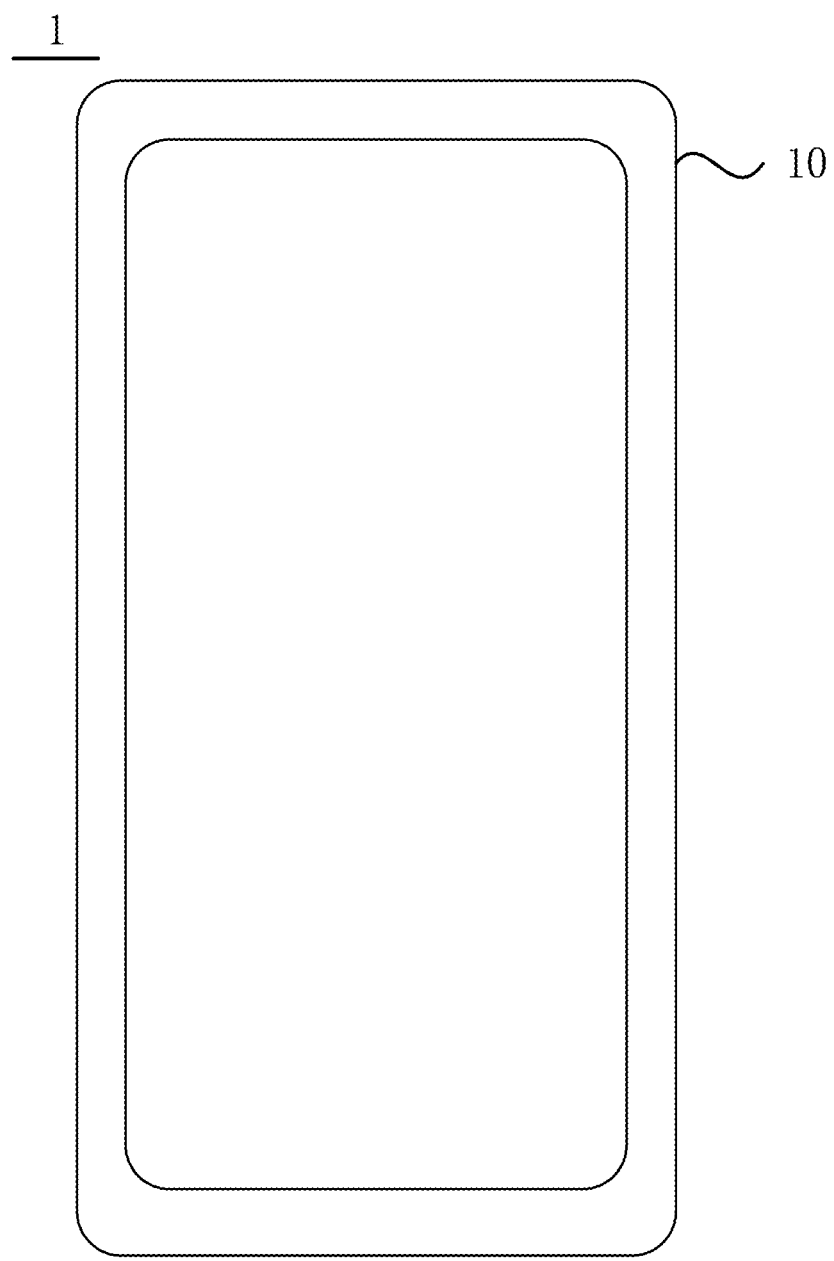
FIG. 29 is a diagram illustrating the structure of a display device according to embodiments of the present disclosure.

Based on the same inventive concept, embodiments of the present disclosure further provide a display device. FIG. 29 is a diagram illustrating the structure of a display device according to embodiments of the present disclosure. As shown in FIG. 29, the display device 1 includes the display panel 10 provided by any one of the embodiments of the present disclosure, so the display device 1 provided by the embodiments of the present disclosure includes the technical features of the display panel 10 provided by the embodiments of the present disclosure and can achieve the beneficial effects of the display panel 10 provided by the embodiments of the present disclosure. Similarities may be referred to the preceding description of the display panel 10 provided by the embodiments of the present disclosure and are not described here. The display device 1 provided by the present embodiment of the present disclosure may be the phone as shown in FIG. 28, or may be any electronic product having a display function, including, but not limited to, a television, a laptop, a desktop display, a tablet computer, a digital camera, a smart bracelet, a smart glass, a vehicle-mounted display, medical equipment, industrial control equipment, and a touch interactive terminal. No special limitations are made thereto in embodiments of the present disclosure.

It is to be noted that the preceding are only preferred embodiments of the present disclosure and the technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A light emission control circuit, comprising a filtering module, a first control module, a second control module and an output module, wherein
the first control module is electrically connected to a signal input terminal, a first clock terminal and a second clock terminal; the first control module and the output module are electrically connected to a first node; the first control module and the filtering module are electrically connected to a second node; and the first control module is configured to control a potential of the first node and a potential of the second node separately according to an input signal of the signal input terminal, a first clock signal of the first clock terminal and a second clock signal of the second clock terminal;
the second control module is electrically connected to the first clock terminal, the second clock terminal, a first level terminal, a second level terminal and the first control module; the second control module and the output module are electrically connected to a third node; and the second control module is configured to control a potential of the third node under control of the first control module, the first clock signal, the second clock signal, a first level signal of the first level terminal and a second level signal of the second level terminal;
the output module is further electrically connected to the first level terminal, the second level terminal and a signal output terminal; and the output module is configured to control, according to the first level signal and the potential of the first node, the signal output terminal to output an enable level of a light emission control signal and control, according to the second level signal of the second level terminal and the potential of the third node, the signal output terminal to output a disable level of the light emission control signal, wherein the enable level and the disable level of the light emission control signal are output time-divisionally; and
the filtering module is further electrically connected to the first node and has a uni-directional conduction property.

2. The light emission control circuit according to claim 1, wherein the filtering module comprises a filtering transistor, wherein the filtering transistor is electrically connected between the first node and the second node, and a gate of the filtering transistor is electrically connected to a source of the filtering transistor.

3. The light emission control circuit according to claim 1, wherein the first control module comprises a first node control unit, a second node control unit and a charge pump unit, wherein
the first node control unit is electrically connected to the signal input terminal, the first clock terminal and the first node and is configured to control the potential of the first node according to the input signal and the first clock signal;
the second node control unit is electrically connected to the first clock terminal and the second node, and the second node control unit is configured to control the potential of the second node according to the first clock signal; and
the charge pump unit is electrically connected to the second node and the second clock terminal, and the charge pump unit is configured to control an amount of signals coupled to the second node by the second clock terminal.

4. The light emission control circuit according to claim 3, wherein the first node control unit comprises a first transistor, wherein a gate of the first transistor is electrically connected to the first clock terminal, a first electrode of the first transistor is electrically connected to the signal input terminal, and a second electrode of the first transistor is electrically connected to the first node; and
wherein the first transistor comprises a first sub-transistor and a second sub-transistor, a first electrode of the first sub-transistor is electrically connected to the signal input terminal, a second electrode of the first sub-transistor is electrically connected to a first electrode of the second sub-transistor, a second electrode of the second sub-transistor is electrically connected to the first node, and a gate of the first sub-transistor and a gate of the second sub-transistor are both electrically connected to the first clock terminal.

5. The light emission control circuit according to claim 3, wherein the second node control unit is further electrically connected to the signal input terminal and is configured to supply the input signal to the second node according to the first clock signal; and
the second node control unit comprises a second transistor, wherein a gate of the second transistor is electrically connected to the first clock terminal, a first electrode of the second transistor is electrically connected to the signal input terminal, and a second electrode of the second transistor is electrically connected to the second node; and
wherein the second transistor comprises a third sub-transistor and a fourth sub-transistor,
a first electrode of the third sub-transistor is electrically connected to the signal input terminal, a second electrode of the third sub-transistor is electrically connected to a first electrode of the fourth sub-transistor, a second electrode of the fourth sub-transistor is electrically connected to the second node, and a gate of the third sub-transistor and a gate of the fourth sub-transistor are both electrically connected to the first clock terminal.

6. The light emission control circuit according to claim 3, wherein the second node control unit is further electrically connected to the first level terminal and the first node and is configured to supply the first level signal to the second node according to the first clock signal and the potential of the first node; and
wherein the second node control unit comprises a third transistor and a fourth transistor,
a first electrode of the third transistor is electrically connected to the first level terminal, a second electrode of the third transistor is electrically connected to a first electrode of the fourth transistor, a second electrode of the fourth transistor is electrically connected to the second node, a gate of the third transistor is electrically connected to the first node, and a gate of the fourth transistor is electrically connected to the first clock terminal.

7. The light emission control circuit according to claim 3, wherein the charge pump unit comprises a first capacitor, wherein a first electrode of the first capacitor is electrically connected to the second clock terminal, and a second electrode of the first capacitor is electrically connected to the second node.

8. The light emission control circuit according to claim 1, wherein the second control module comprises a third node control unit, a fourth node control unit and a fifth node control unit, wherein
the third node control unit is electrically connected to the third node and the first level terminal; the third node control unit and the fourth node control unit are electrically connected to a fourth node; and the third node control unit is configured to control the potential of the third node according to a potential of the fourth node and the first level signal;
the fourth node control unit is electrically connected to the second clock terminal, the second level terminal and the first clock terminal; the fourth node control unit and the fifth node control unit are electrically connected to a fifth node; and the fourth node control unit is configured to control the potential of the fourth node according to a potential of the fifth node, the second clock signal, the first clock signal and the second level signal; and
the fifth node control unit is electrically connected to the first control module and the first clock terminal and is configured to control the potential of the fifth node under control of the first control module and the first clock signal.

9. The light emission control circuit according to claim 8, wherein the fifth node control unit comprises a fifth transistor and a sixth transistor, wherein
a gate of the fifth transistor and a first electrode of the fifth transistor are both electrically connected to the first clock terminal, and a second electrode of the fifth transistor is electrically connected to the fifth node; and
a gate of the sixth transistor is electrically connected to the first control module, a first electrode of the sixth transistor is electrically connected to the first clock terminal, and a second electrode of the sixth transistor is electrically connected to the fifth node;
wherein the fifth transistor comprises a fifth sub-transistor and a sixth sub-transistor, wherein a first electrode of the fifth sub-transistor, a gate of the fifth sub-transistor and a gate of the sixth sub-transistor are all electrically connected to the first clock terminal, a second electrode of the fifth sub-transistor is electrically connected to a first electrode of the sixth sub-transistor, and a second electrode of the sixth sub-transistor is electrically connected to the fifth node; and
wherein the sixth transistor comprises a seventh sub-transistor and an eighth sub-transistor,
a first electrode of the seventh sub-transistor is electrically connected to the first clock terminal, a second electrode of the seventh sub-transistor is electrically connected to a first electrode of the eighth sub-transistor, a second electrode of the eighth sub-transistor is electrically connected to the fifth node, and a gate of the seventh sub-transistor and a gate of the eighth sub-transistor are both electrically connected to the first control module.

10. The light emission control circuit according to claim 1, wherein the first control module and the second control module are electrically connected to one of the first node or the second node.

11. The light emission control circuit according to claim 1, further comprising a bootstrap module, wherein
the bootstrap module is electrically connected between the signal output terminal and the first node; and
the bootstrap module comprises a bootstrap capacitor, wherein a first electrode of the bootstrap capacitor is electrically connected to the signal output terminal, and a second electrode of the bootstrap capacitor is electrically connected to the first node.

12. The light emission control circuit according to claim 1, further comprising an interlocking module, wherein
the interlocking module is electrically connected to the first node, the third node, the second level terminal and the second control module and is configured to control, under control of the second control module, the second level signal to be transmitted to the first node and control, under control of the potential of the first node, the second level signal to be transmitted to the third node; and
wherein the interlocking module comprises a seventh transistor and an eighth transistor,
a gate of the seventh transistor is electrically connected to the second control module, a first electrode of the seventh transistor is electrically connected to the second level terminal, and a second electrode of the seventh transistor is electrically connected to the first node; and
a gate of the eighth transistor is electrically connected to the first node, a first electrode of the eighth transistor is electrically connected to the second level terminal, and a second electrode of the eighth transistor is electrically connected to the third node.

13. The light emission control circuit according to claim 1, further comprising an interlocking module, wherein
the interlocking module is electrically connected to the second node, the third node, the second level terminal and the second control module; and
the interlocking module is configured to control, under control of the second control module, the second level signal to be transmitted to the second node and control, under control of the potential of the second node, the second level signal to be transmitted to the third node;
wherein the interlocking module comprises a seventh transistor and an eighth transistor,
a gate of the seventh transistor is electrically connected to the second control module, a first electrode of the seventh transistor is electrically connected to the second level terminal, and a second electrode of the seventh transistor is electrically connected to the second node; and
a gate of the eighth transistor is electrically connected to the second node, a first electrode of the eighth transistor is electrically connected to the second level terminal, and a second electrode of the eighth transistor is electrically connected to the third node.

14. The light emission control circuit according to claim 1, wherein the reset module comprises a reset transistor, wherein a gate of the reset transistor is electrically connected to the reset signal terminal, a first electrode of the reset transistor is electrically connected to the second level terminal, and a second electrode of the reset transistor is electrically connected to the first node.

15. The light emission control circuit according to claim 1, further comprising a voltage regulation transistor, wherein
the first node comprises a first sub-node and a second sub-node; and a first electrode of the voltage regulation transistor and the first control module are electrically connected to the first sub-node, a second electrode of the voltage regulation transistor and the output module are electrically connected to the second sub-node, a gate of the voltage regulation transistor is electrically connected to the first level terminal, and the voltage regulation transistor is on under control of the first level signal; and
wherein the output module comprises a first output unit, a second output unit and a third output unit, wherein
the first output unit is electrically connected to the second sub-node, the first level terminal and the signal output terminal and is configured to control, according to a potential of the second sub-node and the first level signal, the signal output terminal to output the enable level of the light emission control signal;
the third output unit is electrically connected to the first sub-node, the first level terminal and the signal output terminal and is configured to control, according to a potential of the first sub-node and the first level signal, the signal output terminal to output the enable level of the light emission control signal; and
the second output unit is electrically connected to the third node, the second level terminal and the signal output terminal and is configured to control, according to the potential of the third node, the signal output terminal to output the disable level of the light emission control signal.

16. A display panel, comprising a plurality of light emission control circuits cascaded and a plurality of pixel circuits arranged in an array, wherein
a light emission control circuit of the plurality of light emission control circuits cascaded comprises a filtering module, a first control module, a second control module and an output module, wherein
the first control module is electrically connected to a signal input terminal, a first clock terminal and a second clock terminal; the first control module and the output module are electrically connected to a first node; the first control module and the filtering module are electrically connected to a second node; and the first control module is configured to control a potential of the first node and a potential of the second node separately according to an input signal of the signal input terminal, a first clock signal of the first clock terminal and a second clock signal of the second clock terminal;
the second control module is electrically connected to the first clock terminal, the second clock terminal, a first level terminal, a second level terminal and the first control module; the second control module and the output module are electrically connected to a third node; and the second control module is configured to control a potential of the third node under control of the first control module, the first clock signal, the second clock signal, a first level signal of the first level terminal and a second level signal of the second level terminal;
the output module is further electrically connected to the first level terminal, the second level terminal and a signal output terminal; and the output module is configured to control, according to the first level signal and the potential of the first node, the signal output terminal to output an enable level of a light emission control signal and control, according to the second level signal of the second level terminal and the potential of the third node, the signal output terminal to output a disable level of the light emission control signal, wherein the enable level and the disable level of the light emission control signal are output time-divisionally; and the filtering module is further electrically connected to the first node and has a uni-directional conduction property; and wherein among the plurality of light emission control circuits cascaded, a signal output terminal of each-stage light emission control circuit is electrically connected to at least part of a same row of the plurality of pixel circuits; and a signal output terminal of each-stage light emission control circuit other than a last-stage light emission control circuit is electrically connected to a signal input terminal of a next-stage light emission control circuit, and a signal input terminal of a first-stage light emission control circuit receives a start pulse signal.

17. The display panel according to claim 16, further comprising a plurality of light emission control signal lines, wherein the pixel circuit comprises a data signal terminal, a drive transistor, a light-emitting element, a light emission control module and a data write module, wherein the data write module is configured to write a data signal of the data signal terminal into a gate of the drive transistor, the drive transistor is configured to generate a drive current according to a potential of the gate of the drive transistor, and the light emission control module is configured to control the drive transistor to supply the drive current to the light-emitting element;

the light emission control module comprises at least one light emission control transistor, wherein gates of light emission transistors of at least part of a same row of the plurality of pixel circuits are electrically connected to a same one of the plurality of light emission control signal lines; and signal output terminals of the plurality of light emission control circuits cascaded are electrically connected to the plurality of light emission control signal lines with a one-to-one correspondence.

18. The display panel according to claim 17, further comprising a plurality of first scan signal lines, wherein the pixel circuit further comprises a threshold compensation module configured to compensate a threshold voltage of the drive transistor to the gate of the drive transistor;

the threshold compensation module comprises a threshold compensation transistor, wherein a channel type of the threshold compensation transistor is different from a channel type of a light emission control transistor of the at least one light emission control transistor, and gates of threshold compensation transistors of at least part of a same row of the plurality of pixel circuits are electrically connected to a same one of the plurality of first scan signal lines; and the signal output terminals of the plurality of light emission control circuits are further electrically connected to the plurality of first scan signal lines in a one-to-one manner.

19. The display panel according to claim 18, further comprising a plurality of second scan signal lines, wherein the pixel circuit further comprises an initialization module and an initialization signal terminal, wherein the initialization module is configured to control an initialization signal of the initialization signal terminal to initialize the gate of the drive transistor;

the initialization module comprises an initialization transistor, wherein a channel type of the initialization transistor is different from the channel type of the light emission control transistor, and gates of initialization transistors of at least part of a same row of the plurality of pixel circuits are electrically connected to a same one of the plurality of second scan signal lines; and the signal output terminals of the plurality of light emission control circuits are further electrically connected to the plurality of second scan signal lines in a one-to-one manner; and among the plurality of first scan signal lines and the plurality of second scan signal lines, a first scan signal line and a second scan signal line are electrically connected to a same one of the plurality of pixel circuits, wherein the first scan signal line is electrically connected to a current-stage light emission control circuit of the plurality of light emission control circuits, and the second scan signal line is electrically connected to a previous-stage light emission control circuit of the plurality of light emission control circuits.

20. A display device, comprising a display panel; wherein the display panel comprises a plurality of light emission control circuits cascaded and a plurality of pixel circuits arranged in an array, wherein a light emission control circuit of the plurality of light emission control circuits cascaded comprises a filtering module, a first control module, a second control module and an output module, wherein the first control module is electrically connected to a signal input terminal, a first clock terminal and a second clock terminal; the first control module and the output module are electrically connected to a first node; the first control module and the filtering module are electrically connected to a second node; and the first control module is configured to control a potential of the first node and a potential of the second node separately according to an input signal of the signal input terminal, a first clock signal of the first clock terminal and a second clock signal of the second clock terminal;

the second control module is electrically connected to the first clock terminal, the second clock terminal, a first level terminal, a second level terminal and the first control module; the second control module and the output module are electrically connected to a third node; and the second control module is configured to control a potential of the third node under control of the first control module, the first clock signal, the second clock signal, a first level signal of the first level terminal and a second level signal of the second level terminal;

the output module is further electrically connected to the first level terminal, the second level terminal and a signal output terminal; and the output module is configured to control, according to the first level signal and the potential of the first node, the signal output terminal to output an enable level of a light emission control signal and control, according to the second level signal of the second level terminal and the potential of the third node, the signal output terminal to output a disable level of the light emission control signal, wherein the enable level and the disable level of the light emission control signal are output time-divisionally; and the filtering module is further electrically connected to the first node and has a uni-directional conduction property; and wherein among the plurality of light emission control circuits cascaded, a signal output terminal of each-stage light emission control circuit is electrically connected to at least part of a same row of the plurality of pixel circuits; and a signal output terminal of each-stage light emission control circuit other than a last-stage light emission control circuit is electrically connected to a signal input terminal of a next-stage light emission control circuit, and a signal input terminal of a first-stage light emission control circuit receives a start pulse signal.

* * * * *